US011438541B2

(12) United States Patent
Hosaka et al.

(10) Patent No.: US 11,438,541 B2
(45) Date of Patent: Sep. 6, 2022

(54) IMAGING DEVICE WITH FIRST TEMPERATURE DETECTION ELEMENT AND SECOND TEMPERATURE DETECTION ELEMENT FOR TEMPERATURE REFERENCE

(71) Applicant: SONY SEMICONDUCTOR SOLUTIONS CORPORATION, Kanagawa (JP)

(72) Inventors: Hajime Hosaka, Kanagawa (JP); Yoshikazu Nitta, Tokyo (JP); Kenichi Okumura, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 99 days.

(21) Appl. No.: 16/758,042

(22) PCT Filed: Aug. 15, 2018

(86) PCT No.: PCT/JP2018/030358
§ 371 (c)(1),
(2) Date: Apr. 21, 2020

(87) PCT Pub. No.: WO2019/087522
PCT Pub. Date: May 9, 2019

(65) Prior Publication Data
US 2020/0336686 A1 Oct. 22, 2020

(30) Foreign Application Priority Data

Oct. 31, 2017 (JP) ............................. JP2017-211295

(51) Int. Cl.
*H04N 5/378* (2011.01)
*H03F 3/45* (2006.01)
(Continued)

(52) U.S. Cl.
CPC .......... *H04N 5/378* (2013.01); *H03F 3/45475* (2013.01); *H03M 1/12* (2013.01); *H04N 5/357* (2013.01)

(58) Field of Classification Search
CPC .......... H04N 5/33; H04N 5/378; H04N 5/357; H03F 3/45475; H03M 1/12
See application file for complete search history.

(56) References Cited

U.S. PATENT DOCUMENTS 7,361,899 B2 * 4/2008 Iida .................... H01L 27/14649
348/E5.09
7,842,922 B2 * 11/2010 Leneke ...................... G01J 5/06
257/466
(Continued)

FOREIGN PATENT DOCUMENTS

CA          2867895 A1    12/2013
CN        103459994 A    12/2013
(Continued)

OTHER PUBLICATIONS

International Search Report and Written Opinion of PCT Application No. PCT/JP2018/030358, dated Oct. 23, 2018, 11 pages of ISRWO.

(Continued)

*Primary Examiner* — Nicholas G Giles
(74) *Attorney, Agent, or Firm* — Chip Law Group

(57) ABSTRACT

An imaging device includes: a first temperature detection element 16 that detects temperature on the basis of infrared rays; a second temperature detection element 17 for temperature reference; and a drive circuit 10A including a switch circuit 101 including a butterfly switch circuit, a first current source 82A, a second current source 82B, a differential circuit 83, and an analog-digital conversion circuit 84. The first temperature detection element 16 and the second temperature detection element 17 are connected to a first (Continued)

input end 101A and a second input end 101B of the switch circuit. A first output end 101C and the first current source 82A are connected to a first input end 83A of the differential amplifier. A second output end 101D of the switch circuit and the second current source 82B are connected to a second input end 83B of the differential amplifier. An output end 83C of the differential amplifier is connected to an input portion of the analog-digital conversion circuit 84.

17 Claims, 46 Drawing Sheets

(51) Int. Cl.
*H03M 1/12* (2006.01)
*H04N 5/357* (2011.01)

(56) References Cited

U.S. PATENT DOCUMENTS

| | | |
|---|---|---|
| 2007/0145274 A1 | 6/2007 | Iida |
| 2012/0119088 A1 | 5/2012 | Honda et al. |
| 2014/0027642 A1 | 1/2014 | Warashina et al. |
| 2014/0085482 A1 | 3/2014 | Teich et al. |
| 2020/0059610 A1* | 2/2020 | Maegawa ............... H04N 5/378 |

FOREIGN PATENT DOCUMENTS

| | | |
|---|---|---|
| CN | 103748867 A | 4/2014 |
| EP | 2690416 A1 | 1/2014 |
| JP | 2005-214639 A | 8/2005 |
| JP | 2005-241501 A | 9/2005 |
| JP | 2006-174041 A | 6/2006 |
| JP | 2007-180773 A | 7/2007 |
| JP | 2012-202832 A | 10/2012 |
| JP | 2013-217655 A | 10/2013 |
| JP | 2014-072723 A | 4/2014 |
| WO | 2011/013197 A1 | 2/2011 |
| WO | 2011-013197 A1 | 2/2011 |
| WO | 2012/132845 A1 | 10/2012 |
| WO | 2011/013197 A1 | 1/2013 |
| WO | 2014/082097 A1 | 5/2014 |
| WO | 2018/042850 A1 | 3/2018 |

OTHER PUBLICATIONS

Office Action for JP Patent Application No. 2019-549876, dated Jun. 14, 2022, 03 pages of English Translation and 03 pages of Office Action.

* cited by examiner

IMAGING DEVICE WITH FIRST TEMPERATURE DETECTION ELEMENT AND SECOND TEMPERATURE DETECTION ELEMENT FOR TEMPERATURE REFERENCE

CROSS REFERENCE TO RELATED APPLICATIONS

This application is a U.S. National Phase of International Patent Application No. PCT/JP2018/030358 filed on Aug. 15, 2018, which claims priority benefit of Japanese Patent Application No. JP 2017-211295 filed in the Japan Patent Office on Oct. 31, 2017. Each of the above-referenced applications is hereby incorporated herein by reference in its entirety.

TECHNICAL FIELD

The present disclosure relates to an imaging device, and more particularly, to an imaging device including temperature detection elements that detect temperature on the basis of infrared rays.

BACKGROUND ART

For example, the thermal infrared solid-state imaging device disclosed in Japanese Patent Application Laid-Open No. 2005-214639 has a heat insulating structure and an infrared absorbing structure. In the solid-state imaging device, a photosensitive pixel includes at least one diode connected in series, and a reference signal output circuit that outputs a reference signal that substantially changes with changes in temperature in the entire device is included. The solid-state imaging device further includes: a first group of constant current means and a second group of constant current means; and a differential integration circuit that integrates the differences between the voltages at both ends of the first group of constant current means and the second group of constant current means for a certain period of time, and outputs the result.

CITATION LIST

Patent Document

Patent Document 1: Japanese Patent Application Laid-Open No. 2005-214639

SUMMARY OF THE INVENTION

Problems to be Solved by the Invention

Meanwhile, in the thermal infrared solid-state imaging device disclosed in this laid-open patent application document, reducing the noise to be generated in the constant current means (current sources) and the differential integration circuit (differential amplifiers), such as 1/f noise, is critical, but the document does not teach any specific noise reduction means.

Therefore, an object of the present disclosure is to provide an imaging device having a configuration and a structure that are capable of reducing noise to be generated in the current sources and the differential amplifiers that constitute the imaging device.

Solutions to Problems

An imaging device according to a first embodiment of the present disclosure for achieving the above objective includes:

a first structural body; and a second structural body stacked on the first structural body, in which the first structural body includes a first substrate, and a first temperature detection element that is disposed on the first substrate and detects temperature on the basis of infrared rays, the second structural body includes a second substrate, and a drive circuit disposed on the second substrate, the first temperature detection element being connected to the drive circuit via a first drive line and a first signal line, the second structural body further includes a second temperature detection element for temperature reference, the second temperature detection element being connected to the drive circuit via a second drive line and a second signal line, the drive circuit includes a switch circuit, a first current source, a second current source, a differential amplifier, and an analog-digital conversion circuit, the first signal line to which the first temperature detection element is connected is connected to a first input end of the switch circuit, the second signal line to which the second temperature detection element is connected is connected to a second input end of the switch circuit, a first output end of the switch circuit is connected to a first input end of the differential amplifier, a second output end of the switch circuit is connected to a second input end of the differential amplifier, the first current source is connected to the first input end of the differential amplifier, the second current source is connected to the second input end of the differential amplifier, an output end of the differential amplifier is connected to an input portion of the analog-digital conversion circuit, and, in the switch circuit, the second input end and the second output end of the switch circuit are connected in a case where the first input end and the first output end of the switch circuit are connected, and the second input end and the first output end of the switch circuit are connected in a case where the first input end and the second output end of the switch circuit are connected.

An imaging device according to a second embodiment of the present disclosure for achieving the above objective includes:

a first structural body; and a second structural body stacked on the first structural body, in which the second structural body includes a second substrate, and a drive circuit disposed on the second substrate, the drive circuit includes two current sources, two amplifiers including single-end amplifiers, and two analog-digital conversion circuits, the first structural body includes a first substrate, and a first temperature detection element that is disposed on the first substrate, detects temperature on the basis of infrared rays, and is connected to a first drive line and the drive circuit, the first structural body further includes a second temperature detection element for temperature reference, the second temperature detection element being connected to a second drive line and the drive circuit, a first signal line to which the first temperature detection element and the second temperature detection element are connected is connected to a first current source, a first amplifier, and a first analog-digital conversion circuit, and a second signal line to which the first temperature detection element and the second temperature detection element are connected is connected to a second current source, a second amplifier, and a second analog-digital conversion circuit.

Effects of the Invention

In the imaging device according to the first embodiment of the present disclosure, the first output end of the switch circuit and the first current source are connected to the first input end of the differential amplifier, and the second output end of the switch circuit and the second current source are connected to the second input end of the differential amplifier. In the switch circuit, in a case where the first input end and the first output end of the switch circuit are connected, the second input end and the second output end of the switch circuit are connected. In a case where the first input end and the second output end of the switch circuit are connected, the second input end and the first output end of the switch circuit are connected. Thus, noise generated in the current sources and the differential amplifier can be effectively canceled. In the imaging device according to the second embodiment of the present disclosure, the first temperature detection element and the second temperature detection element are connected to two signal lines, and a so-called column-parallel ADC structure is adopted. Thus, noise generated in the current sources and the amplifiers can be effectively canceled, without the use of a differential amplifier. Note that the advantageous effects described in this specification are merely an example, and the advantageous effects of the present technology are not limited to the example and may also include additional effects.

MODE FOR CARRYING OUT THE INVENTION

Figure 1:
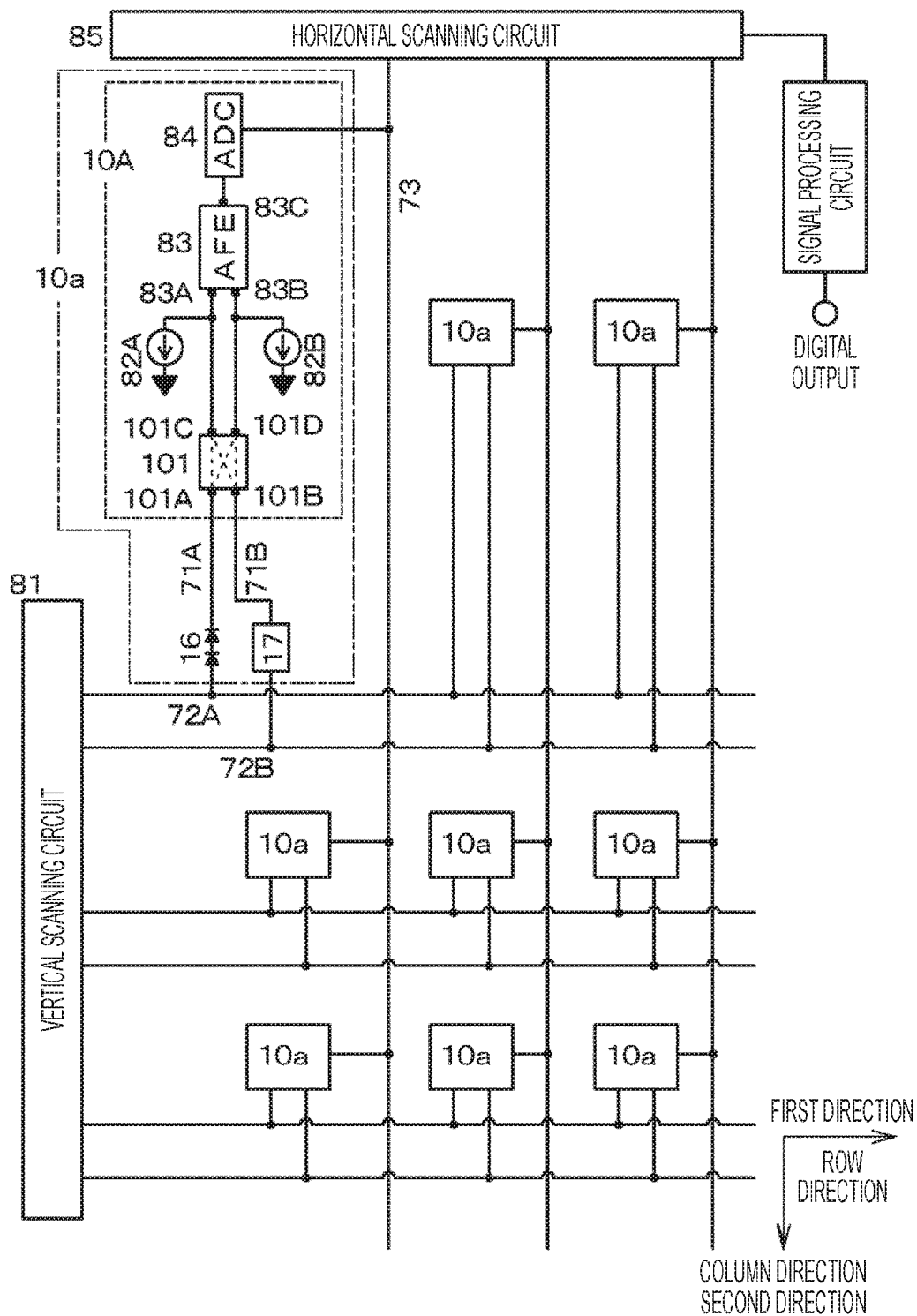
FIG. 1 is an equivalent circuit diagram of an imaging device of Example 1.

The following is a description of the present disclosure based on embodiments, with reference to the drawings. However, the present disclosure is not limited to the embodiments, and the various numerical values and materials mentioned in the embodiments are merely examples. Note that explanation will be made in the following order.

1. General description of imaging devices according to first through fourth embodiments of the present disclosure
2. Example 1 (an imaging device according to the first embodiment of the present disclosure)
3. Example 2 (a modification of Example 1)
4. Example 3 (modifications of Examples 1 and 2)
5. Example 4 (another modification of Example 1)
6. Example 5 (a modification of Example 4)
7. Example 6 (another modification of Example 4)
8. Example 7 (modifications of Examples 4 through 6)
9. Example 8 (another modification of Example 1; an imaging device according to A of the first embodiment of the present disclosure)
10. Example 9 (another modification of Example 1; an imaging device according to B of the first embodiment of the present disclosure)
11. Example 10 (an imaging device according to the second embodiment of the present disclosure)
12. Example 11 (modifications of Examples 1 through 10; an imaging device having the first configuration, or specifically, an imaging device having a face-to-back structure)
13. Example 12 (modifications of Examples 1 through 10, or specifically, an imaging device having a face-to-face structure)
14. Example 13 (modifications of Examples 1 through 12)
15. Example 14 (modifications of Examples 1 through 13)
16. Example 15 (imaging devices having the second and third configurations of the present disclosure)
17. Example 16 (modifications of Examples 1 through 15; example applications of imaging devices of the present disclosure)
18. Other aspects In an imaging device according to the first embodiment of the present disclosure, first temperature detection elements and second temperature detection elements are arranged in a first direction and a second direction different from the first direction in a two-dimensional matrix, and one drive circuit is provided for one temperature detection element block including one first temperature detection element and one second temperature detection element.

Alternatively, in an imaging device according to the first embodiment of the present disclosure, first temperature detection elements and second temperature detection elements are arranged in a first direction and a second direction different from the first direction in a two-dimensional matrix, one drive circuit is provided for one temperature detection element block including a plurality of first temperature detection elements and one second temperature detection element, and, in each temperature detection element block, the plurality of first temperature detection elements is connected to the same first drive line, and the first signal line connected to each first temperature detection element of the plurality of first temperature detection elements is connected to a first input end of a switch circuit via a multiplexer circuit provided for the drive circuit. Note that the number of the first temperature detection elements forming a temperature detection element block will be sometimes expressed as "P".

Alternatively, in an imaging device according to the first embodiment of the present disclosure, the drive circuit further includes a second switch circuit, a first current source is connected to a first input end of the second switch circuit, instead of a first input end of a differential amplifier, a second current source is connected to a second input end of the second switch circuit, instead of a second input end of the differential amplifier, a first output end of the second switch circuit is connected to the first input end of the differential amplifier, a second output end of the second switch circuit is connected to the second input end of the differential amplifier, and the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected. Note that such an imaging device will be sometimes referred to as an "imaging device according to A of the first embodiment of the present disclosure" for convenience.

Alternatively, in an imaging device according to the first embodiment of the present disclosure, the drive circuit further includes a second switch circuit, the first current source is connected to the first input end of the second switch circuit, instead of the first input end of the differential amplifier, the second current source is connected to the second input end of the second switch circuit, instead of the second input end of the differential amplifier, the first output end of the second switch circuit is connected to the first input end of the first switch circuit, the second output end of the second switch circuit is connected to the second input end of the first switch circuit, and the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected. Note that such an imaging device will be sometimes referred to as an "imaging device according to B of the first embodiment of the present disclosure" for convenience sake.

In an imaging device according to the first embodiment of the present disclosure, or in an imaging device according to A of the first embodiment or B of the first embodiment of the present disclosure, first temperature detection elements and second temperature detection elements are be arranged in a first direction and a second direction different from the first direction in a two-dimensional matrix, and one drive circuit is provided for N (N≥2) first temperature detection elements and N second temperature detection elements occupying one column in the second direction.

Alternatively, in an imaging device according to the first embodiment of the present disclosure, or in an imaging device according to A of the first embodiment or B of the first embodiment of the present disclosure, first temperature detection elements and second temperature detection elements are arranged in a first direction and a second direction different from the first direction in a two-dimensional matrix, the first temperature detection elements and the second temperature detection elements occupying one column in the second direction belong to one temperature detection element block of a plurality of temperature detection element blocks, one drive circuit is provided for the first temperature detection elements and the second temperature detection elements occupying one column in the second direction, each temperature detection element block includes a plurality of first temperature detection elements and one second temperature detection element, and, in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit. Note that the number of temperature detection element blocks will be sometimes expressed as "Q", and the number of the first temperature detection elements forming a temperature detection element block will be sometimes expressed as "P". Where N represents the number of the first temperature detection elements that occupy one column in the second direction, N=P×Q.

Alternatively, in an imaging device according to the first embodiment of the present disclosure, or in an imaging device according to A of the first embodiment or B of the first embodiment of the present disclosure, first temperature detection elements and second temperature detection elements are arranged in a first direction and a second direction different from the first direction in a two-dimensional matrix, the first temperature detection elements and the second temperature detection elements occupying one column in the second direction belong to one temperature detection element unit of a plurality of temperature detection element units arranged in the second direction, each temperature detection element unit of the plurality of temperature detection element units is connected to one drive circuit, the first temperature detection elements and the second temperature detection elements occupying each temperature detection element unit belong to one temperature detection element block of a plurality of temperature detection element blocks, each temperature detection element block includes one or a plurality of first temperature detection elements and one second temperature detection element, and, in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where the number of the first temperature detection elements is one, and is connected to the first input end of the switch circuit via a multiplexer circuit provided for the drive circuit in a case where the number of the first temperature detection elements is at least two. Note that the number of temperature detection element units will be sometimes expressed as "R", the number of temperature detection element blocks will be sometimes expressed as "Q", and the number of the first temperature detection elements forming a temperature detection element block will be sometimes expressed as "P". Where N represents the number of the first temperature detection elements that occupy one column in the second direction, N=P×Q×R.

Further, an imaging device according to the first embodiment of the present disclosure including the various preferred modes and configurations described above further includes a third element that is designed for gain measurement and is connected to a third drive line and the drive circuit via the first signal line, and the output voltage of the third element is different from the output voltage of the second temperature detection element. Furthermore, as such a third element is included, it is possible to reduce variation in gain of each column of the analog circuit (variation in gain in the first direction).

Further, each imaging device according to the first and second embodiments of the present disclosure including the various preferred modes and configurations described above may further include a non-volatile memory element, and, for each first temperature detection element, a correction coefficient for correction during operation is stored in the nonvolatile memory element. Here, the configuration, structure, and form of the nonvolatile memory element may be any known configuration, structure, and form. Also, acquisition of the correction coefficient, writing of the correction coefficient into the nonvolatile memory element, reading from the nonvolatile memory element, and a correction process for a signal from a first temperature detection element are only required to be performed by known techniques.

In imaging devices according to the first and second embodiments of the present disclosure including the various preferred modes and configurations described above (these imaging devices will be hereinafter sometimes collectively referred to as the "imaging device or the like of the present disclosure"), a first substrate can include a silicon semiconductor substrate or a SOI substrate, for example, and a second substrate can include a silicon semiconductor substrate, for example.

Further, in the imaging device or the like of the present disclosure including the various preferred modes and configurations described above, a first temperature detection element that detects temperature on the basis of infrared rays may include: one of various kinds of diodes, such as a pn junction diode or a Schottky diode including a SOI diode, or a combination of a transistor, a diode, and an active element; a resistance bolometer element including vanadium oxide film, amorphous silicon film, polysilicon film, silicon carbide film, titanium film, or the like; a thermoelectric conversion element using a metal such as platinum, gold, or nickel, and a thermistor or the like; a thermopile element using the Seebeck effect; a pyroelectric element that changes the surface charge of a dielectric material; a ferroelectric element; a diode using a tunnel effect; or an element utilizing superconductivity. Each of these elements has a known configuration and structure. More specifically, the first temperature detection element may include a pn junction diode, a bolometer element, a thermopile element, a metal-film resistance element, a metal-oxide resistance element, a ceramic resistance element, or a thermistor element. One first temperature detection element may include a plurality of diodes connected in series, for example. The first temperature detection elements can be formed by the so-called MEMS technology, for example. The configuration and structure of the first temperature detection elements will be described later.

The second temperature detection element for temperature reference may include a semiconductor temperature sensor element using the temperature characteristics of a transistor, and may be formed on (or incorporated into) the first substrate or the second substrate. Note that the semiconductor temperature sensor element is preferably formed in a region of the second substrate located below a first temperature detection element, or is preferably formed in a region of the first substrate adjacent to a first temperature detection element. Alternatively, a first temperature detection element having the same configuration and structure as a first temperature detection element that detects temperature on the basis of infrared rays (but not including any infrared absorption layer, or including neither an infrared absorption layer nor an infrared reflection layer, or including an infrared absorption layer of a smaller area than the infrared absorption layer normally included in a first temperature detection element) may be disposed as a second temperature detection element for temperature reference adjacent to a first temperature detection element that detects temperature on the basis of infrared rays. The difference between a temperature measured by a first temperature detection element and a temperature measured by a second temperature detection element for temperature reference is calculated, so that the true temperature measured by the first temperature detection element can be obtained.

The structure of a third element for gain measurement can be the same as the structure of a second temperature detection element for temperature reference. Here, to make the output voltage of a third element for gain measurement different from the output voltage of a second temperature detection element for temperature reference, any of the following example methods may be adopted:

[a] the number of series elements constituting the third element is made different from the number of series elements constituting the second temperature detection element,

[b] the resistance value of the resistor connected in series to the third element is made different from the resistance value of the resistor connected in series to the second temperature detection element, or

[c] the voltage to be applied to the third element is made different from the voltage to be applied to the second temperature detection element, for example.

The first signal line, the second signal line, the first drive line, the second drive line, and the third drive line are only required to be formed with known conductive materials by a known technique. To connect a first temperature detection element to a drive circuit via the first drive line and the first signal line, to connect the drive circuit to a second temperature detection element via the second drive line and the second signal line, and to connect the drive circuit to a third element via the third drive line and the first signal line, the first signal line, the second signal line, the first drive line, the second drive line, and the third drive line are formed on the first substrate and the second substrate as appropriate, depending on the configuration and structure of the imaging device.

The switch circuit (first switch circuit) and the second switch circuit that constitute a drive circuit may be switch circuits having any configurations and structures, as long as each switch circuit has two input ends and two output ends so that the second input end and the second output end are connected in a case where the first input end and the first output end are connected, and the second input end and the first output end are connected in a case where the first input end and the second output end are connected. The switch circuits may include so-called butterfly switch circuits, for example. Also, the first current source (a first constant current source) and the second current source (a second constant current source) may also include known constant current sources. The differential amplifier forms an analog front end (AFE), and may include a known circuit configuration. The analog-digital conversion circuit (ADC) may include a single-slope analog-to-digital conversion circuit or an analog-to-digital conversion circuit of a delta-sigma modulation type ($\Delta\Sigma$ modulation type). Accordingly, the area of the analog-digital conversion circuit can be made smaller, but the analog-digital conversion circuit is not limited to these kinds. For example, the analog-digital conversion circuit may be an analog-digital conversion circuit of a flash type, a half-flash type, a sub-lensing type, a pipeline type, a bit-per-stage type, a magnitude amplifier type, or the like. The multiplexer circuit and the subtraction circuit may also be a multiplexer circuit or a subtraction circuit each having a known circuit configuration. The imaging device may further include drive units such as a horizontal scanning circuit and a vertical scanning circuit. Further, each signal line may be connected to the horizontal scanning circuit via the analog front end, the analog-digital conversion circuit, and the like. Also, each drive line may be connected to the vertical scanning circuit. The drive circuit and the drive units may include a readout integrated circuit (ROIC). In addition to first temperature detection elements, other circuits may be disposed on the first substrate.

In the imaging device or the like of the present disclosure, the drive circuit disposed on the second substrate may be covered with a coating layer. Further, when attention is paid to one first temperature detection element, a void may be formed between the first temperature detection element and the coating layer. Note that such an imaging device of the present disclosure will be sometimes referred to as an "imaging device having the first configuration" for convenience sake. In the imaging device having the first configuration, the first substrate and the second substrate are stacked, and a void is formed between the first temperature detection element and the coating layer. Thus, the void can include high accuracy in the first temperature detection element. Further, in this case, an infrared absorption layer may be formed on the infrared incident side, and an infrared reflection layer may be formed in the region of the coating layer located at the bottom portion of the void.

Alternatively, in the imaging device or the like of the present disclosure, a first temperature detection element assembly that detects temperature on the basis of infrared rays is provided, the first temperature detection element assembly includes a plurality of first temperature detection elements arranged in parallel, and, in the first temperature detection element assembly, the wavelengths of infrared rays to be detected by the respective first temperature detection elements are different. Note that such an imaging device of the present disclosure will be sometimes referred to as an "imaging device having the second configuration" for convenience sake. In the imaging device having the second configuration or the imaging device having the third configuration described below, a first temperature detection element assembly includes a plurality of first temperature detection elements that are arranged in parallel, and the wavelengths of infrared rays to be detected by the respective first temperature detection elements in the first temperature detection element assembly differ from each other. Alternatively, the amounts of infrared rays to be absorbed by the respective first temperature detection elements in the first temperature detection element assembly differ from each other. Thus, it is possible to change the wavelength spectral characteristics and the infrared sensitivity for each first temperature detection element.

Alternatively, in the imaging device or the like of the present disclosure, a first temperature detection element assembly that detects temperature on the basis of infrared rays is provided, the first temperature detection element assembly includes a plurality of first temperature detection elements arranged in parallel, and, in the first temperature detection element assembly, the amounts of infrared rays to be absorbed by the respective first temperature detection elements are different. Note that such an imaging device of the present disclosure will be sometimes referred to as an "imaging device having the third configuration" for convenience sake. Note that the first temperature detection element assembly may include a plurality of first temperature detection elements that have infrared absorption layers of different areas from one another. With this arrangement, the temperature detection range and sensitivity can be changed, the temperature detection range can be widened, and the infrared absorption wavelength can be changed.

Alternatively, in the imaging device or the like of the present disclosure, a first temperature detection element assembly that detects temperature on the basis of infrared rays is provided, the first temperature detection element assembly includes two first temperature detection elements arranged vertically along incident infrared rays, and, in the first temperature detection element assembly, the wavelengths of infrared rays to be detected by the respective first temperature detection elements are the same or different, or the amounts of infrared rays to be absorbed by the respective first temperature detection elements are different. Note that such an imaging device of the present disclosure will be sometimes referred to as an "imaging device having the fourth configuration" for convenience sake. The two first temperature detection elements may be connected to the same first signal line and the same first drive line, or may be connected to different first signal lines and different first drive lines.

In the imaging devices having the first through fourth configurations, the first temperature detection elements may be disposed on the infrared incident side of the first substrate, or may be disposed on the opposite side from the infrared incident side of the first substrate.

In the imaging device having the first configuration, a partition wall may be formed in the portion of the first substrate located between a first temperature detection element and a first temperature detection element, and the bottom portion of the partition wall is joined to the coating layer. Note that the imaging device having such a configuration is called the "imaging device having the face-to-back structure" for convenience sake. In a case where the surface of the first substrate facing the second substrate is called the "first surface of the first substrate", and the surface of the first substrate on the opposite side from the first surface of the first substrate is called the "second surface of the first substrate", the first temperature detection elements are disposed on the second surface side of the first substrate.

Further, in the imaging device having the face-to-back structure, the exposed surface of the coating layer exposed to the void may include at least one material layer selected from the group including an insulating material layer, a metal material layer, an alloy material layer, and a carbon material layer, and the sidewalls of the partition wall may include at least one material layer selected from the group including an insulating material layer, a metal material layer, an alloy material layer, and a carbon material layer. The inside of the partition wall surrounded by the sidewalls of the partition wall includes part of the first substrate. In some cases, the inside of the partition wall may include the same material as the material forming the sidewalls of the partition wall, or may include a different material from the material forming the first substrate or the sidewalls of the partition wall.

Alternatively, in the imaging device having the face-to-back structure, the exposed surface of the coating layer exposed to the void may include at least one material layer selected from the group including an insulating material layer, a metal material layer, an alloy material layer, and a carbon material layer. Further, in the imaging device having the face-to-back structure including such a configuration, the sidewalls of the partition wall may include at least one material layer selected from the group including an insulating material layer, a metal material layer, an alloy material layer, and a carbon material layer.

The insulating material layer forming the exposed surface of the coating layer exposed to the void may be an insulating material layer including an oxide (specifically, $SiO_x$ ($1 \leq X \leq 2$), SiOF, or SiOC, for example), an insulating material layer including a nitride (specifically, SiN, for example), an insulating material layer including an oxynitride (specifically, SiON, for example), or an adhesive material layer, for example. The metal material layer forming the exposed surface of the coating layer exposed to the void may include gold (Au), copper (Cu), aluminum (Al), tungsten (W), or titanium (Ti), for example. The alloy material layer forming the exposed surface of the coating layer exposed to the void may be an alloy layer or a solder layer containing the above metals, for example. The carbon material layer forming the exposed surface of the coating layer exposed to the void may include carbon film or carbon nanotube, for example.

The various materials mentioned above can also be used as the insulating material layer, the metal material layer, the alloy material layer, or the carbon material layer forming the sidewalls of the partition wall.

The combination of (the material of the insulating material layer forming the exposed surface of the coating layer exposed to the void and the material of the insulating material layer forming the sidewalls of the partition wall) may be one of the 16 combinations: (an insulating material layer and an insulating material layer), (an insulating material layer and a metal material layer), (an insulating material layer and an alloy material layer), (an insulating material layer and a carbon material layer), (a metal material layer and an insulating material layer), (a metal material layer and a metal material layer), (a metal material layer and an alloy material layer), (a metal material layer and a carbon material layer), (an alloy material layer and an insulating material layer), (an alloy material layer and a metal material layer), (an alloy material layer and an alloy material layer), (an alloy material layer and a carbon material layer), (a carbon material layer and an insulating material layer), (a carbon material layer and a metal material layer), (a carbon material layer and an alloy material layer), and (a carbon material layer and a carbon material layer).

The insulating material layer forming the exposed surface of the coating layer exposed to the void and the insulating material layer forming the sidewalls of the partition wall may include the same material, or may include different materials. The metal material layer forming the exposed surface of the coating layer exposed to the void and the metal material layer forming the sidewalls of the partition wall may include the same material, or may include different materials. The alloy material layer forming the exposed surface of the coating layer exposed to the void and the alloy material layer forming the sidewalls of the partition wall may include the same material, or may include different materials. The carbon material layer forming the exposed surface of the coating layer exposed to the void and the carbon material layer forming the sidewalls of the partition wall may include the same material, or may include different materials. The similar applies to an imaging device having a face-to-face structure described later. However, "the sidewalls of the partition wall" is replaced with a "partition wall".

In the imaging device having the face-to-back structure including the various preferred configurations described above, an infrared absorption layer may be formed on the infrared incident side of the first temperature detection element, and an infrared reflection layer may be formed in the region of the coating layer located at the bottom portion of the void. The infrared reflection layer may be formed at the portion of the coating layer located at the bottom portion of the void, may be formed at part of the portion of the coating layer located at the bottom portion of the void, or may be formed so as to protrude from the portion of the coating layer located at the bottom portion of the void. Further, in this case, the infrared absorption layer may be formed above the first temperature detection element. Specifically, the infrared absorption layer may be formed on an insulating film formed on the first temperature detection element, or the infrared absorption layer may be formed in such a manner that a gap (a space) is formed between the infrared absorption layer and the first temperature detection element. Further, in these cases, the infrared reflection layer may be formed on the top surface of the coating layer (or above the top surface of the coating layer, or part of the top surface of the coating layer), or may be formed inside the coating layer. Further, where the wavelength of infrared rays to be absorbed by the infrared absorption layer is represented by λIR in these cases, the optical distance (a distance taking into account the thicknesses and the refractive indexes of the materials) $L_0$ between the infrared absorption layer and the infrared reflection layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

$\lambda_{IR}$ may be 8 μm to 14 μm, for example.

Alternatively, in the imaging device having the face-to-back structure including the various preferred configurations described above, a first infrared absorption layer may be formed on the infrared incident side of the first temperature detection element, an infrared reflection layer may be formed in the region of the coating layer located at the bottom portion of the void, and a second infrared absorption layer may be formed on the side of the first temperature detection element facing the void. The infrared reflection layer may be formed at the portion of the coating layer located at the bottom portion of the void, may be formed at part of the portion of the coating layer located at the bottom portion of the void, or may be formed so as to protrude from the portion of the coating layer located at the bottom portion of the void. Further, in this case, the first infrared absorption layer may be formed above the first temperature detection element. Specifically, the first infrared absorption layer may be formed on an insulating film formed on the first temperature detection element, or the first infrared absorption layer may be formed in such a manner that a gap (a space) is formed between the first infrared absorption layer and the first temperature detection element. The second infrared absorption layer is only required to be formed on the surface of the first temperature detection element facing the void, or only required to be formed on an insulating film formed on the first temperature detection element, for example. Alternatively, the second infrared absorption layer may be formed in such a manner that a gap (a space) is formed between the second infrared absorption layer and the first temperature detection element. Further, in these cases, the infrared reflection layer may be formed on the top surface of the coating layer (or above the top surface of the coating layer, or part of the top surface of the coating layer), or may be formed inside the coating layer. The respective infrared absorption layers not only absorb infrared rays, but also partially transmit and partially reflect infrared rays, to reduce transmission and reflection. Thus, the sensitivity of the structure can be further increased. That is, with such a configuration, part of infrared rays that have passed through the first infrared absorption layer is further absorbed by the second infrared absorption layer, so that transmission can be reduced. Also, infrared rays reflected by the first infrared absorption layer and infrared rays reflected by the second infrared absorption layer are of opposite phases and cancel each other, and thus, reflection can be reduced. Further, infrared rays reflected by the second infrared absorption layer and infrared rays reflected by the infrared reflection layer are of opposite phases and cancel each other, and thus, reflection can be reduced. Furthermore, where the wavelength of infrared rays to be absorbed by the first infrared absorption layer and the second infrared absorption layer is represented by $\lambda_{IR}$, the optical distance between the first infrared absorption layer and the second infrared absorption layer is represented by $L_1$, and the optical distance between the second infrared absorption layer and the infrared reflection layer is represented by $L_2$ in these cases, the following conditions are satisfied:

$$0.75 \times \lambda_{IR}/4 \leq L_1 \leq 1.25 \times \lambda_{IR}/4$$

$$0.75 \times \lambda_{IR}/4 \leq L_2 \leq 1.25 \times \lambda_{IR}/4$$

$\lambda_{IR}$ may be 8 μm to 14 μm, for example.

Alternatively, in the imaging device having the first configuration including the preferred modes described above, a partition wall that is independent of the first substrate may be formed between the portion of the first substrate located between a first temperature detection element and a first temperature detection element and the coating layer, and the bottom portion of the partition wall is joined to the coating layer. Note that the imaging device having such a configuration is called the "imaging device having the face-to-face structure" for convenience sake. The partition wall includes a different material from the first substrate. The first temperature detection elements are disposed on the first surface side of the first substrate.

Further, in the imaging device having the face-to-face structure, the exposed surface of the coating layer exposed to the void may include at least one material layer selected from the group including an insulating material layer, a metal material layer, an alloy material layer, and a carbon material layer, and the partition wall may include at least one material layer selected from the group including an insulating material layer, a metal material layer, an alloy material layer, and a carbon material layer.

Alternatively, in the imaging device having the face-to-face structure, the exposed surface of the coating layer exposed to the void may include at least one material layer selected from the group including an insulating material layer, a metal material layer, an alloy material layer, and a carbon material layer. Further, in the imaging device having the face-to-face structure including such a configuration, the partition wall may include at least one material layer selected from the group including an insulating material layer, a metal material layer, an alloy material layer, and a carbon material layer.

Note that specific examples and combinations of the insulating material layer, the metal material layer, the alloy material layer, and the carbon material layer forming the exposed surface of the coating layer exposed to the void, or the insulating material layer, the metal material layer, the alloy material layer, and the carbon material layer forming the partition wall are similar to those described above regarding the material forming the exposed surface of the coating layer and the material forming the sidewalls of the partition wall in the imaging device having the face-to-back structure described above.

In the imaging device having the face-to-face structure including the various preferred configurations described above, an infrared absorption layer may be formed on the infrared incident side of the first temperature detection element, and an infrared reflection layer may be formed in the region of the coating layer located at the bottom portion of the void. The infrared reflection layer may be formed at the portion of the coating layer located at the bottom portion of the void, may be formed at part of the portion of the coating layer located at the bottom portion of the void, or may be formed so as to protrude from the portion of the coating layer located at the bottom portion of the void. Alternatively, the infrared absorption layer may be disposed on the first surface side of the first substrate, may be disposed on the second surface side of the first substrate, or may be disposed on the protection board described below. Further, in this case, the infrared reflection layer may be formed on the top surface of the coating layer (or above the top surface of the coating layer, or part of the top surface of the coating layer), or may be formed inside the coating layer. Further, where the wavelength of infrared rays to be absorbed by the infrared absorption layer is represented by $\lambda_{IR}$ in these cases, the optical distance $L_0$ between the infrared absorption layer and the infrared reflection layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

In some cases, the infrared absorption layer may be formed on the opposite side from the infrared incident side of the first temperature detection element.

Alternatively, in the imaging device having the face-to-face structure including the various preferred configurations described above, a first infrared absorption layer may be formed on the infrared incident side of the first temperature detection element, an infrared reflection layer may be formed in the region of the coating layer located at the bottom portion of the void, and a second infrared absorption layer may be formed on the side of the first temperature detection element facing the void. The infrared reflection layer may be formed at the portion of the coating layer located at the bottom portion of the void, may be formed at part of the portion of the coating layer located at the bottom portion of the void, or may be formed so as to protrude from the portion of the coating layer located at the bottom portion of the void. Further, in this case, the first infrared absorption layer may be disposed on the first surface side of the first substrate, may be disposed on the second surface side of the first substrate, or may be disposed on the protection board described below. The second infrared absorption layer is only required to be formed on the surface of the first temperature detection element facing the void, or may be formed on an insulating film formed on the first temperature detection element, so as to face the void, for example. Alternatively, the second infrared absorption layer may be formed in such a manner that a gap (a space) is formed between the second infrared absorption layer and the first temperature detection element. Further, in these cases, the infrared reflection layer may be formed on the top surface of the coating layer (or above the top surface of the coating layer, or part of the top surface of the coating layer), or may be formed inside the coating layer. The respective infrared absorption layers not only absorb infrared rays, but also partially transmit and partially reflect infrared rays, to reduce transmission and reflection. Thus, the sensitivity of the structure can be further increased. That is, with such a configuration, part of infrared rays that have passed through the first infrared absorption layer is further absorbed by the second infrared absorption layer, so that transmission can be reduced. Also, infrared rays reflected by the first infrared absorption layer and infrared rays reflected by the second infrared absorption layer are of opposite phases and cancel each other, and thus, reflection can be reduced. Further, infrared rays reflected by the second infrared absorption layer and infrared rays reflected by the infrared reflection layer are of opposite phases and cancel each other, and thus, reflection can be reduced. Furthermore, where the wavelength of infrared rays to be absorbed by the first infrared absorption layer and the second infrared absorption layer is represented by $\lambda_{IR}$, the optical distance between the first infrared absorption layer and the second infrared absorption layer is represented by $L_1$, and the optical distance between the second infrared absorption layer and the infrared reflection layer is represented by $L_2$ in these cases, the following conditions are satisfied:

$$0.75 \times \lambda_{IR}/4 \leq L_1 \leq 1.25 \times \lambda_{IR}/4$$

$$0.75 \times \lambda_{IR}/4 \leq L_2 \leq 1.25 \times \lambda_{IR}/4$$

$\lambda_{IR}$ may be 8 μm to 14 μm, for example.

Further, in the imaging device having the face-to-face structure including the various preferred configurations described above, a protection board may be disposed on the infrared incident surface side of the first substrate (the second surface side of the first substrate). Specifically, in this case, the protection board may be disposed on a surface of the first substrate (the second surface of the first substrate), or above the surface of the first substrate (above the second surface of the first substrate). Also, in the imaging device having the face-to-back structure including the various preferred configurations described above, a protection board may be disposed above the infrared incident surface of the first substrate (the second surface of the first substrate). Examples of the material forming the protection board include a silicon semiconductor substrate, a quartz substrate, a plastic substrate, a plastic film, a germanium substrate, and a substrate including a material (specifically, $CaF_2$, $BaF_2$, $Al_2O_3$, ZnSe, or the like) that transmits infrared rays. Furthermore, the plastic may be polyethylene, for example.

Further, in the imaging device having the first configuration including the various preferred modes and configurations described above, a heat conduction layer may be formed on the coating layer. The heat conduction layer may have high heat conductivity, or conversely, may have low heat conductivity. The material that forms the heat conduction layer and has high heat conductivity may be a metallic material or a carbon-based material such as carbon film or carbon nanotube, and the material that forms the heat conduction layer and has low heat conductivity may be an organic material. The heat conduction layer is preferably, but not necessarily, formed on the entire surface of a first temperature detection element array region. Also, the heat conduction layer is preferably, but not necessarily, disposed inside the coating layer and below the infrared reflection layer. In some cases, the heat conduction layer may also serve as the infrared reflection layer.

Furthermore, in the imaging device having the first configuration including the various preferred modes and configurations described above, a temperature control layer is formed on the coating layer, and a temperature detection means may be further included. Thus, the temperature and the temperature distribution of the first temperature detection elements can be controlled with high precision. Here, the temperature control layer may be designed to function as a heater (a resistor, or a resistance member). For example, the temperature control layer may also be designed to serve as a wiring line. Specifically, the temperature detection means may be a silicon diode or a transistor that detects temperature by measuring a change in a temperature-dependent electrical resistance value, or a polysilicon thin film, for example. The material forming the temperature control layer that also serves as a wiring line may be a metal-based material film such as a tungsten film, a polysilicon film, or a titanium film, for example. The material that forms the temperature control layer may be a laminated film using the Peltier effect, or a carbon film, for example. In some cases, the temperature control layer may be disposed on the second substrate. Further, in these cases, the drive circuit may control the temperature control layer (specifically, control the current to be applied to the temperature control layer, to control the amount of heat to be generated from the temperature control layer, for example), on the basis of a result of temperature detection performed by the temperature detection means. Furthermore, in these configurations, the first structural body includes a first temperature detection element array region including first temperature detection elements, and a peripheral region surrounding the first temperature detection element array region, the temperature control layer may be formed in the first temperature detection element array region, or the temperature control layer may be formed in the region of the coating layer in which an orthogonal projection image of the first temperature detection element array region exists, or any analog-digital conversion circuit may not be disposed in the region of the second substrate in which the orthogonal projection image of the first temperature detection element array region exists. Since the analog-digital conversion circuit generates a large amount of heat, temperature can be made more uniform with such a configuration. Note that such a temperature control layer may also be adopted in a structure in which known light receiving elements (light receiving elements that receive visible light) are formed in place of the first temperature detection elements. In some cases, the temperature control layer may also serve as the infrared reflection layer.

Further, the imaging device having the first configuration including the various preferred modes and configurations described above may include a plurality of first temperature detection elements, and the void may be shared by 2×k (k being an integer of 1 or greater) first temperature detection elements adjacent to each other.

In the imaging device having the second configuration, each first temperature detection element has an infrared absorption layer on the infrared incident side, and has an infrared reflection layer on the opposite side from the infrared incident side, in the first temperature detection element assembly, the optical distance $L_0$ between the infrared absorption layer and the infrared reflection layer varies among the respective first temperature detection elements, and the optical distance $L_0$ in each first temperature detection element satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4,$$

where $\lambda_{IR}$ represents the wavelength of infrared rays to be absorbed by the infrared absorption layer of the first temperature detection element. Further, in the imaging device having the second configuration including such a preferred mode, each first temperature detection element has an infrared absorption layer on the infrared incident side, and an infrared reflection layer on the opposite side from the infrared incident side, and, in the first temperature detection element assembly, the material, the configuration, and the structure of the infrared absorption layer, or the material, the configuration, and the structure of the infrared reflection layer, or the material, the configuration, and the structure of the infrared absorption layer and the material, the configuration, and the structure of the infrared reflection layer may vary among the respective first temperature detection elements. That is, (Case A) the material, the configuration, and the structure of the infrared absorption layer vary, but the material, the configuration, and the structure of the infrared reflection layer are the same among the respective first temperature detection elements, (Case B) the material, the configuration, and the structure of the infrared reflection layer vary, but the material, the configuration, and the structure of the infrared absorption layer are the same among the respective first temperature detection elements, or (Case C) the material, the configuration, and the structure of the infrared absorption layer vary, and the material, the configuration, and the structure of the infrared reflection layer vary among the respective first temperature detection elements.

In the imaging device having the third configuration, each first temperature detection element has an infrared absorption layer on the infrared incident side, and an infrared reflection layer on the opposite side from the infrared incident side, and, in the first temperature detection element assembly, the material forming the infrared absorption layer, or the material forming the infrared reflection layer, or the material forming the infrared absorption layer and the material forming the infrared reflection layer may vary among the respective first temperature detection elements. Further, in the imaging device having the third configuration including such a preferred mode, each first temperature detection element has an infrared absorption layer on the infrared incident side, and has an infrared reflection layer on the opposite side from the infrared incident side, and, in the first temperature detection element assembly, the infrared absorption layer, the infrared reflection layer, or the infrared absorption layer and the infrared reflection layer vary in area, thickness, or area and thickness among the respective first temperature detection elements. That is, (Case a) the area of the infrared absorption layer varies, and the area of the infrared reflection layer is the same among the respective first temperature detection elements, (Case b) the area of the infrared reflection layer varies, and the area of the infrared absorption layer is the same among the respective first temperature detection elements, (Case c) the area of the infrared absorption layer varies, and the area of the infrared reflection layer varies among the respective first temperature detection elements, (Case d) the thickness of the infrared absorption layer varies, and the thickness of the infrared reflection layer is the same among the respective first temperature detection elements, (Case e) the thickness of the infrared reflection layer varies, and the thickness of the infrared absorption layer is the same among the respective first temperature detection elements, (Case f) the thickness of the infrared absorption layer varies, and the thickness of the infrared reflection layer varies among the respective first temperature detection elements, (Case g) the area and the thickness of the infrared absorption layer vary, and the area and the thickness of the infrared reflection layer are the same among the respective first temperature detection elements, (Case h) the area and the thickness of the infrared reflection layer vary, and the area and the thickness of the infrared absorption layer are the same among the respective first temperature detection elements, or (Case i) the area and the thickness of the infrared absorption layer vary, and the area and the thickness of the infrared reflection layer vary among the respective first temperature detection elements.

In the imaging device having the second configuration or the imaging device having the third configuration, the number of the first temperature detection elements constituting the first temperature detection element assembly is two or larger.

The coating layer covering the drive circuit in the second structural body may include a silicon oxide material, a silicon nitride material, a silicon oxynitride material, or any of various organic materials, for example. The coating layer may have a single-layer configuration, or may have a multilayer stack structure.

A method for stacking the first structural body and the second structural body, or particularly, for joining the first substrate and the coating layer, or more particularly for joining the bottom portion of the partition wall and the coating layer may be a method for forming a silicon-oxygen covalent bond through dehydration condensation (an ordinary temperature joining method based on Si—$SiO_2$), or an ordinary temperature joining method based on $SiO_2$—$SiO_2$, for example. Alternatively, in a case where contact holes, via holes, and various pad portions are provided in connecting a first temperature detection element and a drive circuit via a first drive line and a first signal line, in connecting a drive circuit and a second temperature detection element via a second drive line and a second signal line, and in connecting a drive circuit and a third element via a third drive line and a first signal line, the first structural body and the second structural body may be stacked with the use of connecting portions such as these contact holes, via holes, and various pad portions.

The material forming the connecting portions may be copper (Cu), tungsten (W), aluminum (Al), titanium (Ti), tantalum (Ta), gold (Au), carbon such as carbon nanotube or graphene, a titanium-tungsten alloy (TiW), or polysilicon, for example. The method for forming the contact holes and the via holes (also called through chip vias (TCVs) or through silicon vias (TSVs) may be any one of various kinds of CVD methods and various kinds of PVD methods. Note that these connecting holes may also include a material similar to any of those described above as the material forming the wiring lines and the wiring layer of the drive circuit.

Alternatively, it is possible to adopt a method (a metal-metal joining method) for forming metal layers or alloy layers, and apply pressure (weight) to the metal layers or the alloy layers at room temperature or in a heated state, to directly join the metal layers or the alloy layers.

Examples of the material forming the pad portions include solder balls, solder paste, AuSn eutectic solder, bumps containing solder, indium, gold (Au), or the like, so-called low-melting-point metal (alloy) materials, solder materials, and brazing materials. For example, it is possible to use: indium (In, melting point: 157° C.); an indium-gold low-melting-point alloy; tin (Sn)-based high-temperature solder such as $Sn_{80}Ag_{20}$ (melting point: 220 to 370° C.) or $Sn_{95}Cu_5$ (melting point: 227 to 370° C.); lead (Pb)-based high-temperature solder such as $Pb_{92.5}Ag_{2.5}$ (melting point: 304° C.), $Pb_{94.5}Ag_{5.5}$ (melting point: 304 to 365° C.), or $Pb_{92.5}Ag_{1.5}Sn_{1.0}$ (melting point: 309° C.); zinc (Zn)-based high-temperature solder such as $Zn_{95}Al_5$ (melting point: 380° C.); tin-lead standard solder such as $Sn_5Pb_{95}$ (melting point: 300 to 314° C.) or $Sn_2Pb_{98}$ (melting point: 316 to 322° C.); or a brazing material such as $Au_{88}Ga_{12}$ (melting point: 381° C.) (all the subscripts represent atomic %). The method for forming the pad portions may be any one of various CVD methods, various PVD methods, and various printing methods, for example. To connect the pad portions to each other, these materials are only required to be heated. Alternatively, it is possible to adopt a method using bumps containing solder, indium, gold (Au), or the like, or a method based on a chip-on-chip technique.

Examples of the material forming the infrared absorption layer include chromium (Cr) and its alloys, aluminum (Al) and its alloys, and a stack structure including a layer including one of these materials and a $SiO_2$ film or a SiN film, for example. The heat generated as a result of absorption of infrared rays in the infrared absorption layer is preferably reliably transferred to the first temperature detection elements. Further, the infrared absorption layer is preferably set at such a thickness that the sheet resistance value of the conductor material or the resistor material forming the infrared absorption layer falls within a range of 377 Ω☐±30%. The material forming the infrared reflection layer may be aluminum (Al) and its alloys, gold (Au) and its alloys, silver (Ag) and its alloys, copper (Cu) and its alloys, platinum (Pt) and its alloys, and a stack structure including layers including these materials, for example. These materials have different characteristics (areal resistivity and sheet resistance value, for example) from the characteristics of the infrared absorption layer. The infrared reflection layer may also serve as the metal material layer or the alloy material layer forming the exposed surface of the coating layer.

The space in which the first temperature detection elements are disposed is preferably decompressed or evacuated (including a low pressure close to a vacuum; the similar applies in the description below). The void is preferably also decompressed or evacuated. Alternatively, the entire imaging device is preferably housed in a package or a container (case) that is decompressed or evacuated.

On the infrared incident side of the imaging device, a structure that prevents reflection of infrared rays, an infrared filter for passing only infrared rays at specific frequency, or condensing elements such as diffraction grating or lenses may be provided as necessary.

The imaging devices having the first through fourth configurations including the various preferred modes and configurations described above may be combined as appropriate. It is possible not only to combine imaging devices of two configuration types, but also to combine imaging devices of three or more configuration types.

In the imaging device or the like of the present disclosure, the number of first temperature detection elements or the number of first temperature detection element assemblies that are arranged in the first direction and the second direction different from the first direction (specifically, in a two-dimensional matrix, for example), and detect temperature on the basis of infrared rays may be 640×480 (VGA), 320×240 (QVGA), 160×120 (QQVGA), 612×512, 1980× 1080 (and integral multiples thereof), or 2048×1080 (and integral multiples thereof), for example. The first direction and the second direction are preferably, but not necessarily, orthogonal to each other. In a pixel array of the above mentioned number of pixels, however, pixels may be removed in a checkered pattern, and the array may be rotated 45 degrees.

The imaging device or the like of the present disclosure can be applied to an infrared camera, a night-vision camera, a thermograph, an in-vehicle camera (a human sensor), an air conditioner (a human detecting sensor), and a microwave oven, for example. Note that, in some cases, the imaging device or the like of the present disclosure can be called a temperature detection sensor that detects temperature on the basis of infrared rays.

Example 1

Figure 2:
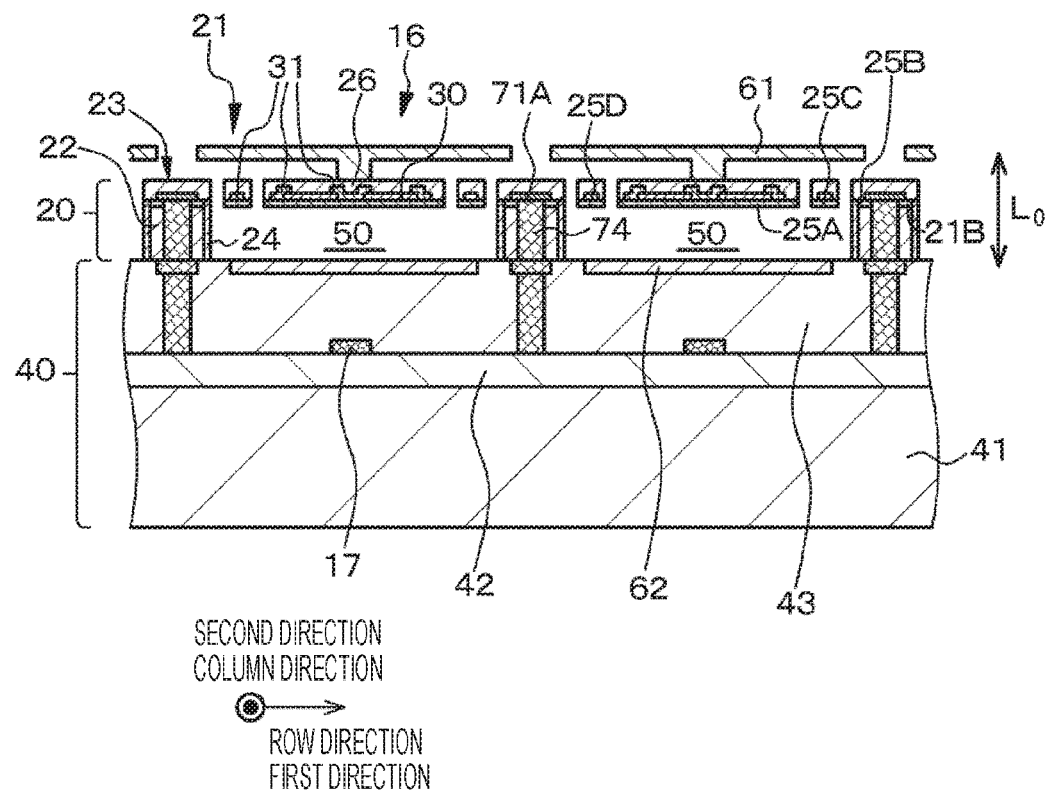
FIG. 2 is a schematic partial end view of a region (a first temperature detection element array region) including first temperature detection elements of the imaging device of Example 1.
Figure 3:
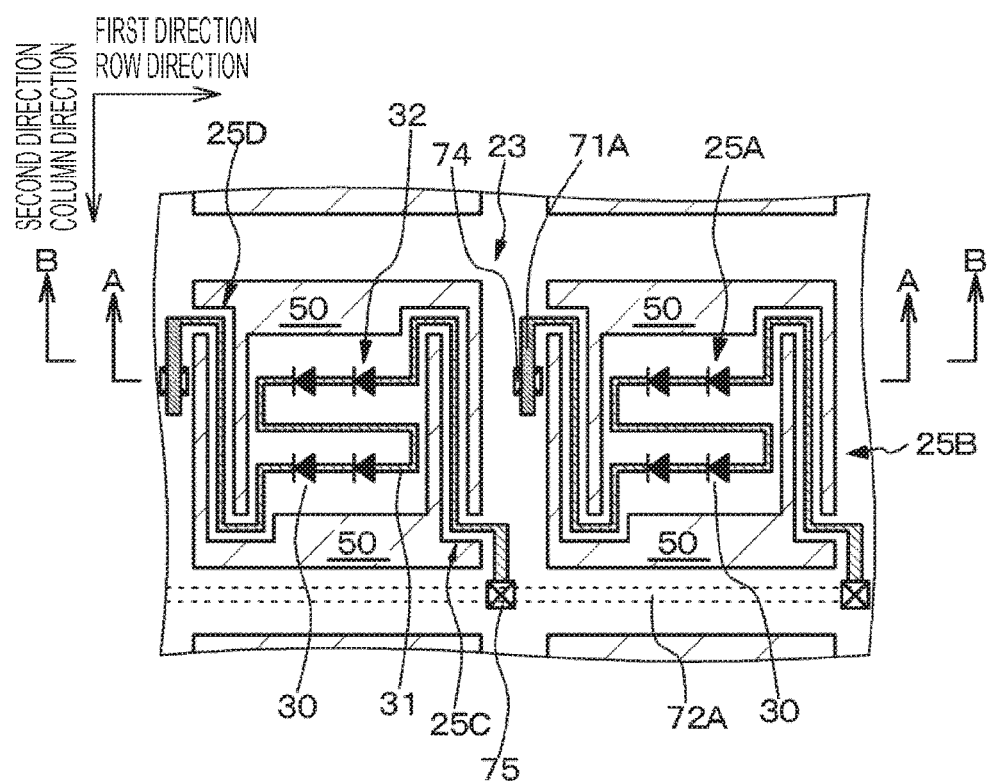
FIG. 3 is a schematic partial plan view of the imaging device of Example 1.
Figure 4:
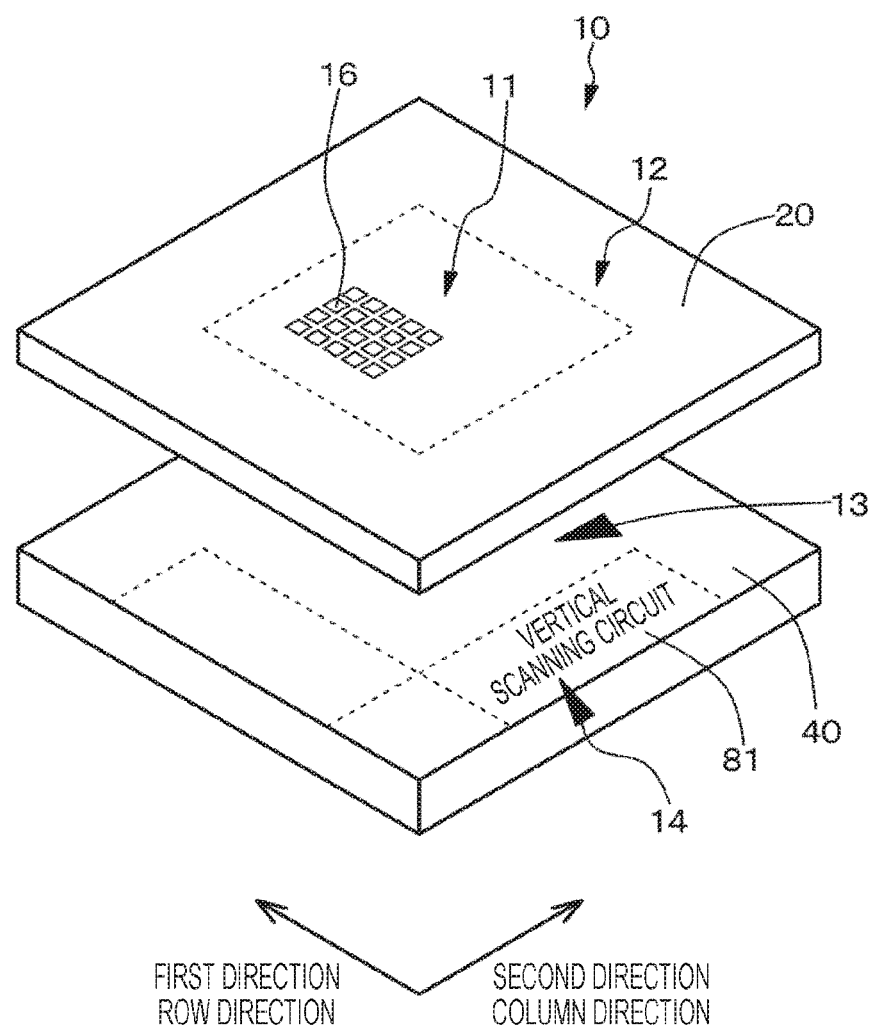
FIG. 4 is a schematic exploded perspective view of a first structural body and a second structural body in the imaging device of Example 1.

Example 1 relates to an imaging device according to the first embodiment of the present disclosure. In the imaging device of Example 1, one drive circuit is provided for a first temperature detection element and a second temperature detection element that form a pair. FIG. 1 shows an equivalent circuit diagram of the imaging device of Example 1. Further, FIG. 2 shows a schematic partial end view of a region including the first temperature detection elements (a first temperature detection element array region) of the imaging device of Example 1. FIG. 3 shows a schematic partial plan view of the region. FIG. 4 shows a schematic exploded perspective view of a first structural body and a second structural body in the imaging device of Example 1. Specifically, the imaging device of Example 1 is an imaging device having a face-to-back structure. Here, FIG. 2 is a schematic partial end view taken along the arrow A-A shown in FIG. 3. Further, in FIG. 3, the insulating film and the infrared absorption layer are not shown, and the voids, signal lines, and wiring lines are hatched for clarity. The drive line is indicated by dotted lines, and the pn junction diodes are denoted by symbols.

The imaging device of Example 1, or each imaging device of Examples 2 through 9 described later includes a first structural body 20, and a second structural body 40 stacked on the first structural body 20, the first structural body 20 including a first substrate 21, and a first temperature detection element 16 that is disposed on the first substrate 21 and detects temperature on the basis of infrared rays, the second structural body 40 including a second substrate 41, and a drive circuit 10A that is disposed on the second substrate 41 and is connected to the first temperature detection element 16 via a first drive line 72A and a first signal line 71A, the imaging device further including a second temperature detection element 17 connected to the drive circuit 10A via a second drive line 72B and a second signal line 71B, the drive circuit 10A including a switch circuit 101, a first current source 82A, a second current source 82B, a differential amplifier 83, and an analog-digital conversion circuit (ADC) 84.

Then, the first signal line 71A to which the first temperature detection element 16 is connected is connected to a first input end 101A of the switch circuit 101, the second signal line 71B to which the second temperature detection element 17 is connected is connected to a second input end 101B of the switch circuit 101, a first output end 101C of the switch circuit 101 is connected to a first input end 83A of the differential amplifier 83, a second output end 101D of the switch circuit 101 is connected to a second input end 83B of the differential amplifier 83, the first current source 82A is connected to the first input end 83A of the differential amplifier 83, the second current source 82B is connected to the second input end 83B of the differential amplifier 83, and an output end 83C of the differential amplifier 83 is connected to an input portion of the analog-digital conversion circuit 84. The differential amplifier 83 is included in an analog front end (AFE). The analog-digital conversion circuit (ADC) 84 includes an analog-digital conversion circuit of a delta-sigma modulation type (ΔΣ modulation type), for example.

Further, in the switch circuit 101, in a case where the first input end 101A and the first output end 101C of the switch circuit 101 are connected, the second input end 101B and the second output end 101D of the switch circuit 101 are connected. In a case where the first input end 101A and the second output end 101D of the switch circuit 101 are connected, the second input end 101B and the first output end 101C of the switch circuit 101 are connected. The switch circuit 101 may be a so-called butterfly switch circuit, for example.

Further, in the imaging device of Example 1, the first temperature detection elements 16 and the second temperature detection elements 17 are arranged in a first direction (row direction) and a second direction (column direction) different from the first direction in a two-dimensional matrix, and one drive circuit 10A is provided for a temperature detection element block including one first temperature detection element 16 and one second temperature detection element 17. In FIG. 1, a first temperature detection element 16, a second temperature detection element 17, and a drive circuit 10A are collectively denoted by reference numeral 10a.

In the regions of the second substrate 41 below the first temperature detection elements 16, the second temperature detection elements 17 and the drive circuits 10A are disposed. In the second structural body 40, the layer in which the drive circuits 10A are formed is schematically denoted by reference numeral 42. The first temperature detection elements 16 will be described later in detail. The second temperature detection elements 17 may include semiconductor temperature sensor elements. Depending on the configuration and the structure of the imaging device, and the configuration and the structure of the second temperature detection elements 17, the second temperature detection elements 17 may be disposed on the first substrate 21. The similar applies to the examples described below.

As shown in FIG. 4, the first structural body 20 includes a first temperature detection element array region 11 (surrounded by a dotted line) including the first temperature detection elements 16, and a peripheral region 12 surrounding the first temperature detection element array region 11. The second structural body 40 includes a central region 13 and a peripheral region 14. A vertical scanning circuit 81 and a horizontal scanning circuit 85 that constitute a drive unit are disposed in the peripheral region 14 and the central region 13 of the second structural body 40. Further, CPUs (or DSPs) forming the drive circuits 10A, a signal processing circuit, a storage device (a memory or a nonvolatile memory element, for example), and the like are disposed in the central region 13 of the second structural body 40, for example. Note that the CPUs (or DSPs), the signal processing circuit, and the storage device are not shown in the drawings. For each first temperature detection element 16, correction coefficient for correction during operation are stored in the nonvolatile memory element. Examples of the correction coefficients for correction during operation stored in the nonvolatile memory element include an offset value and a gain value for performing correction with a linear function for each pixel in a digital signal process. Through such correction, it becomes possible to correct differences in infrared absorptance caused by product variations among pixels, and differences in heat conduction from the pixels to the semiconductor substrate. Likewise, a flag indicating whether or not defect correction through a digital signal process for making a defective pixel, a defective column, or the like inconspicuous is preferably stored in the nonvolatile memory element.

Each first temperature detection element 16 disposed on the first substrate 21 is connected to the first input end 101A of the switch circuit 101 disposed on the second substrate 41, via the first signal line 71A disposed on the first substrate 21, a connecting hole (contact hole) 74 formed through the first substrate 21 and the second substrate 41, and the first signal line (not shown in FIG. 2) disposed on the second substrate 41. Further, each first drive line 72A (not shown in FIG. 2) extending from the vertical scanning circuit 81 forming the drive unit extends to the connecting hole (not shown) formed in the peripheral region 14 of the second structural body 40 and the peripheral region 12 of the first structural body 20. The first drive line 72A further extends on the first substrate 21 from this connecting hole to the first temperature detection element 16, and is connected to the first temperature detection element 16.

Each second temperature detection element 17 disposed on the second substrate 41 is connected to the second input end 101B of the switch circuit 101 disposed on the second substrate 41, via the second signal line 71B (not shown in FIG. 2) disposed in the second substrate 41. Further, the second drive line 72B (disposed on the second substrate 41, but not shown in FIG. 2) extending from the vertical scanning circuit 81 forming the drive unit is connected to the second temperature detection element 17.

The output unit of each analog-digital conversion circuit 84 is connected to an output line 73, and the output line 73 is connected to the horizontal scanning circuit 85. Various drive lines and various signal lines may be formed across the first substrate and the second substrate, depending on the configuration and the structure of the imaging device. The similar applies to the examples described below.

In the description below, operation of the imaging device of Example 1 will be described. In the description, signals and noise values in a period $\Delta t_1$ from time $t_0$ to $t_1$, a period $\Delta t_2$ from time $t_1$ to $t_2$, a period $\Delta t_3$ from time $t_2$ to $t_3$, and a period $\Delta t_4$ from time $t_3$ to $t_4$ are defined as follows. Note that signals and noise values change before input to the differential amplifier 83 and after output from the differential amplifier 83, but are denoted by the same symbols.

Period $\Delta t_1$:
Output of the first temperature detection element 16: $Sg_{A1}$
Output of the second temperature detection element 17: $Sg_{B1}$
Noise generated by the first current source 82A: $Nz(PS)_{A1}$
Noise generated by the second current source 82B: $Nz(PS)_{B1}$
Noise generated by the transistor at the first input end 83A of the differential amplifier 83: $Nz(AP)_{A1}$
Noise generated by the transistor at the second input end 83B of the differential amplifier 83: $Nz(AP)_{B1}$ Period $\Delta t_2$:
Output of the first temperature detection element 16: $Sg_{A2}$
Output of the second temperature detection element 17: $Sg_{B2}$
Noise generated by the first current source 82A: $Nz(PS)_{A2}$
Noise generated by the second current source 82B: $Nz(PS)_{B2}$
Noise generated by the transistor at the first input end 83A of the differential amplifier 83: $Nz(AP)_{A2}$
Noise generated by the transistor at the second input end 83B of the differential amplifier 83: $Nz(AP)_{B2}$ Period $\Delta t_3$:
Output of the first temperature detection element 16: $Sg_{A3}$
Output of the second temperature detection element 17: $Sg_{B3}$
Noise generated by the first current source 82A: $Nz(PS)_{A3}$
Noise generated by the second current source 82B: $Nz(PS)_{B3}$
Noise generated by the transistor at the first input end 83A of the differential amplifier 83: $Nz(AP)_{A3}$ Noise generated by the transistor at the second input end 83B of the differential amplifier 83: $Nz(AP)_{B3}$ Period $\Delta t_4$:

Output of the first temperature detection element 16: $Sg_{A4}$

Output of the second temperature detection element 17: $Sg_{B4}$

Noise generated by the first current source 82A: $Nz(PS)_{A4}$

Noise generated by the second current source 82B: $Nz(PS)_{B4}$

Noise generated by the transistor at the first input end 83A of the differential amplifier 83: $Nz(AP)_{A4}$ Noise generated by the transistor at the second input end 83B of the differential amplifier 83: $Nz(AP)_{B4}$ Meanwhile, in the imaging device of Example 1, noises generated at the transistors forming the input stages of the current sources 82A and 82B and the differential amplifier 83 are the principal noise (1/f noise). In the imaging device of Example 1, these noises are to be reduced.

First, in the period $\Delta t_1$ (the period from time $t_0$ to $t_1$), in the switch circuit 101, the first input end 101A and the first output end 101C of the switch circuit 101 are connected, and the second input end 101B and the second output end 101D of the switch circuit 101 are connected. In this state, the output $Sg_{A1}$ of the first temperature detection element 16 appears at the first output end 101C of the switch circuit 101, and is input to the first input end 83A of the differential amplifier 83. Meanwhile, the output $Sg_{B1}$ of the second temperature detection element 17 appears at the second output end 101D of the switch circuit 101, and is input to the second input end 83B of the differential amplifier 83. The signal A shown below is then input to the analog-digital conversion circuit 84 from the output end 83C of the differential amplifier 83, and the output from the analog-digital conversion circuit 84 is sent to the horizontal scanning circuit 85 via the output line 73.

Signal $A = \{Sg_{A1} + Nz(PS)_{A1} + Nz(AP)_{A1}\} - \{Sg_{B1} + Nz(PS)_{B1} + Nz(AP)_{B1}\}$ Next, in the period $\Delta_2$ (the period from time $t_1$ to $t_2$), in the switch circuit 101, the first input end 101A and the second output end 101D of the switch circuit 101 are connected, and the second input end 101B and the first output end 101C of the switch circuit 101 are connected. In this state, the output $Sg_{A2}$ of the first temperature detection element 16 appears at the second output end 101D of the switch circuit 101, and is input to the second input end 83B of the differential amplifier 83. Meanwhile, the output $Sg_{B2}$ of the second temperature detection element 17 appears at the first output end 101C of the switch circuit 101, and is input to the first input end 83A of the differential amplifier 83. The signal B shown below is then input to the analog-digital conversion circuit 84 from the output end 83C of the differential amplifier 83, and the output from the analog-digital conversion circuit 84 is sent to the horizontal scanning circuit 85 via the output line 73.

Signal $B = \{Sg_{B2} + Nz(PS)_{A2} + Nz(AP)_{A2}\} - \{Sg_{A2} + Nz(PS)_{B2} + Nz(AP)_{B2}\}$ In the horizontal scanning circuit 85, the signal B is subtracted from the signal A. The resultant signal C is then sent to the signal processing circuit.

Signal $C$ = signal $A$ − signal $B = [\{Sg_{A1} + Nz(PS)_{A1} + Nz(AP)_{A1}\} - \{Sg_{B1} + Nz(PS)_{B1} + Nz(AP)_{B1}\}] - [\{Sg_{B2} + Nz(PS)_{A2} + Nz(AP)_{A2}\} - \{Sg_{A2} + Nz(PS)_{B2} + Nz(AP)_{B2}\}] = (Sg_{A1} + Sg_{A2}) - (Sg_{B1} + Sg_{B2}) + Nz(PS)_{A1} - Nz(PS)_{A2} - Nz(PS)_{B1} + Nz(PS)_{B2} + Nz(AP)_{A1} - Nz(AP)_{A2} - Nz(AP)_{B1} + Nz(AP)_{B2}$  (1)

Here, if the output of the first temperature detection element 16, the output of the second temperature detection element 17, and the noise value do not change between the period $\Delta t_1$ and the period $\Delta t_2$, the third and fourth terms of the right side of the above equation (1) are "0", and the noise is canceled. Accordingly, the signal C is as follows.

Signal $C = 2(Sg_{A1} - Sg_{B1})$

After the above process is performed on the first temperature detection elements 16 and the second temperature detection elements 17 arranged in one row, the same process is performed on the first temperature detection elements 16 and the second temperature detection elements 17 arranged in the next row. This process is sequentially performed.

As described above, in the imaging device of Example 1, noise generated in the transistors constituting the input stages of the current sources 82A and 82B and the differential amplifiers 83, which is specifically 1/f noise, can be effectively removed. Note that the 1/f noise is dominated by the power of the component having low time frequency, and the change of the noise component having low time frequency can be regarded as close to "0" in the short time interval of the period $\Delta t_1$ and the period $\Delta t_2$. Accordingly, the 1/f noise can be effectively removed. Further, it is also possible to cancel the offsets of the first current source 82A and the second current source 82B, and cancel the offset of the input portion of the differential amplifier 83. Moreover, as one drive circuit 10A is provided for one first temperature detection element 16 and one second temperature detection element 17 that form a pair, the time of integration of signals of one frame from the first temperature detection elements 16 can be made longer, and further noise reduction can be performed. Further, as the first temperature detection elements 16 and the second temperature detection elements 17 are used, temperature measurement accuracy can be increased.

Figure 22:
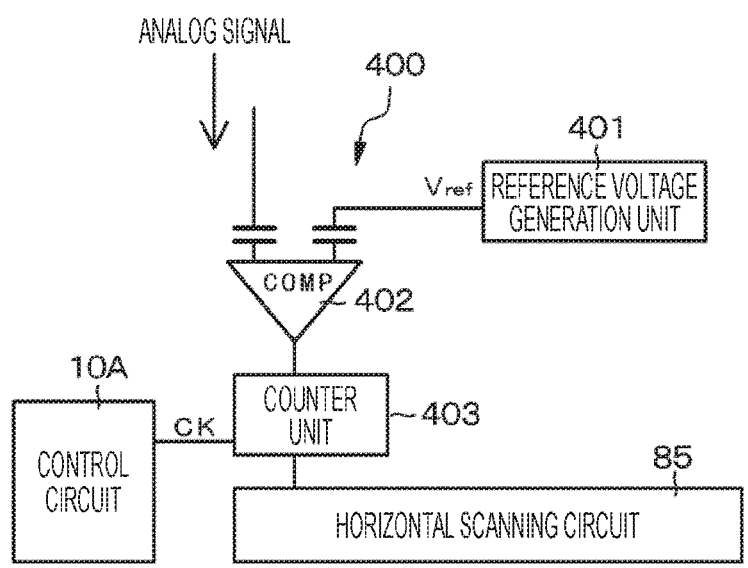
FIG. 22 is an equivalent circuit diagram of an example of a single-slope analog-to-digital conversion circuit.

An AD conversion circuit 400 including a single-slope analog-to-digital conversion circuit shown as an example in FIG. 22 includes:

a ramp voltage generator (a reference voltage generation unit) 401;

a comparator 402 to which an analog signal acquired by a temperature detection element or the like and a ramp voltage from the ramp voltage generator (reference voltage generation unit) 401 are input; and a counter unit 403 that is supplied with a clock CK from a clock supply unit (not shown) provided in a control circuit 10A, and operates on the basis of an output signal from the comparator 402.

Figure 23A:
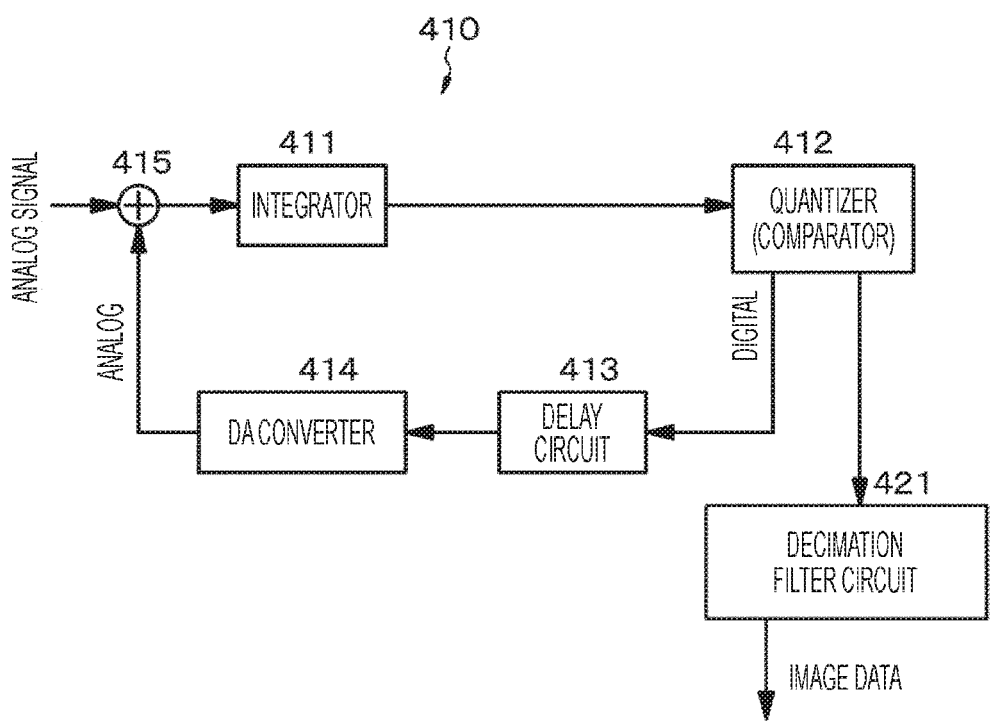
FIGS. 23A and 23B are equivalent circuit diagrams of delta-sigma modulation type (ΔΣ modulation type) analog-to-digital conversion circuits.

A $\Delta\Sigma$ AD conversion circuit 410 shown as an example in FIG. 23A includes at least an integrator 411, a quantizer (a comparator) 412, a delay circuit 413, and a digital-to-analog conversion circuit (a DA conversion circuit) 414 that forms part of a feedback system, and an adder 415 that functions as an input unit and has a level shift function. Then, in the $\Delta\Sigma$ AD conversion circuit 410, an analog signal from a temperature detection element or the like is passed through the integrator 411 and the quantizer 412 to turn into 1-bit data, and is output to a decimation circuit (a decimation filter circuit) 421. In the decimation circuit (decimation filter circuit) 421, 1-bit data is turned into multibit data, and "1" is digitally added basically in each time slot. Note that, in a case where a $\Delta\Sigma$ AD conversion circuit is used as an analog-to-digital conversion circuit (ADC), the sign of the coefficient to be given to the decimation circuit may be inverted with switching of a butterfly switch, so that signal subtraction that should be performed in the horizontal scanning circuit 85 shown in FIG. 1 can be performed in the analog-to-digital conversion circuit. In this case, the sign of the coefficient may be rapidly inverted, or the coefficient may be slowly changed from a positive value to a negative value or from a negative value to a positive value with a continuous function created by a time piecewise polynomial or the like. The configuration in which the sign of the coefficient is rapidly changed has the advantage of being capable of minimizing crosstalk between the two signals to be subjected to subtraction, but may cause an increase in quantization noise. This is because 1-bit conversion in the ΔΣ AD conversion circuit characteristically carries over part of quantization noise to the next conversion, and the carried-over quantization noise might increase due to subtraction though the quantization noise normally attenuates through averaging performed by the decimation circuit. It is possible to reduce the disadvantage of the increase in the carried-over quantization noise by slowly changing the coefficient in terms of time.

Figure 23B:
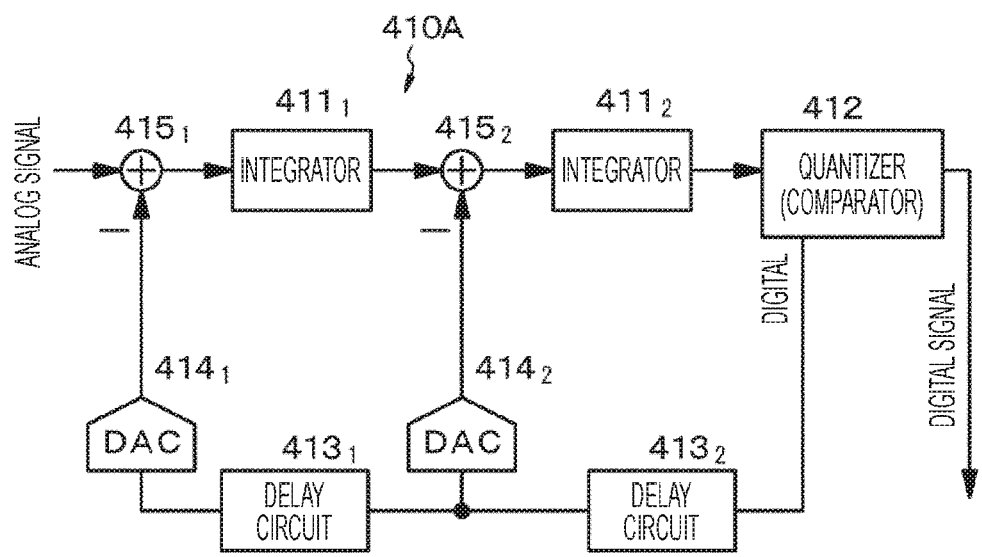

FIG. 23A shows the first-order ΔΣ AD modulation circuit 410, but an n-order ΔΣ AD conversion circuit, such as a second-order ΔΣ AD conversion circuit 410A, may be used as shown in FIG. 23B. Further, in the example shown in FIG. 23B, a second-order decimation filter circuit is used as the decimation filter circuit. However, a third-order decimation filter circuit may also be used as the decimation filter circuit. As shown in FIG. 23B, the second-order ΔΣ AD conversion circuit 410A is formed as an incremental ΔΣ AD conversion circuit, and includes two integrators $411_1$ and $411_2$ as ΔΣ modulators, two delay circuits $413_1$ and $413_2$, two DA conversion circuits $414_1$ and $414_2$, and two adders $415_1$ and $415_2$. Note that, in a case where a second-order ΔΣ AD modulator is used, the sign of the coefficient to be given to the decimation circuit may also be inverted with switching of the butterfly switch, so that effects similar to those of signal subtraction performed in the horizontal scanning circuit 85 can be achieved. The sign may be changed rapidly, or the filter coefficient may be changed slowly from a negative value to a positive value, or from a positive value to a negative value. This aspect is similar to that in the case of a first-order ΔΣ AD conversion circuit.

Example 2

Figure 5:
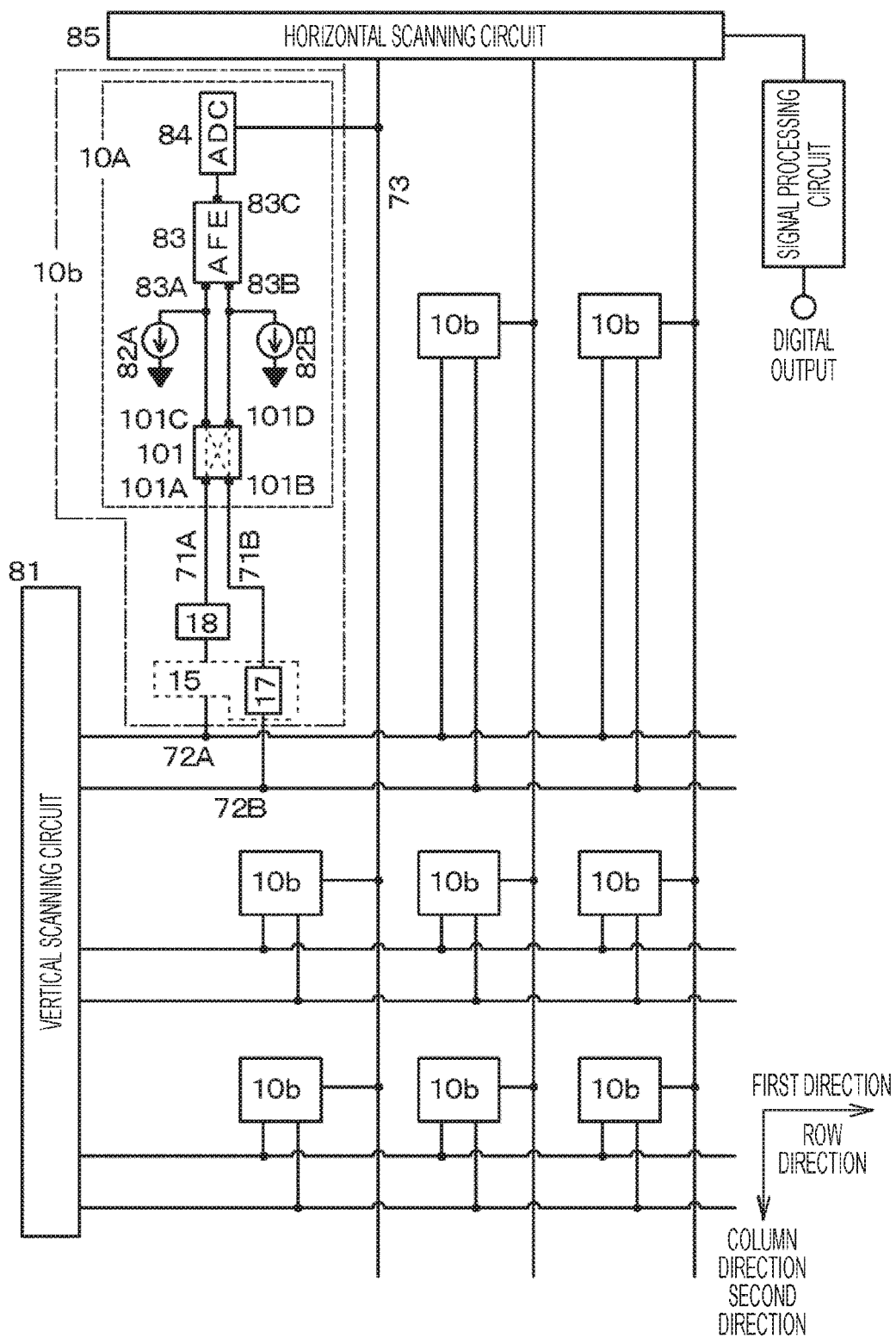
FIG. 5 is an equivalent circuit diagram of an imaging device of Example 2.
Figure 6:
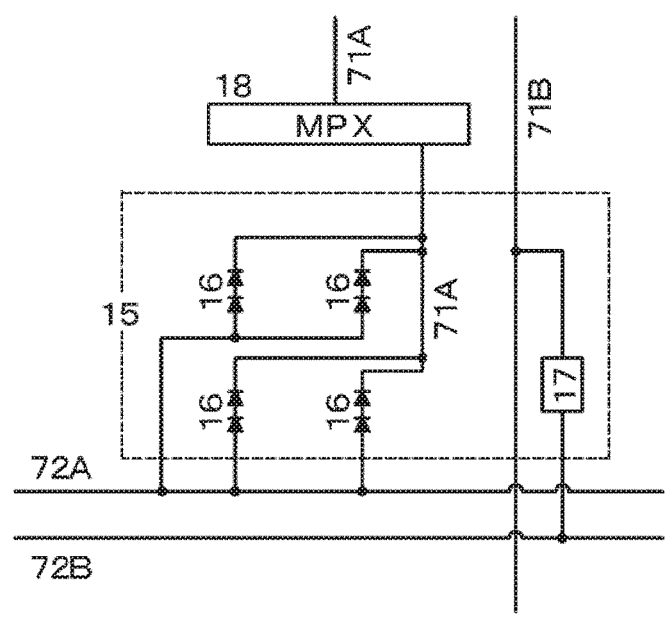
FIG. 6 is an equivalent circuit diagram of a temperature detection element block in the imaging device of Example 2.

Example 2 is a modification of Example 1. In an imaging device of Example 1, one drive circuit is provided for a plurality of (P) first temperature detection elements and one second temperature detection element that form a pair. FIG. 5 shows an equivalent circuit diagram of the imaging device of Example 2. FIG. 6 shows an equivalent circuit diagram of a temperature detection element block. Note that, in FIG. 5, a temperature detection element block 15, a second temperature detection element 17, a multiplexer circuit 18, and a drive circuit 10A are collectively denoted by reference numeral 10b.

In the imaging device of Example 2,
the first temperature detection elements 16 and the second temperature detection elements 17 are arranged in a first direction and a second direction different from the first direction in a two-dimensional matrix, and
one drive circuit 10A is provided for a temperature detection element block 15 including a plurality of (P) first temperature detection elements 16 and one second temperature detection element 17.

In each temperature detection element block 15, a plurality of (P) first temperature detection elements 16 is connected to the same first drive line 72A, and the first signal line 71A connected to each of the plurality of (P) first temperature detection elements 16 is connected to a first input end 101A of a switch circuit 101 via the multiplexer circuit 18 provided for the drive circuit 10A.

Here, in the example shown in FIG. 6, P=4. The four first temperature detection elements 16 constituting a temperature detection element block 15 are only required to be arranged in a 2×2 array in the row direction and the column direction, for example. However, the first temperature detection elements 16 are not necessarily arranged in this manner, and may be arranged in 3×3, 4×4, or the like, for example.

In an operation of the imaging device of Example 2, the operation of the imaging device described in Example 1 is performed between a first one of the four first temperature detection elements 16 constituting the temperature detection element block 15 and the second temperature detection element 17 is first performed. The operation of the imaging device described in Example 1 is then sequentially performed between the second one, the third one, and the fourth one of the four first temperature detection elements 16 constituting the temperature detection element block 15, and the second temperature detection element 17.

Example 3

Figure 7:
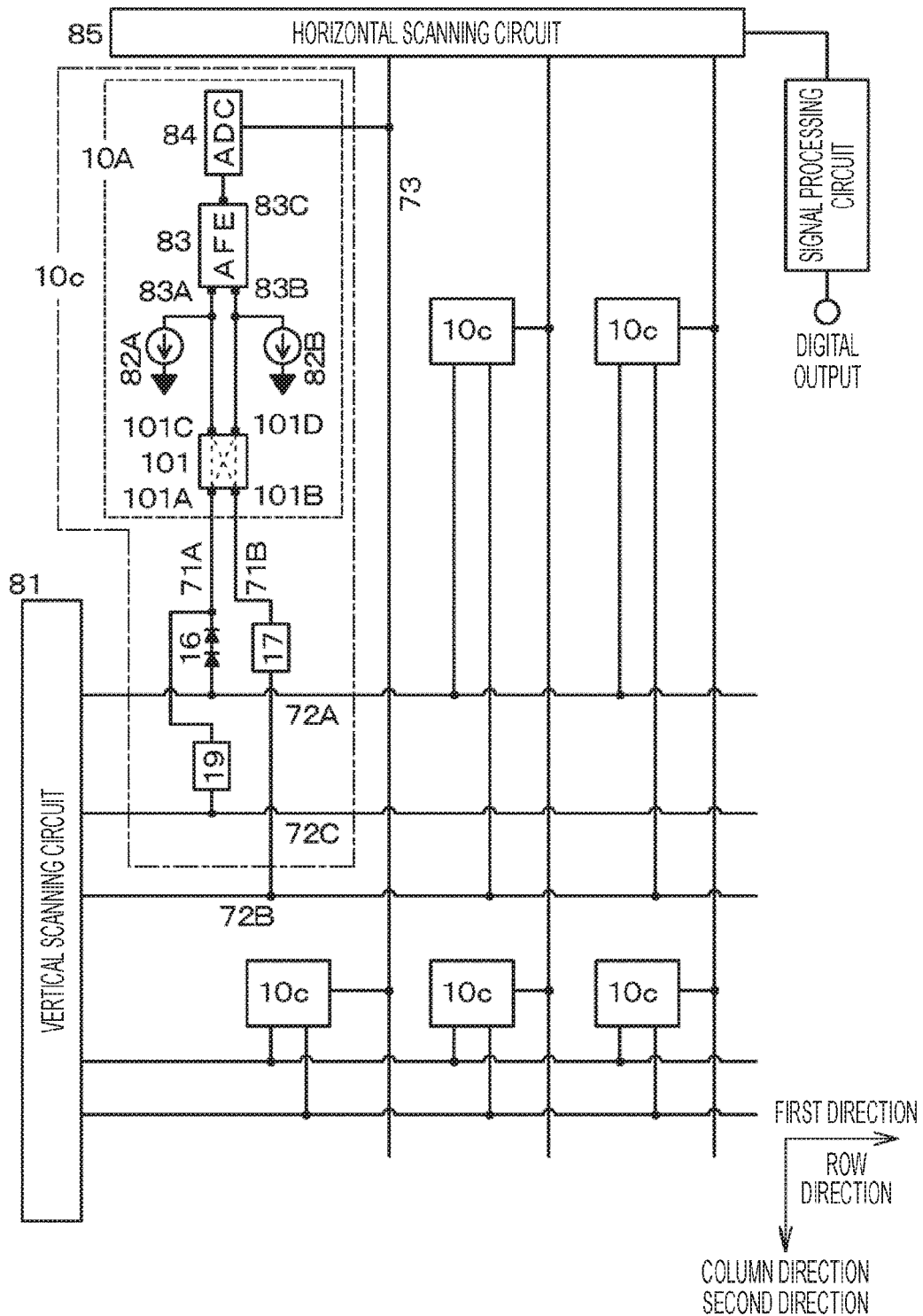
FIG. 7 is an equivalent circuit diagram of an imaging device of Example 3.

Example 3 is modifications of Examples 1 and 2. FIG. 7 shows an equivalent circuit diagram of an imaging device of Example 3. Note that, in FIG. 7, a first temperature detection element 16, a second temperature detection element 17, a third element 19, and a drive circuit 10A are collectively denoted by reference numeral 10c. The imaging device of Example 3 further includes
the third element 19 for gain measurement, the third element 19 being connected to a third drive line 72C and the drive circuit 10A via a first signal line 71A, and
the output voltage of the third element 19 differs from the output voltage of the second temperature detection element 17.

To make the output voltage of the third element 19 differ from the output voltage of the second temperature detection element 17, various means as described above are only required to be employed. Further, the third elements 19 is only required to be arranged one for each column along the second direction (row direction), for example.

In the imaging device of Example 3, the third element, instead of the first temperature detection element 16, is operated once per frame. As a result, it is possible to determine the gain variation in each column of the analog circuit, or the gain variation in the first direction. A correction coefficient based on the gain variation is then stored into the memory, and, in the next one frame, the obtained analog-digital conversion value is multiplied by the correction coefficient, so that the occurrence of gain variation in the first direction can be reduced or prevented. That is, it is possible to reduce or prevent the occurrence of vertical streaks in an image obtained by the imaging device.

Example 4

Figure 8:
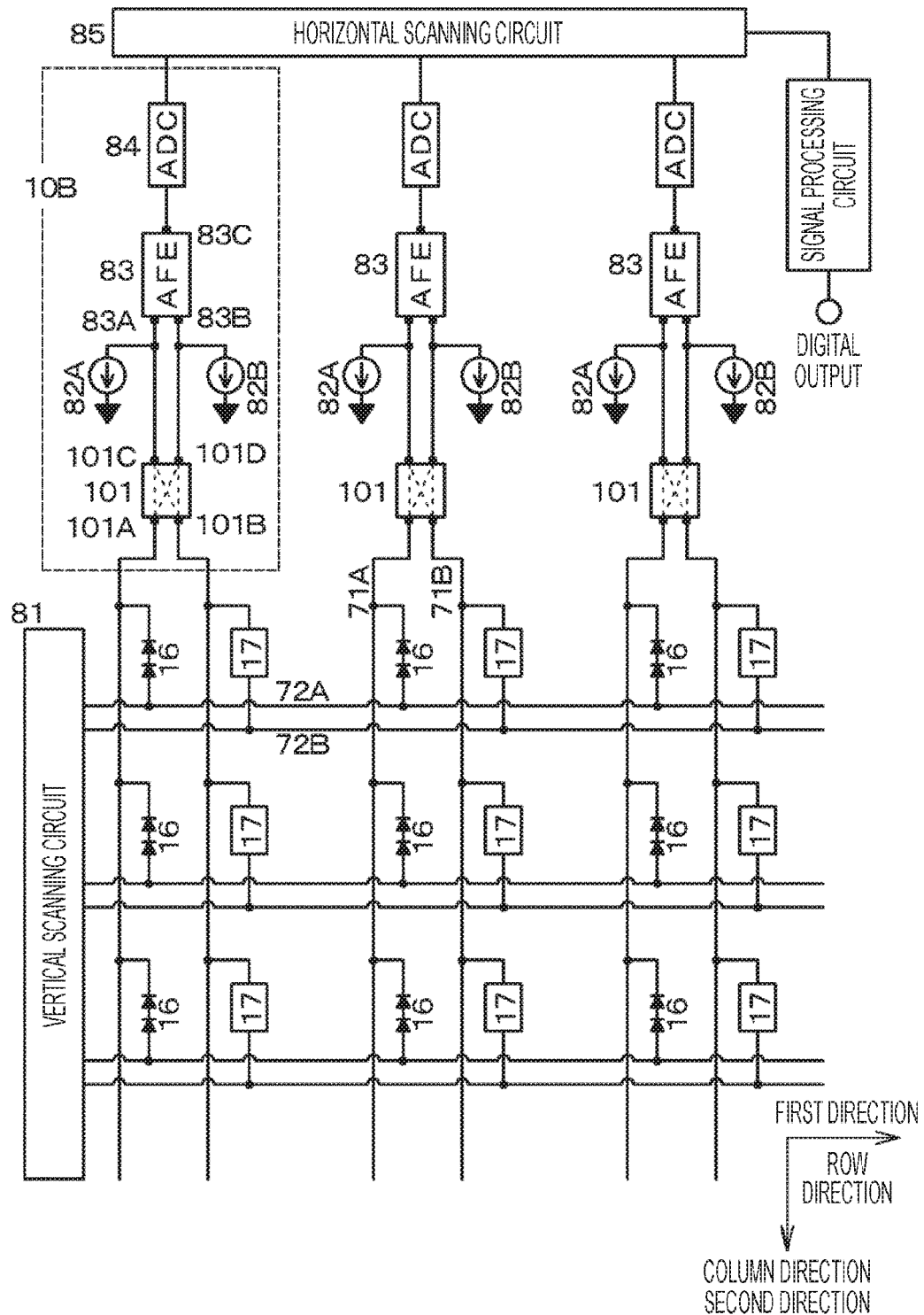
FIG. 8 is an equivalent circuit diagram of an imaging device of Example 4.

Example 4 is another modification of Example 1. In an imaging device of Example 4, one drive circuit is provided for the first temperature detection elements and the second temperature detection elements that occupy one column. FIG. 8 shows an equivalent circuit diagram of an imaging device of Example 4.

In the imaging device of Example 4, first temperature detection elements 16 and second temperature detection elements 17 are arranged in a first direction and a second direction different from the first direction in a two-dimensional matrix, and one drive circuit 10B is provided for N (N≥2) first temperature detection elements 16 and N second temperature detection elements 17 occupying one column in the second direction. The value of N depends on the specifications of the imaging device.

In the imaging device of Example 4, a differential amplifier 83 is also included in the analog front end (AFE). An analog-digital conversion circuit (ADC) 84 includes a single-slope analog-to-digital conversion circuit, for example. Further, in the imaging device of Example 4, a first current source 82A and a second current source 82B are disposed in the vicinity of the differential amplifier 83.

The second temperature detection element 17 is disposed in the region of a second substrate 41 below the first temperature detection element 16. A vertical scanning circuit 81 and a horizontal scanning circuit 85 that constitute a drive unit are disposed in the peripheral region 14 and the central region 13 of the second structural body 40. CPUs (or DSPs) forming the drive circuits 10B, a signal processing circuit, a storage device (a memory or a nonvolatile memory element, for example), and the like are further disposed in the central region 13 of the second structural body 40, for example. Note that the CPUs (or DSPs), the signal processing circuit, and the storage device are not shown in the drawings. For each first temperature detection element 16, correction coefficient for correction during operation are stored in the nonvolatile memory element.

Each first temperature detection element 16 disposed on the first substrate 21 is connected to the first input end 101A of the switch circuit 101 disposed on the second substrate 41, via the first signal line 71A disposed on the first substrate 21, a connecting hole (not shown) formed through the peripheral region 12 of the first structural body 20 and the peripheral region 14 of the second structural body 40, and a first signal line (not shown) disposed on the second substrate 41. Each first temperature detection element 16 is also connected to the vertical scanning circuit 81 disposed on the second substrate 41, via the first drive line 72A disposed on the first substrate 21, a connecting hole (not shown) formed through the peripheral region 12 of the first structural body 20 and the peripheral region 14 of the second structural body 40, and a first drive line (not shown) disposed on the second substrate 41.

Meanwhile, each second temperature detection element 17 disposed on the second substrate 41 is connected to the second input end 101B of the switch circuit 101 disposed on the second substrate 41 via the second signal line 71B disposed on the second substrate 41, and is also connected to the vertical scanning circuit 81 via the second drive line 72B.

Since the operation of the imaging device of Example 4 can be similar to the operation of the imaging device of Example 1, detailed explanation of the operation is not made herein.

As described above, in the imaging device of Example 4, noise generated in the transistors constituting the input stages of the current sources 82A and 82B and the differential amplifiers 83, which is specifically 1/f noise, can also be effectively removed.

Example 5

Figure 9:
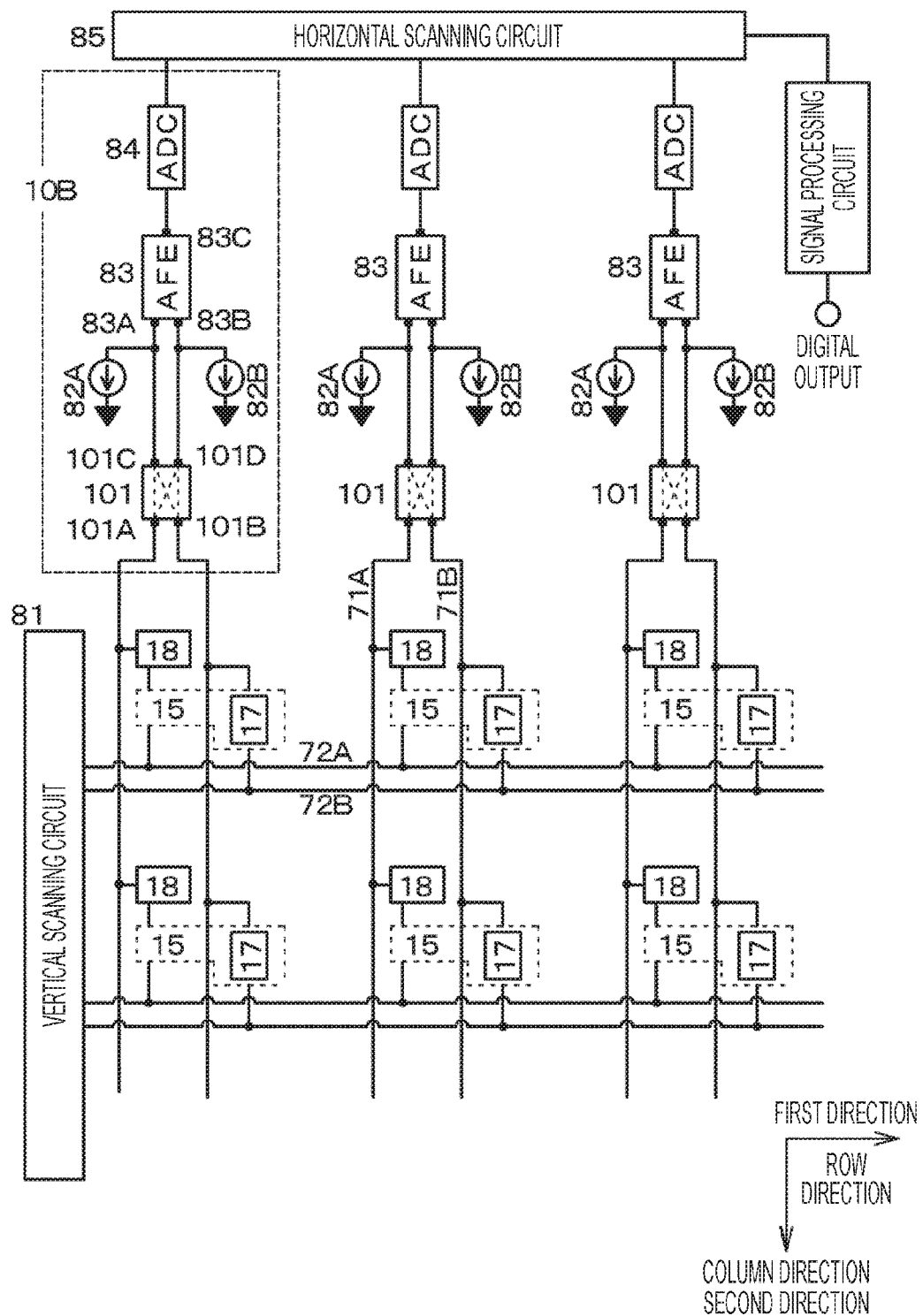
FIG. 9 is an equivalent circuit diagram of an imaging device of Example 5.

Example 5 is a modification of Example 4. FIG. 9 shows an equivalent circuit diagram of an imaging device of Example 5. Note that, an equivalent circuit diagram of a temperature detection element block is as shown in FIG. 6.

Specifically, in the imaging device of Example 5, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element block 15 of a plurality of (Q) temperature detection element blocks 15, one drive circuit 10B is provided for the first temperature detection elements 16 and the second temperature detection elements 17 occupying one column in the second direction, and each temperature detection element block 15 includes a plurality of (P) first temperature detection elements 16 and one second temperature detection element 17.

In each temperature detection element block 15, the plurality of (P) first temperature detection elements 16 is connected to the same first drive line 72A, and the first signal line 71A connected to each first temperature detection element 16 of the plurality of (P) first temperature detection elements 16 is connected to a first input end 101B of a switch circuit 101 via a multiplexer circuit 18 provided for the drive circuit 10B. Note that N=P×Q.

Here, in the example shown in FIG. 6, P=4. The four first temperature detection elements 16 constituting a temperature detection element block 15 are only required to be arranged in a 2×2 array in the row direction and the column direction, for example. However, the first temperature detection elements 16 are not necessarily arranged in this manner, and may be arranged in 3×3, 4×4, or the like, for example. Since the operation of the imaging device of Example 5 can be similar to the operations in Example 4 and Example 2, detailed explanation of the operation is not made herein.

Example 6

Figure 10:
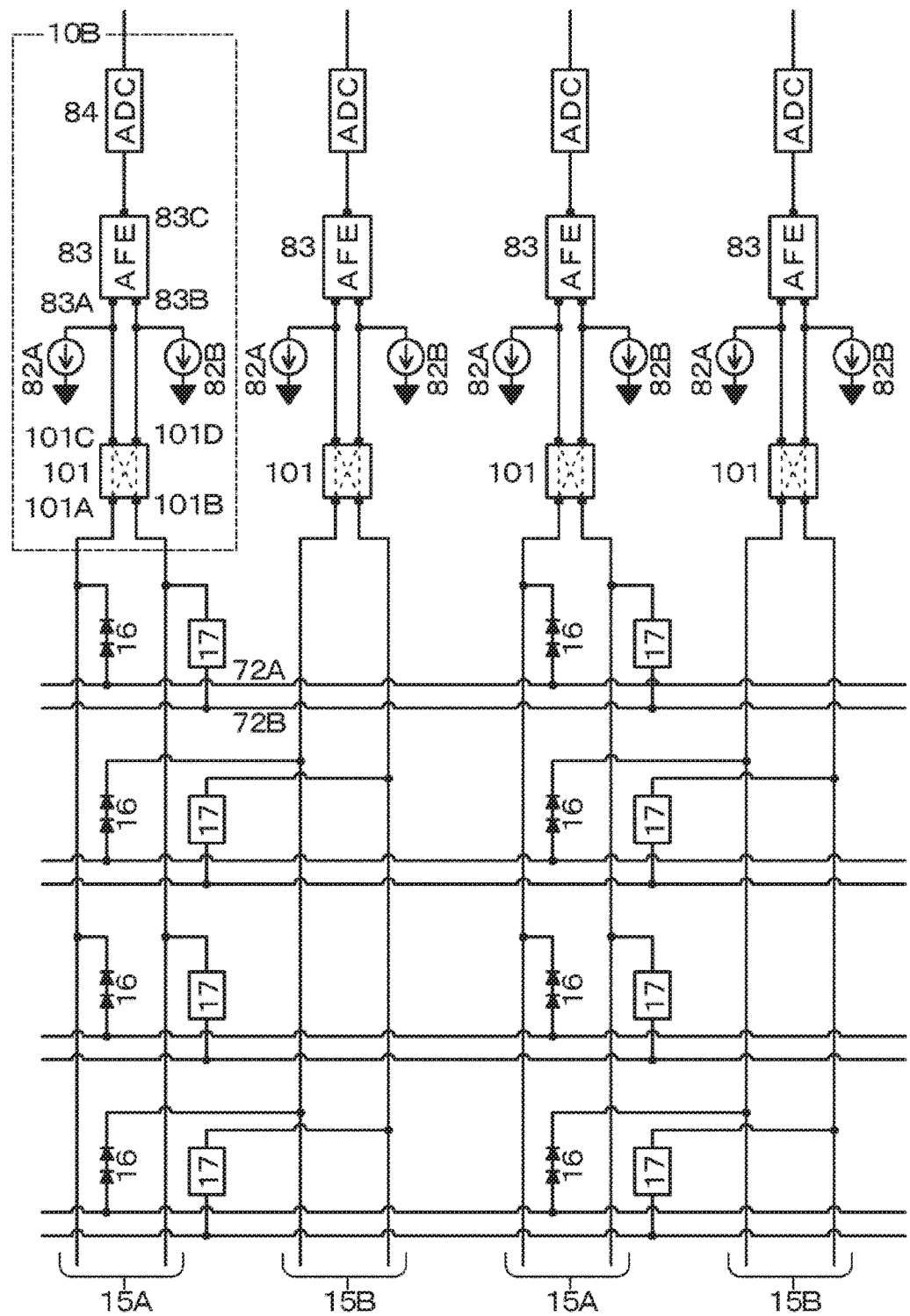
FIG. 10 is an equivalent circuit diagram of an imaging device of Example 6.

Example 6 is another modification of Example 4. FIG. 10 shows an equivalent circuit diagram of an imaging device of Example 6. Note that, an equivalent circuit diagram of a temperature detection element block is as shown in FIG. 6. Note that, in FIG. 10, the vertical scanning circuit 81 and the horizontal scanning circuit 85 constituting the drive unit are not shown.

Specifically, the imaging device of Example 6 has column-parallel ADC structures, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element unit of a plurality of (R, or, specifically, R=2 in Example 6) temperature detection element units 15A and 15B arranged in the second direction, each temperature detection element unit of the plurality of (R) temperature detection element units 15A and 15B is connected to one drive circuit 10B, the first temperature detection elements 16 and the second temperature detection elements 17 occupying each temperature detection element unit 15A or 15B belong to one temperature detection element block 15 of a plurality of (Q, or specifically, Q=N/R in Example 6), each temperature detection element block 15 includes one or a plurality of (P, or, specifically, P=1 in Example 6) first temperature detection elements 16 and one second temperature detection element 17.

In each temperature detection element block 15, the one or the plurality of (P) first temperature detection elements 16 are connected to the same first drive line 72A, and the first signal line 71A connected to the one or each first temperature detection element 16 of the plurality of (P) first temperature detection elements 16 is connected to a first input end 101A of a switch circuit 101 in a case where P=1, and is connected to the first input end 101A of the switch circuit 101 via a multiplexer circuit 18 provided for the drive circuit 10B in a case where P≥2. Note that N=P×Q×R. Further, the value of P is not necessarily "1", and the value of R is not necessarily "2".

Since the operation of the imaging device of Example 6 can be similar to the operation in Example 4 or operations in Example 4 and Example 2, detailed explanation of the operation is not made herein. Further, as the imaging device of Example 6 has column-parallel ADC structures, the time of integration of signals from the first temperature detection elements 16 per frame can be made longer, and noise can be further reduced.

Example 7

Example 7 is modifications of Examples 4 through 6, and is a combination of one of Examples 4 through 6 and Example 3. Specifically, an imaging device of Example 7 further includes a third element 19 for gain measurement, the third element 19 being connected to a third drive line 72C and a drive circuit 10B via a first signal line 71A, and the output voltage of the third element 19 differs from the output voltage of a second temperature detection element 17.

Figure 11:
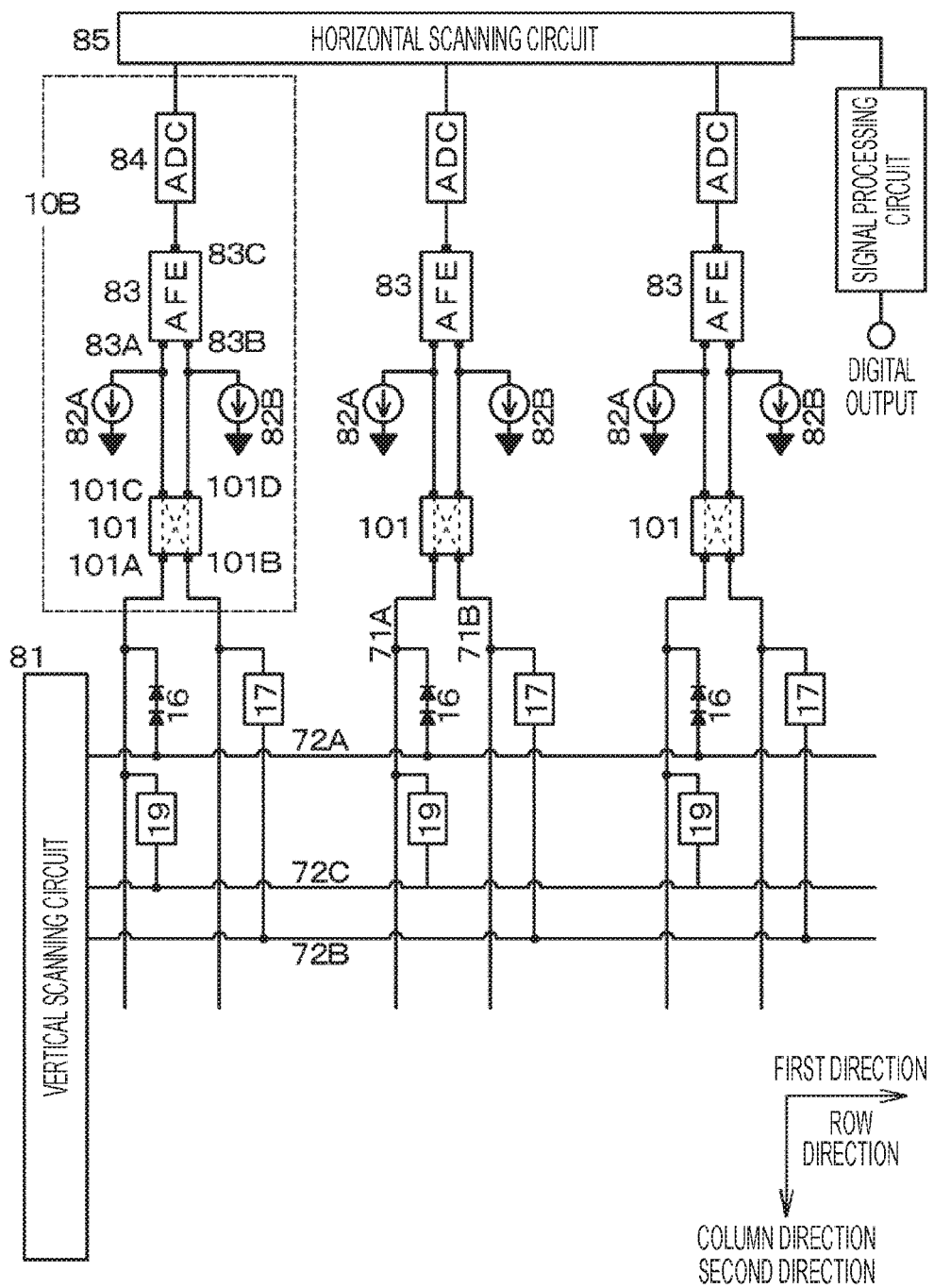
FIG. 11 is an equivalent circuit diagram of an imaging device of Example 7.

FIG. 11 shows an equivalent circuit diagram of the imaging device of Example 7, in which the imaging device described in Example 4 and the imaging device described in Example 3 are combined.

Example 8

Figure 12:
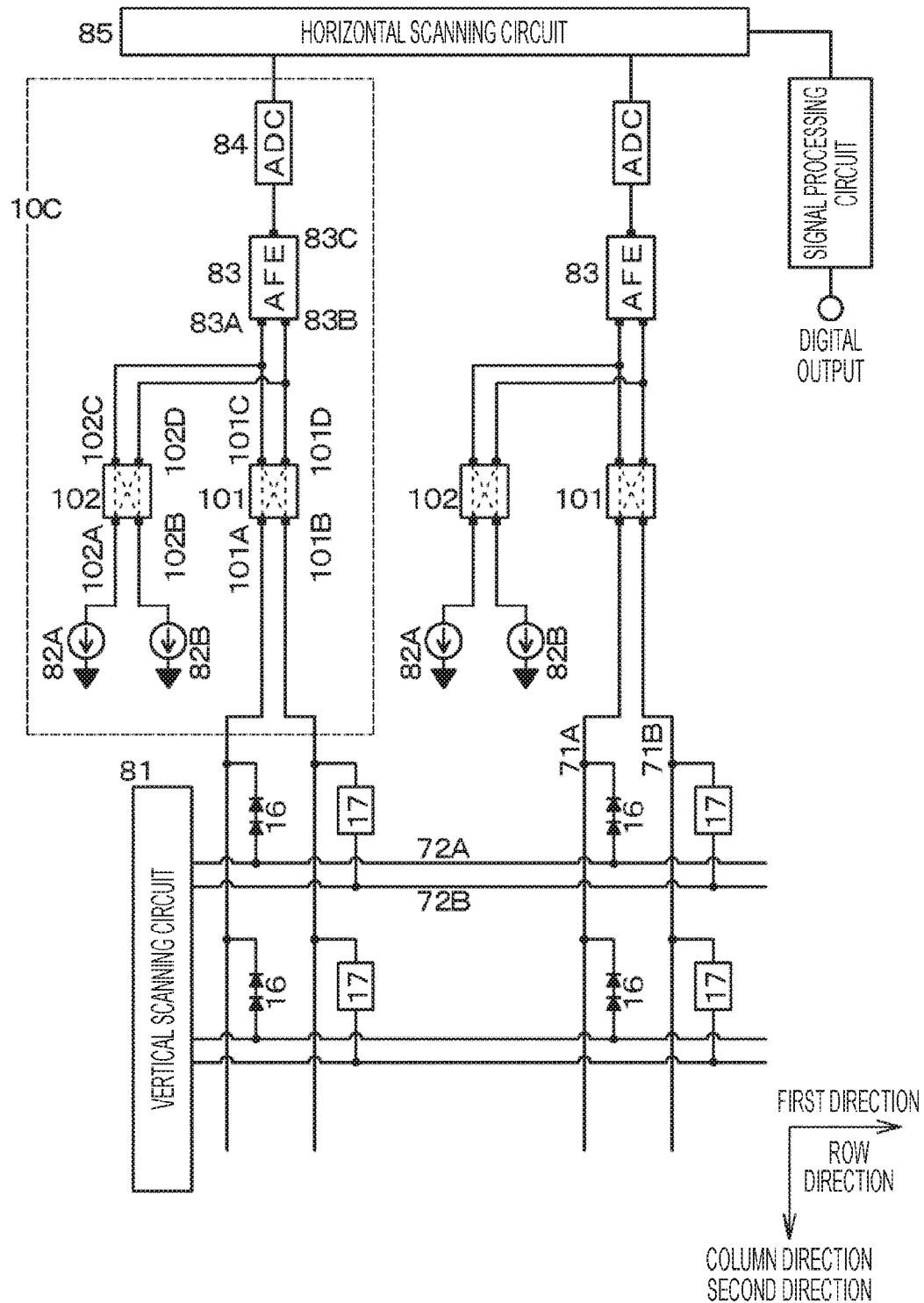
FIG. 12 is an equivalent circuit diagram of an imaging device of Example 8.

Example 8 is a modification of Example 1, and relates to an imaging device according to A of the first embodiment of the present disclosure. FIG. 12 shows an equivalent circuit diagram of an imaging device of Example 8.

In the imaging device of Example 8, a drive circuit 10C further includes a second switch circuit 102, a first current source 82A is connected to a first input end 102A of the second switch circuit 102, instead of a first input end 83A of a differential amplifier 83, a second current source 82B is connected to a second input end 102B of the second switch circuit 102, instead of a second input end 83B of the differential amplifier 83, a first output end 102C of the second switch circuit 102 is connected to the first input end 83A of the differential amplifier 83, a second output end 102D of the second switch circuit 102 is connected to the second input end 83B of the differential amplifier 83, and, in a case where the first input end 102A and the first output end 102C of the second switch circuit 102 are connected, the second input end 102B and the second output end 102D of the second switch circuit 102 are connected, and, in a case where the first input end 102A and the second output end 102D of the second switch circuit 102 are connected, the second input end 102B and the first output end 102C of the second switch circuit 102 are connected. Note that, in the description below, the switch circuit 101 will be sometimes referred to as the "first switch circuit 101" for convenience sake.

Further, in the imaging device of Example 8, first temperature detection elements 16 and second temperature detection elements 17 are arranged in a first direction and a second direction different from the first direction in a two-dimensional matrix, and one drive circuit 10C is provided for N (N≥2) first temperature detection elements 16 and N second temperature detection elements 17 occupying one column in the second direction.

In the imaging device of Example 8, the differential amplifier 83 is also included in the analog front end (AFE). An analog-digital conversion circuit (ADC) 84 includes a single-slope analog-to-digital conversion circuit, for example. Further, in the imaging device of Example 8, the first current source 82A and the second current source 82B are disposed in the vicinity of the differential amplifier 83.

In the description below, operation of the imaging device of Example 8 will be explained, and the meanings of the symbols to be used in the explanation are as described above.

First, in a period $\Delta t_1$ (the period from time $t_0$ to time $t_1$), in the first switch circuit 101, the first input end 101A and the first output end 101C of the first switch circuit 101 are connected, and the second input end 101B and the second output end 101D of the first switch circuit 101 are connected. In the second switch circuit 102, the first input end 102A and the first output end 102C of the second switch circuit 102 are connected, and the second input end 102B and the second output end 102D of the second switch circuit 102 are connected. In this state, the output $Sg_{A1}$ of the first temperature detection element 16 appears at the first output end 101C of the first switch circuit 101, and is input to the first input end 83A of the differential amplifier 83. Meanwhile, the output $Sg_{B1}$ of the second temperature detection element 17 appears at the second output end 101D of the first switch circuit 101, and is input to the second input end 83B of the differential amplifier 83. The signal A shown below is then input to the analog-digital conversion circuit 84 from the output end 83C of the differential amplifier 83, and the output from the analog-digital conversion circuit 84 is sent to the horizontal scanning circuit 85.

Signal $A=\{Sg_{A1}+Nz(PS)_{A1}+Nz(AP)_{A1}\}-\{Sg_{B1}+Nz(PS)_{B1}+Nz(AP)_{B1}\}$ Next, in a period $\Delta t_2$ (the period from time $t_1$ to $t_2$), while the first switch circuit 101 does not change, the first input end 102A and the second output end 102D of the second switch circuit 102 are connected, and the second input end 102B and the first output end 102C of the second switch circuit 102 are connected in the second switch circuit 102. In this state, the output $Sg_{A2}$ of the first temperature detection element 16 appears at the first output end 101C of the first switch circuit 101, and is input to the first input end 83A of the differential amplifier 83. Meanwhile, the output $Sg_{B2}$ of the second temperature detection element 17 appears at the second output end 101D of the first switch circuit 101, and is input to the second input end 83B of the differential amplifier 83. The signal B shown below is then input to the analog-digital conversion circuit 84 from the output end 83C of the differential amplifier 83, and the output from the analog-digital conversion circuit 84 is sent to the horizontal scanning circuit 85.

$$\text{Signal } B = [\{Sg_{A2} + Nz(PS)_{B2} + Nz(AP)_{A2}\} - \{Sg_{B2} + Nz(PS)_{A2} + Nz(AP)B_2\}] \quad (5)$$

Next, in a period $\Delta t_3$ (the period from time $t_2$ to $t_3$), in the first switch circuit 101, the first input end 101A and the second output end 101D of the first switch circuit 101 are connected, and the second input end 101B and the first output end 101C of the first switch circuit 101 are connected. Meanwhile, in the second switch circuit 102, the first input end 102A and the first output end 102C of the second switch circuit 102 are connected, and the second input end 102B and the second output end 102D of the second switch circuit 102 are connected. In this state, the output $Sg_{A3}$ of the first temperature detection element 16 appears at the second output end 101D of the first switch circuit 101, and is input to the second input end 83B of the differential amplifier 83. Meanwhile, the output $Sg_{B3}$ of the second temperature detection element 17 appears at the first output end 101C of the first switch circuit 101, and is input to the first input end 83A of the differential amplifier 83. The signal C shown below is then input to the analog-digital conversion circuit 84 from the output end 83C of the differential amplifier 83, and the output from the analog-digital conversion circuit 84 is sent to the horizontal scanning circuit 85.

$$\text{Signal } C = [\{Sg_{B3} + Nz(PS)_{A3} + Nz(AP)_{A3}\} - \{Sg_{A3} + Nz(PS)_{B3} + Nz(AP)_{B3}\}]$$

Next, in a period $\Delta t_4$ (the period from time $t_3$ to time $t_4$), while the first switch circuit 101 does not change, the first input end 102A and the second output end 102D of the second switch circuit 102 are connected, and the second input end 102B and the first output end 102C of the second switch circuit 102 are connected in the second switch circuit 102. In this state, the output $Sg_{A4}$ of the first temperature detection element 16 appears at the second output end 101D of the first switch circuit 101, and is input to the second input end 83B of the differential amplifier 83. Meanwhile, the output $Sg_{B4}$ of the second temperature detection element 17 appears at the first output end 101C of the first switch circuit 101, and is input to the first input end 83A of the differential amplifier 83. The signal D shown below is then input to the analog-digital conversion circuit 84 from the output end 83C of the differential amplifier 83, and the output from the analog-digital conversion circuit 84 is sent to the horizontal scanning circuit 85.

$$\text{Signal } D = \{Sg_{B4} + Nz(PS)_{B4} + Nz(AP)_{A4}\} - \{Sg_{A4} + Nz(PS)_{A4} + Nz(AP)_{B4}\}$$

In the horizontal scanning circuit 85, the signal A and the signal B are added, and the signal C and the signal D are subtracted. The resultant signal E is then sent to the signal processing circuit.

$$\text{Signal } E = \text{Signal } A + \text{Signal } B - \text{Signal } C - \text{Signal } D = \quad (2)$$

$$\{Sg_{A1} + Nz(PS)_{A1} + Nz(AP)_{A1}\} - \{Sg_{B1} + Nz(PS)_{B1} + Nz(AP)_{B1}\} +$$

$$\{Sg_{A2} + Nz(PS)_{B2} + Nz(AP)_{A2}\} -$$

$$\{Sg_{B2} + Nz(PS)_{A2} + Nz(AP)_{B2}\} -$$

$$\{Sg_{B3} + Nz(PS)_{A3} + Nz(AP)_{A3}\} +$$

$$\{Sg_{A3} + Nz(PS)_{B3} + Nz(AP)_{B3}\} -$$

-continued $$\{Sg_{B4} + Nz(PS)_{B4} + Nz(AP)_{A4}\} +$$

$$\{Sg_{A4} + Nz(PS)_{A4} + Nz(AP)_{B4}\} =$$

$$\{Sg_{A1} + Sg_{A2} + Sg_{A3} + Sg_{A4}\} + \{-Sg_{B1} - Sg_{B2} - Sg_{B3} - Sg_{B4}\} +$$

$$\{Nz(PS)_{A1} - Nz(PS)_{A2} - Nz(AP)_{A3} + Nz(PS)_{A4}\} +$$

$$\{-Nz(PS)_{B1} + Nz(PS)_{B2} + Nz(PS)_{B3} - Nz(PS)_{B4}\} +$$

$$\{Nz(AP)_{A1} + Nz(AP)_{A2} - Nz(PS)_{A3} - Nz(AP)_{A4}\} +$$

$$\{-Nz(AP)_{B1} - Nz(AP)_{B2} + Nz(AP)_{B3} + Nz(AP)_{B4}\}$$

In Examples 1 through 7, only one switch circuit is provided. Therefore, the noise generated by the transistors in the first current source 82A and the first input end 83A of the differential amplifier 83 is collectively processed, and the noise generated by the transistors in the second current source 82B and the second input end 83B of the differential amplifier 83 is collectively processed. However, the event in which the noise generated by the transistor in the first current source 82A increases or decreases is independent of the event in which the noise generated by the transistor in the first input end 83A of the differential amplifier 83 increases or decreases. Likewise, the event in which the noise generated by the transistor in the second current source 82B increases or decreases is also independent of the event in which the noise generated by the transistor in the second input end 83B of the differential amplifier 83 increases or decreases. Accordingly, canceling these noises independently of one another can lead to more effective canceling of the noises.

In Example 8, two switch circuits are provided. Thus, the event in which the noise generated by the transistor in the first current source 82A increases or decreases, and the event in which the noise generated by the transistor in the first input end 83A of the differential amplifier 83 increases or decreases can be processed independently of each other. Likewise, the event in which the noise generated by the transistor in the second current source 82B increases or decreases can also be processed independently of the event in which the noise generated by the transistor in the second input end 83B of the differential amplifier 83 increases or decreases. Accordingly, these noises can be canceled independently of one another, and thus, noise canceling can be effectively performed. For example, in a case where the noise $Nz(PS)_A$ generated by the first current source 82A increases in the period $\Delta_1$ and decreases in the period $\Delta_2$ in Examples 1 through 7, the third term of the right side of the above equation (1) is not "0". On the other hand, in a case where the noise increases in the period $\Delta_1$ and the period $\Delta_2$ in Example 8, which is the same as the period $\Delta_1$ in Examples 1 through 7, and decreases in the period $\Delta_3$ and the period $\Delta_4$ in Example 8, which is the same as the period $\Delta_2$ in Examples 1 through 7, the third term on the right side of the above equation (2) is "0".

Further, the inputs from the first current source 82A and the second current source 82B to the differential amplifier 83 are switched by the second switch circuit. Therefore, the first current source 82A and the second current source 82B may be referred to as chopper current sources, and it is possible to cancel the offsets of the first current source 82A and the second current source 82B, cancel the offset of the input portion of the differential amplifier 83, and reduce 1/f noise.

After the above process is performed on the first temperature detection elements 16 and the second temperature detection elements 17 arranged in one row, the same process is performed on the first temperature detection elements 16 and the second temperature detection elements 17 arranged in the next row. This process is sequentially performed. Note that the order of switching of the first switch circuit 101 and the second switch circuit 102 is an example, and may be changed as appropriate. Further, depending on the structure of the analog-digital conversion circuit, an integration capacitor for integrating input signals is provided at the input portion of the analog-digital conversion circuit. In an analog-digital conversion circuit having such a structure, however, it is only necessary to optimize the resolution of the time analog-digital conversion of analog-digital conversion, by appropriately setting the capacitance value of the integration capacitor.

Note that, in Example 8, the addition of the signals A and B, and the subtraction of the signals C and D are performed by an addition circuit and a subtraction circuit (not shown) included in the horizontal scanning circuit 85. However, the addition circuit and the subtraction circuit are not limited to such a mode, but the sign of the coefficient may be inverted with a circuit provided in a digital filter circuit included in the analog-digital conversion circuit, so that addition and subtraction are performed. Thus, noise cancellation similar to the above can be performed. Alternatively, a switch that inverts the polarity of the current flowing from the output of the differential amplifier to the integration capacitor may be added, and the switch is turned on and off to add and subtract signals. Thus, noise cancellation similar to the above can be performed. In a case where a butterfly switch that inverts polarity is added to both the input and the output of the differential amplifier, a configuration called a "chopper amplifier" is obtained.

Figure 13:
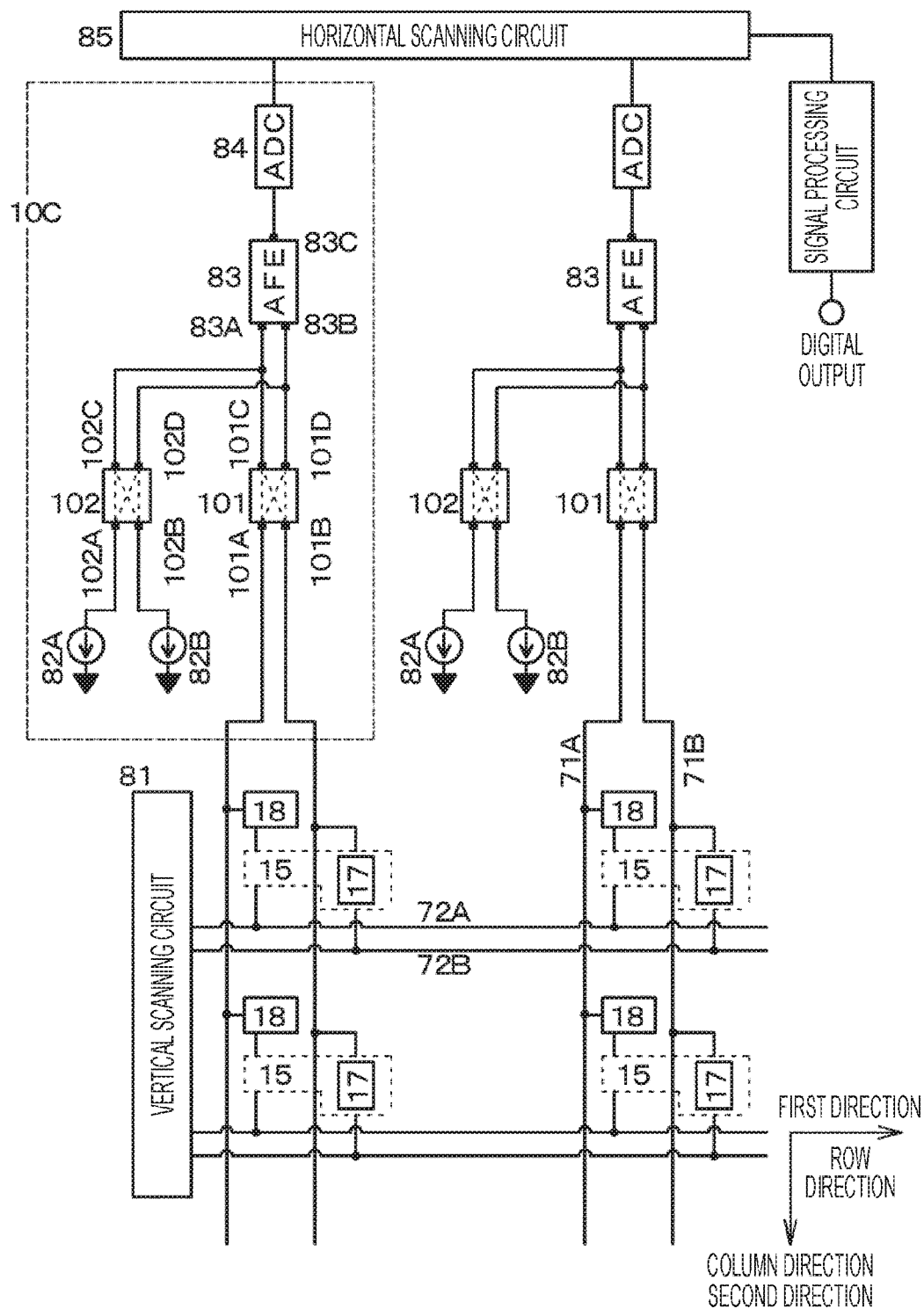
FIG. 13 is an equivalent circuit diagram of a modification of the imaging device of Example 8.

In an equivalent circuit diagram of a modification of Example 8 as shown in FIG. 13, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element block 15 of a plurality of (Q) temperature detection element blocks 15, one drive circuit 10C is provided for the first temperature detection elements 16 and the second temperature detection elements 17 occupying one column in the second direction, and each temperature detection element block 15 includes a plurality of (P) first temperature detection elements 16 and one second temperature detection element 17.

In each temperature detection element block 15, the plurality of (P) first temperature detection elements 16 is connected to the same first drive line 72A, and the first signal line 71A connected to each first temperature detection element 16 of the plurality of (P) first temperature detection elements 16 is connected to the first input end 101A of the first switch circuit 101 via the multiplexer circuit 18 provided for the drive circuit 10C. Note that N=P×Q.

Here, in the example shown in FIG. 13, P=4. The four first temperature detection elements 16 constituting a temperature detection element block 15 are only required to be arranged in a 2×2 array in the row direction and the column direction, for example. However, the first temperature detection elements 16 are not necessarily arranged in this manner, and may be arranged in 3×3, 4×4, or the like, for example.

Figure 14:
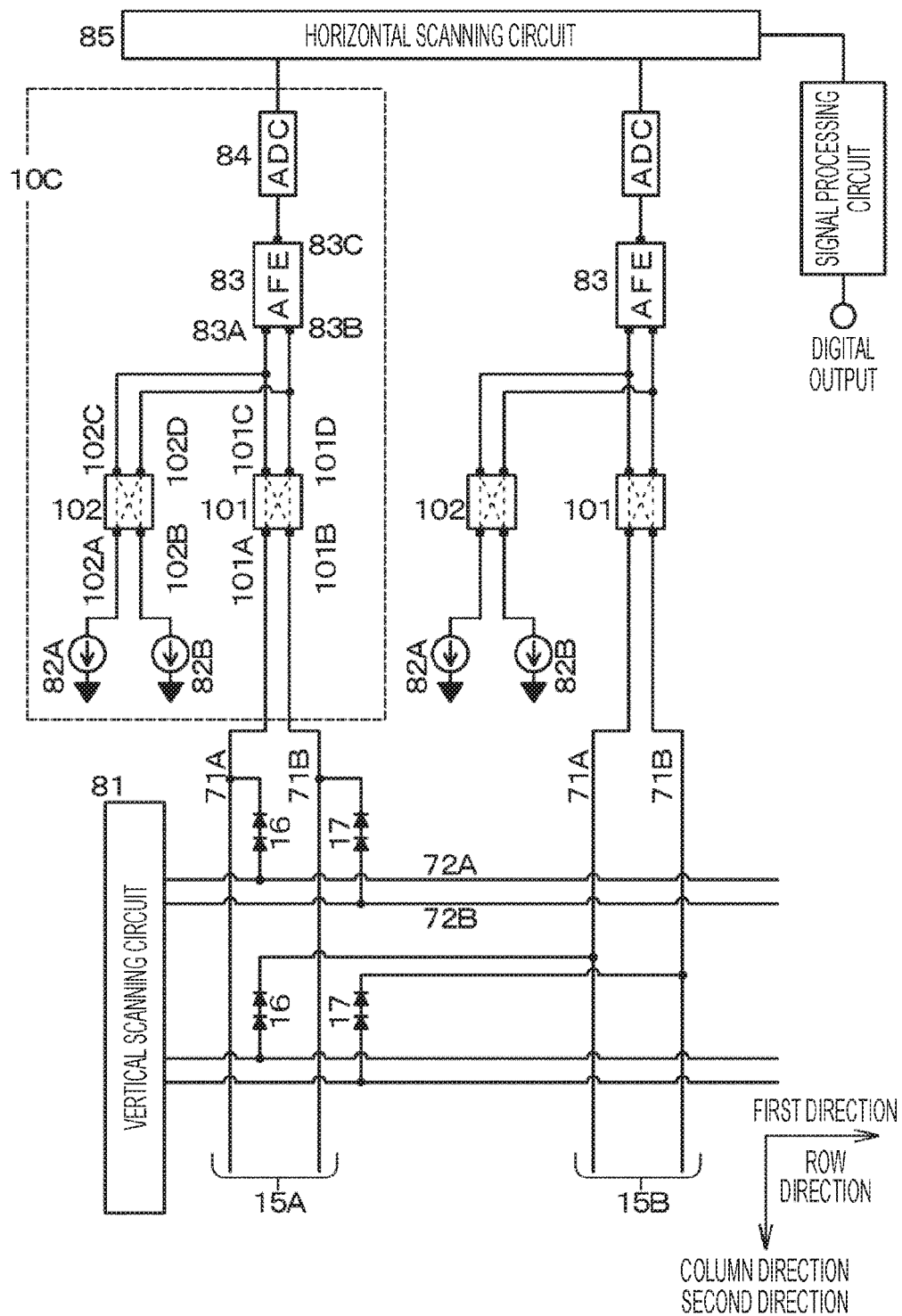
FIG. 14 is an equivalent circuit diagram of another modification of the imaging device of Example 8.

Alternatively, as shown in an equivalent circuit diagram of another modification of Example 8 in FIG. 14, this modification has column-parallel ADC structures, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element unit of a plurality of (R, or, specifically, R=2, for example) temperature detection element units 15A and 15B arranged in the second direction, each temperature detection element unit of the plurality of (R) temperature detection element units 15A and 15B is connected to one drive circuit 10C, the first temperature detection elements 16 and the second temperature detection elements 17 occupying each temperature detection element unit 15A or 15B belong to one temperature detection element block 15 of a plurality of (Q, or specifically, Q=N/R) temperature detection element blocks 15, each temperature detection element block 15 includes one or a plurality of (P, or, specifically, P=1, for example) first temperature detection elements 16 and one second temperature detection element 17.

In each temperature detection element block 15, the one or the plurality of (P) first temperature detection elements 16 is connected to the same first drive line 72A, and the first signal line 71A connected to the one or each first temperature detection element 16 of the plurality of (P) first temperature detection elements 16 is connected to the first input end 101A of the first switch circuit 101 in a case where P=1, and is connected to the first input end 101A of the first switch circuit 101 via a multiplexer circuit 18 provided for the drive circuit 10C in a case where P≥2. Note that N=P×Q×R. Further, the value of P is not necessarily "1", and the value of R is not necessarily "2". As column-parallel ADC structures are adopted as above, the time of integration of signals from the first temperature detection elements 16 per frame can be made longer, and noise can be further reduced.

Alternatively, Example 8 and Example 3 may be combined. Specifically, an imaging device further includes a third element 19 for gain measurement, the third element 19 being connected to a third drive line 72C and a drive circuit 10C via a first signal line 71A, and the output voltage of the third element 19 differs from the output voltage of a second temperature detection element 17.

Figure 15:
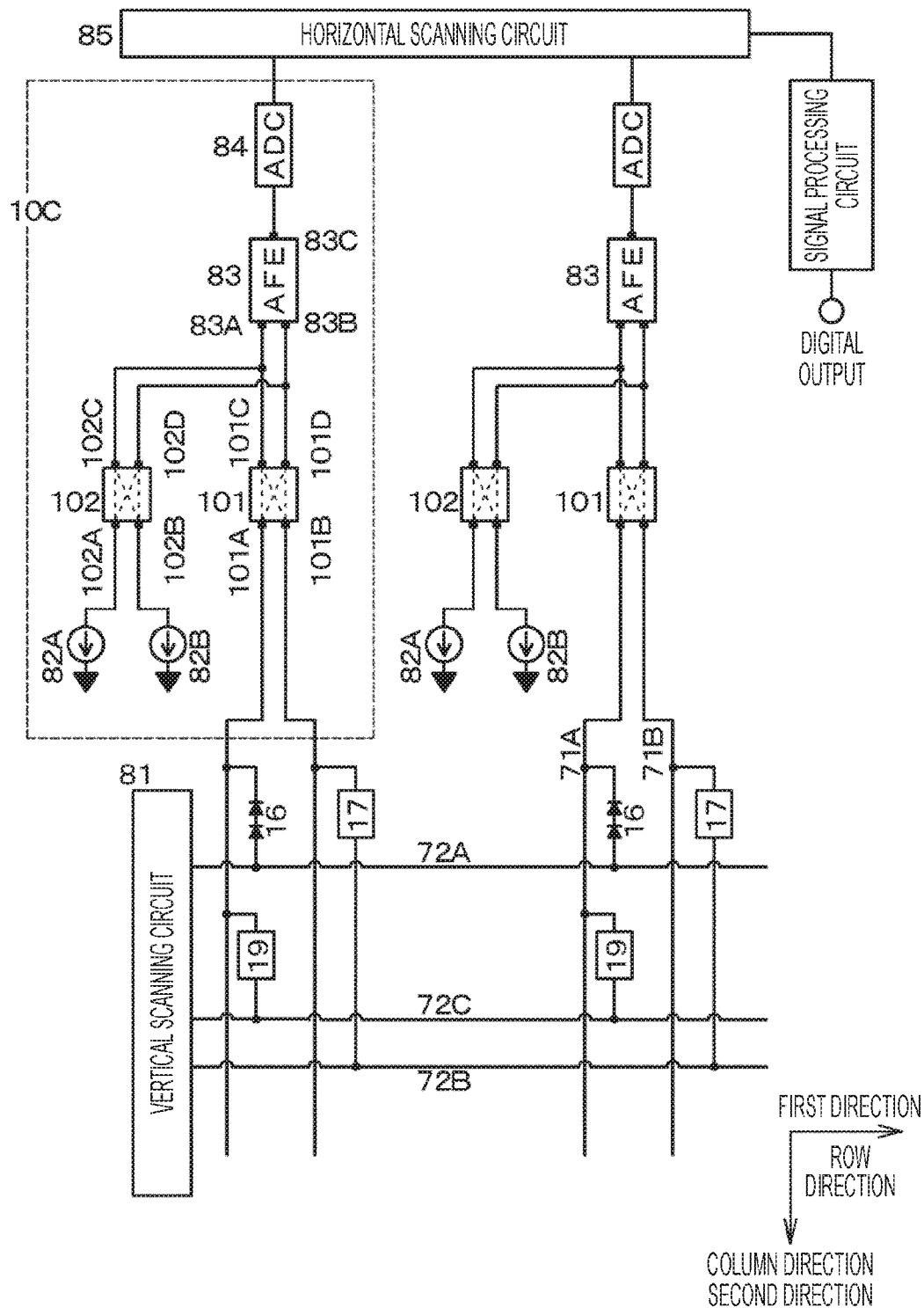
FIG. 15 is an equivalent circuit diagram of yet another modification of the imaging device of Example 8.

FIG. 15 shows an equivalent circuit diagram of such a modification of the imaging device of Example 8, in which the imaging device of Example 8 and the imaging device described in Example 3 are combined.

Example 9

Figure 16:
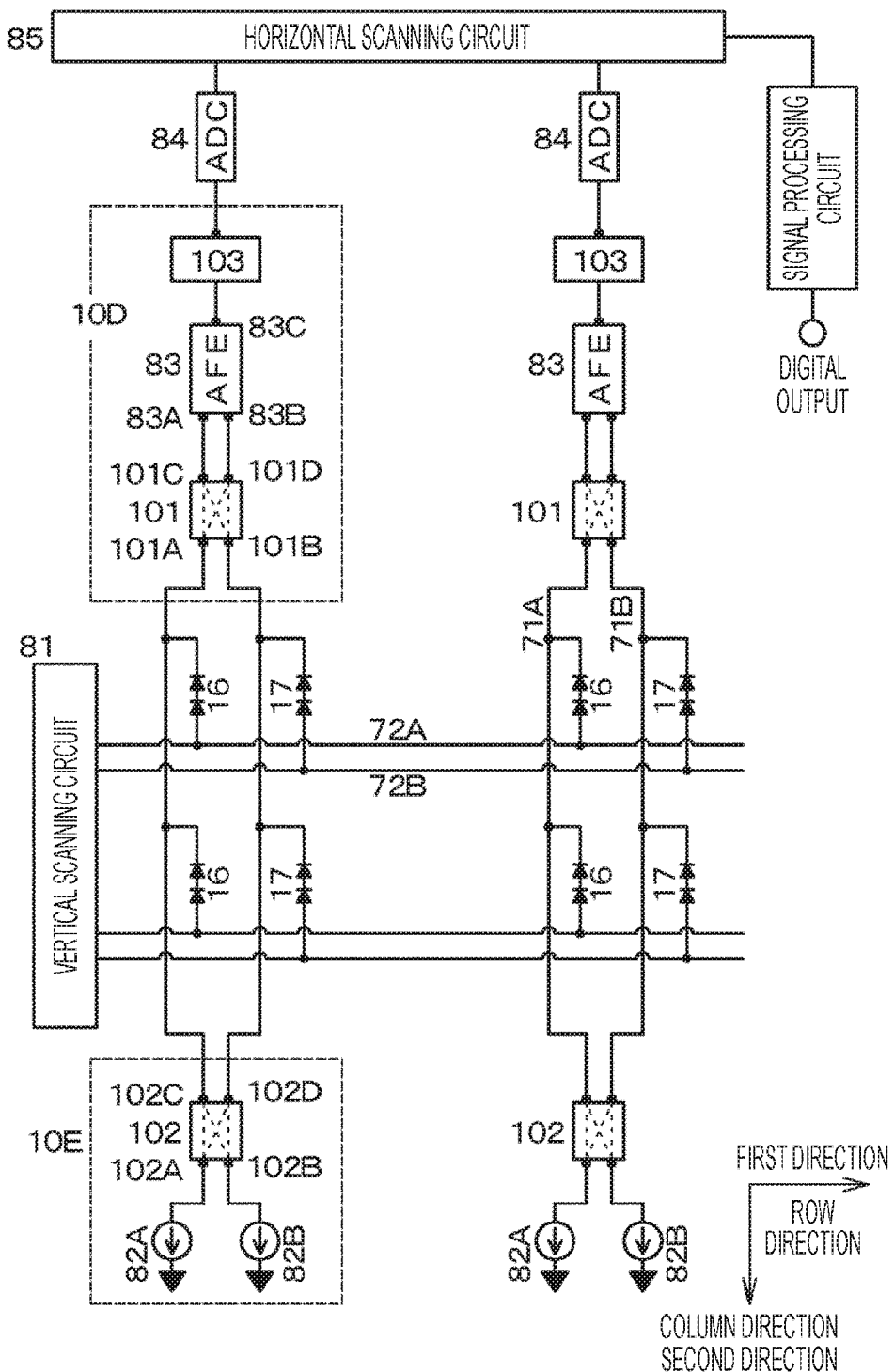
FIG. 16 is an equivalent circuit diagram of an imaging device of Example 9.

Example 9 is a modification of Example 1, and relates to an imaging device according to B of the first embodiment of the present disclosure. FIG. 16 shows an equivalent circuit diagram of an imaging device of Example 9.

In the imaging device of Example 9, a drive circuit 10D further includes a second switch circuit 102, a first current source 82A is connected to a first input end 102A of the second switch circuit 102, instead of a first input end 83A of a differential amplifier 83, a second current source 82B is connected to a second input end 102B of the second switch circuit 102, instead of a second input end 83B of the differential amplifier 83, a first output end 102C of the second switch circuit 102 is connected to a first input end 101A of a first switch circuit 101, a second output end 102D of the second switch circuit 102 is connected to a second input end 101B of the first switch circuit 101, and, in a case where the first input end 102A and the first output end 102C of the second switch circuit 102 are connected, the second input end 102B and the second output end 102D of the second switch circuit 102 are connected, and, in a case where the first input end 102A and the second output end 102D of the second switch circuit 102 are connected, the second input end 102B and the first output end 102C of the second switch circuit 102 are connected.

Further, in the imaging device of Example 9, first temperature detection elements 16 and second temperature detection elements 17 are arranged in a first direction and a second direction different from the first direction in a two-dimensional matrix, and one drive circuit 10D is provided for N (N≥2) first temperature detection elements 16 and N second temperature detection elements 17 occupying one column in the second direction.

In the imaging device of Example 9, the differential amplifier 83 is also included in the analog front end (AFE). An analog-digital conversion circuit (ADC) 84 includes a single-slope analog-to-digital conversion circuit, for example. Further, in the imaging device of Example 8, the first current source 82A and the second current source 82B are disposed at the position farthest from the differential amplifier 83 in the second direction.

Since the operation of the imaging device of Example 9 is substantially similar to the operation of the imaging device of Example 8, detailed explanation of the operation is not made herein. Note that the order of switching of the first switch circuit 101 and the second switch circuit 102 is an example, and may be changed as appropriate. Further, the value of (the switching frequency of the first switch circuit 101)/(the switching frequency of the second switch circuit 102) is set at an integer of 2 or greater, so that the combined time of switching of the first switch circuit 101 and the second switch circuit 102 (the combined time of $\Delta t_1$, $\Delta t_2$, $\Delta t_3$, and $\Delta t_4$) can be equalized, regardless of the signal propagation time. Furthermore, depending on the structure of the analog-digital conversion circuit, an integration capacitor for integrating input signals is provided at the input portion of the analog-digital conversion circuit. In an analog-digital conversion circuit having such a structure, however, it is only necessary to optimize the resolution of the time analog-digital conversion of analog-digital conversion, by appropriately setting the capacitance value of the integration capacitor.

Note that, in Example 9, signal subtraction may be performed with an addition circuit or a subtraction circuit included in the horizontal scanning circuit 85, or the sign of the coefficient may be inverted with a circuit provided in a digital filter circuit included in an analog-digital conversion circuit so that addition and subtraction are performed, as in Example 8. Alternatively, a switch that inverts the polarity of the current flowing from the output of a differential amplifier to an integration capacitor may be added, and this switch is turned on and off so that addition and subtraction are performed, as in Example 8. With these mechanisms, noise cancellation similar to the above can be performed.

Figure 17:
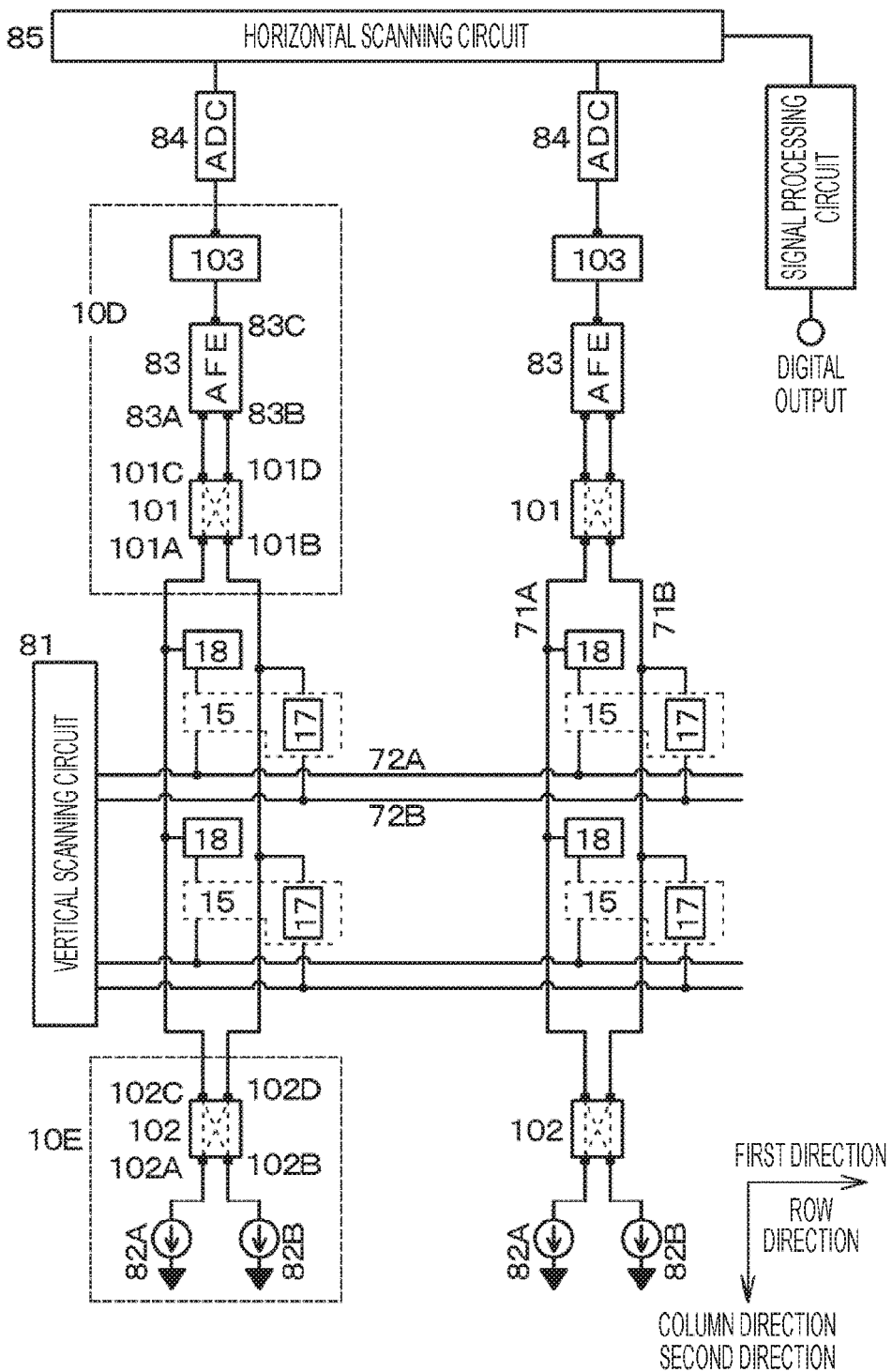
FIG. 17 is an equivalent circuit diagram of a modification of the imaging device of Example 9.

In an equivalent circuit diagram of a modification of Example 9 shown in FIG. 17, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element block 15 of a plurality of (Q) temperature detection element blocks 15, one drive circuit 10D is provided for the first temperature detection elements 16 and the second temperature detection elements 17 occupying one column in the second direction, and each temperature detection element block 15 includes a plurality of (P) first temperature detection elements 16 and one second temperature detection element 17.

In each temperature detection element block 15, the plurality of (P) first temperature detection elements 16 is connected to the same first drive line 72A, and the first signal line 71A connected to each first temperature detection element 16 of the plurality of (P) first temperature detection elements 16 is connected to the first input end 101A of the first switch circuit 101 via the multiplexer circuit 18 provided for the drive circuit 10D. Note that N=P×Q.

Here, in the example shown in FIG. 17, P=4. The four first temperature detection elements 16 constituting a temperature detection element block 15 are only required to be arranged in a 2×2 array in the row direction and the column direction, for example. However, the first temperature detection elements 16 are not necessarily arranged in this manner, and may be arranged in 3×3, 4×4, or the like, for example.

Figure 18:
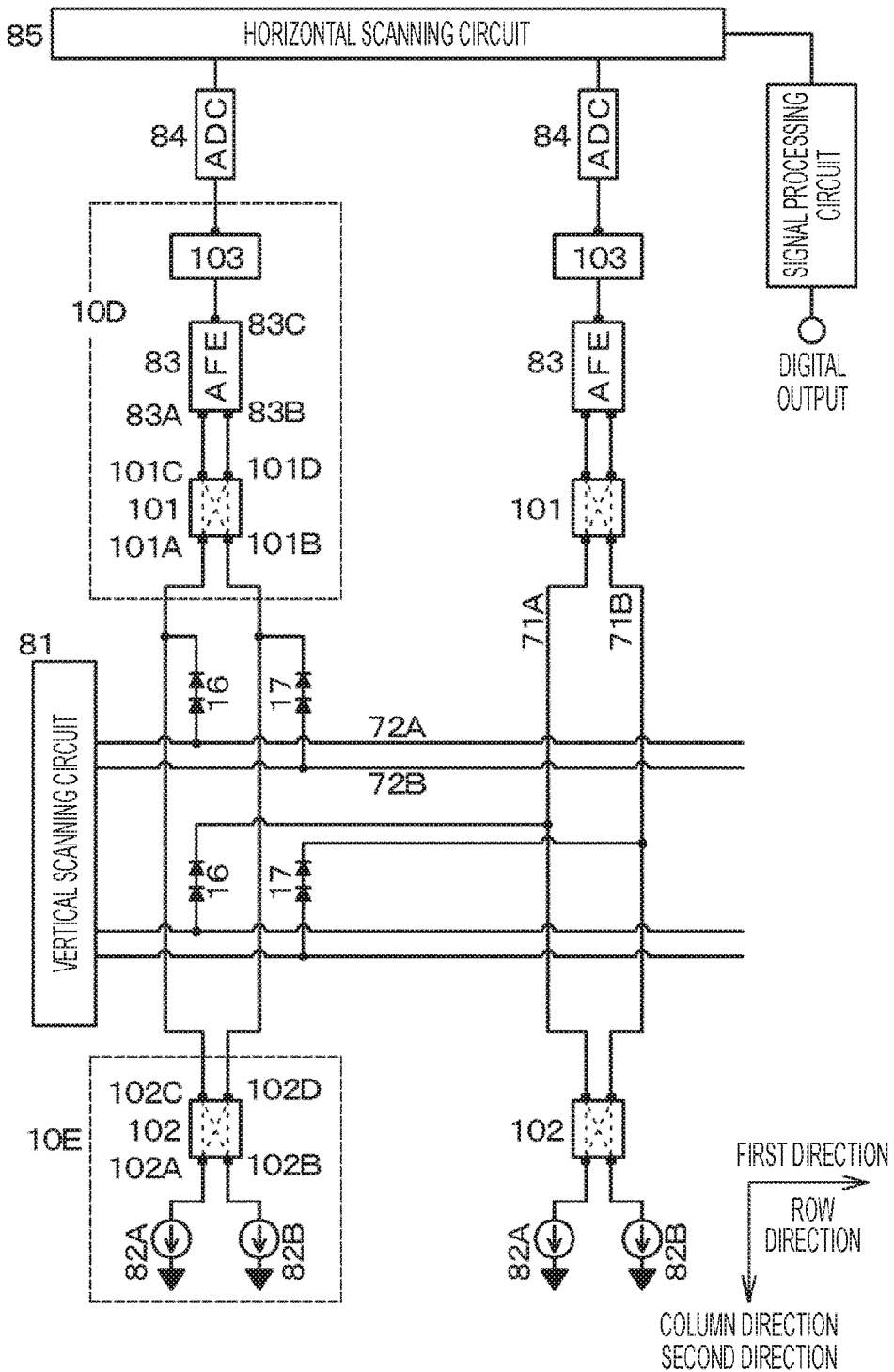
FIG. 18 is an equivalent circuit diagram of another modification of the imaging device of Example 9.

Alternatively, as shown in an equivalent circuit diagram of another modification of Example 9 in FIG. 18, this modification has column-parallel ADC structures, first temperature detection elements 16 and second temperature detection elements 17 are arranged in a first direction and a second direction different from the first direction in a two-dimensional matrix, the first temperature detection elements 16 and the second temperature detection elements 17 occupying one column in the second direction belong to one temperature detection element unit of a plurality of (R, or, specifically, R=2, for example) temperature detection element units 15A and 15B arranged in the second direction, each temperature detection element unit of the plurality of (R) temperature detection element units 15A and 15B is connected to one drive circuit 10D, the first temperature detection elements 16 and the second temperature detection elements 17 occupying each temperature detection element unit 15A or 15B belong to one temperature detection element block 15 of a plurality of (Q, or specifically, Q=N/R) temperature detection element blocks 15, each temperature detection element block 15 includes one or a plurality of (P, or, specifically, P=1, for example) first temperature detection elements 16 and one second temperature detection element 17.

In each temperature detection element block 15, the one or the plurality of (P) first temperature detection elements 16 is connected to the same first drive line 72A, and the first signal line 71A connected to the one or each first temperature detection element 16 of the plurality of (P) first temperature detection elements 16 is connected to the first input end 101A of the first switch circuit 101 in a case where P=1, and is connected to the first input end 101A of the first switch circuit 101 via a multiplexer circuit 18 provided for the drive circuit 10D in a case where P≥2. Note that N=P×Q×R.

Further, the value of P is not necessarily "1", and the value of R is not necessarily "2". As column-parallel ADC structures are adopted as above, the time of integration of signals from the first temperature detection elements 16 per frame can be made longer, and noise can be further reduced.

Alternatively, Example 9 and Example 3 may be combined. Specifically, an imaging device further includes a third element 19 for gain measurement, the third element 19 being connected to a third drive line 72C and a drive circuit 10D via a first signal line 71A, and the output voltage of the third element 19 differs from the output voltage of a second temperature detection element 17.

Figure 19:
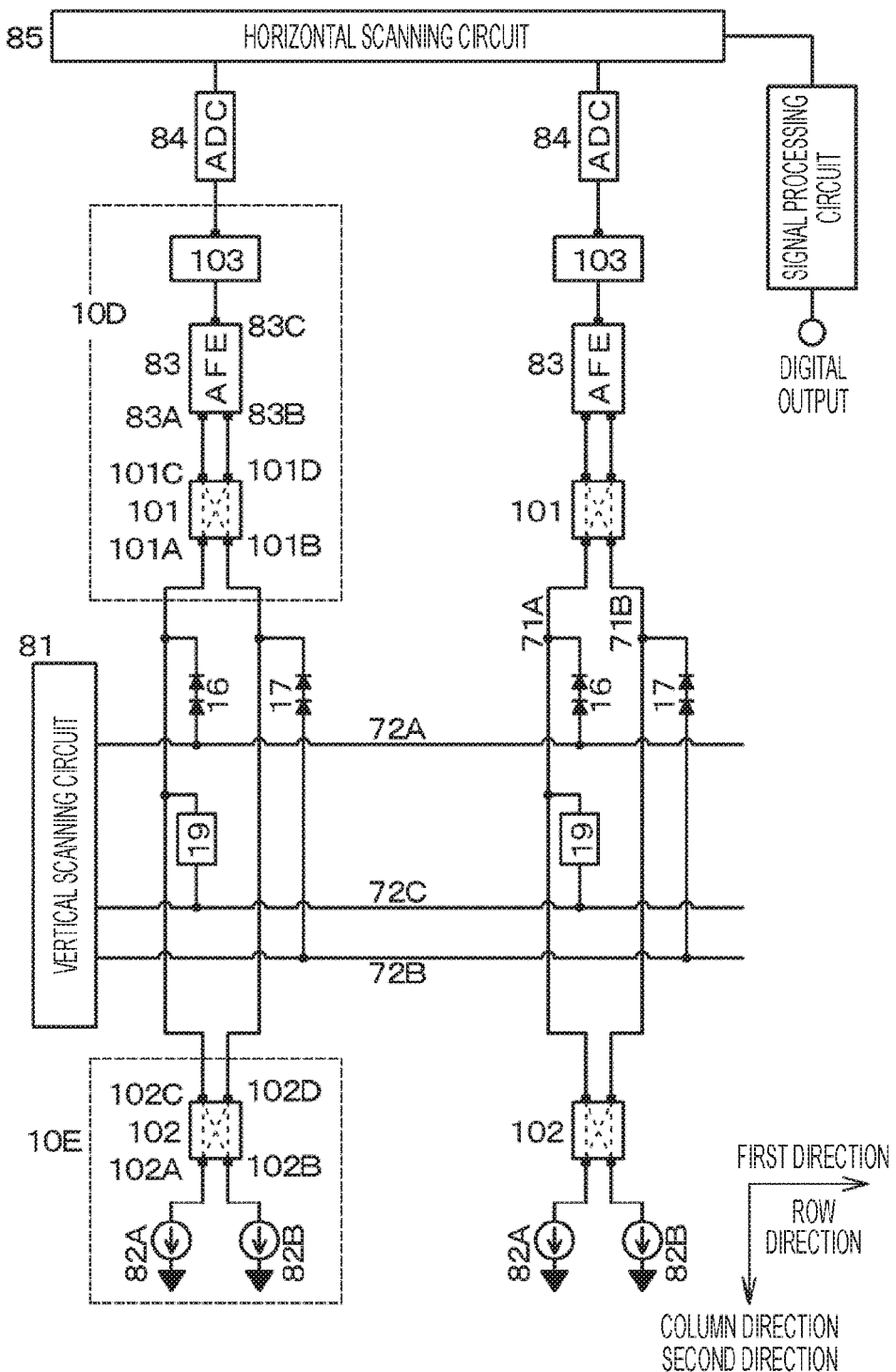
FIG. 19 is an equivalent circuit diagram of yet another modification of the imaging device of Example 9.

FIG. 19 shows an equivalent circuit diagram of such a modification of the imaging device of Example 9, in which the imaging device of Example 9 and the imaging device described in Example 3 are combined.

Example 10

Example 10 relates to an imaging device according to the second embodiment of the present disclosure, and is a configuration in which two signal lines are arranged for each column, and two analog-digital conversion circuits (ADCs) operate concurrently to perform noise cancellation. As two column-parallel ADC structures are adopted for each column in this manner, the time of integration of signals from first temperature detection elements 16 per frame can be made equal to that in a case where correlated double sampling (CDS) processes are not performed, and a decrease in the integration time due to CDS can be prevented. Thus, noise can be reduced.

Figure 20:
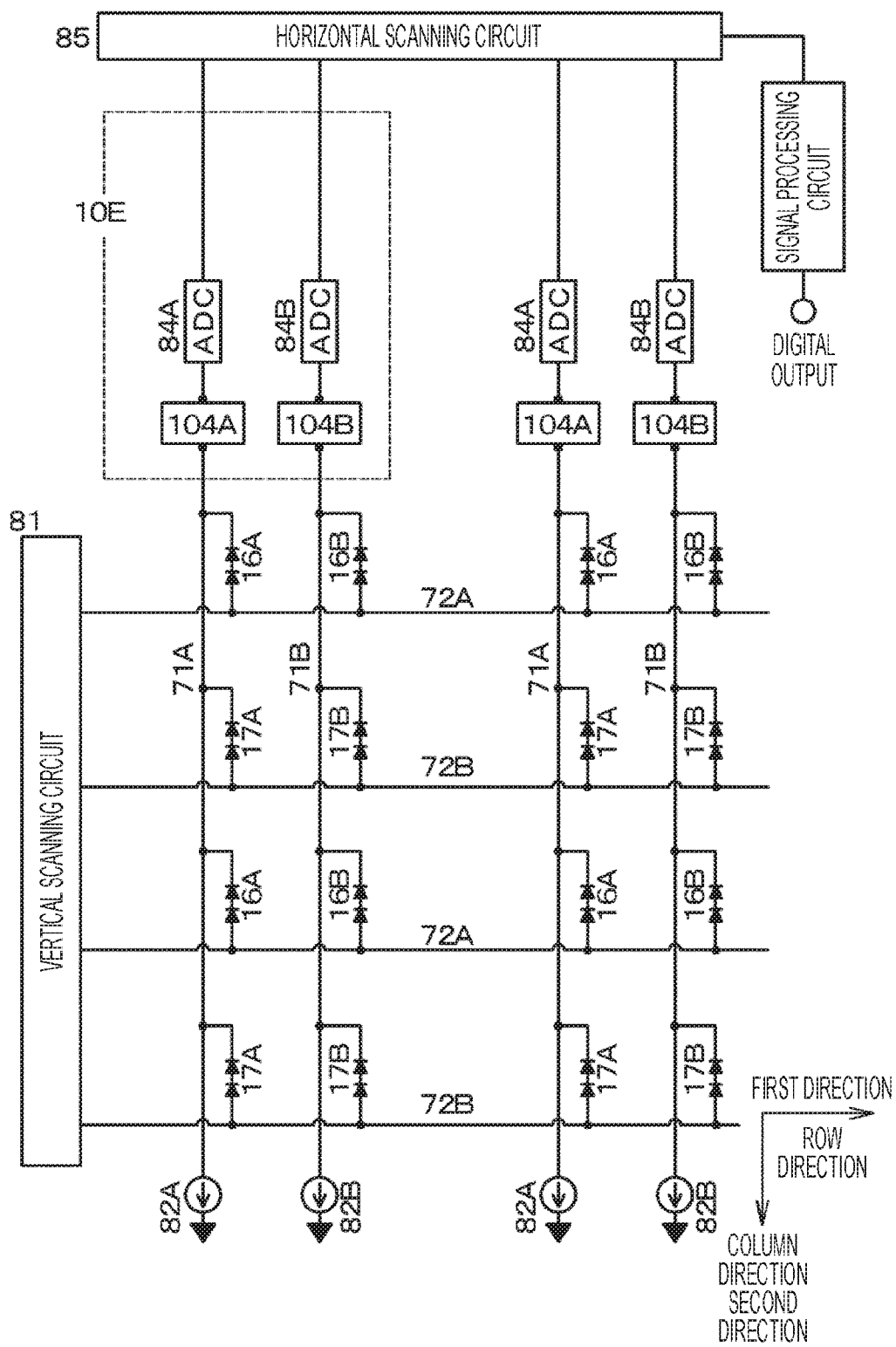
FIG. 20 is an equivalent circuit diagram of an imaging device of Example 10.

As shown in an equivalent circuit diagram in FIG. 20, an imaging device of Example 10 includes a first structural body 20 and a second structural body 40 stacked on the first structural body 20, the second structural body 40 includes a second substrate 41, and drive circuits 10E disposed on the second substrate 41, each drive circuit 10E includes two current sources 82A and 82B, two amplifiers 104A and 104B including single-end amplifiers, and two analog-digital conversion circuits 84A and 84B, the first structural body 20 includes a first substrate 21, and first temperature detection elements 16 that are disposed on the first substrate 21, detect temperature on the basis of infrared rays, and are connected to first drive lines 72A and the drive circuits 10E, and further includes second temperature detection elements 17 for temperature reference, the second temperature detection elements 17 being connected to second drive lines 72B and the drive circuits 10E, the first signal lines 71A to which first temperature detection elements 16 and second temperature detection elements 17 are connected are connected to the first current sources 82A, the first amplifiers 104A, and the first analog-digital conversion circuits 84A, and the second signal lines 71B to which first temperature detection elements 16 and second temperature detection elements 17 are connected are connected to the second current sources 82B, the second amplifiers 104B, and the second analog-digital conversion circuits 84B.

Specifically, one end of a first signal line 71A to which first temperature detection elements 16 and second temperature detection elements 17 are connected is connected to a first current source 82A, and the other end of the first signal line 71A is connected to a first amplifier 104A and a first analog-digital conversion circuit 84A. Likewise, one end of a second signal line 71B to which first temperature detection elements 16 and second temperature detection elements 17 are connected is connected to a second current source 82B, and the other end of the second signal line 71B is connected to a second amplifier 104B and a second analog-digital conversion circuit 84B. Output units of the analog-digital conversion circuits 84A and 84B are connected to a horizontal scanning circuit 85. The horizontal scanning circuit 85 includes a subtraction circuit (not shown). The first drive lines 72A, the second drive lines 72B, the first signal lines 71A, and the second signal lines 71B may be formed across the first substrate and the second substrate, depending on the configuration and the structure of the imaging device.

In the imaging device of Example 10, when the first temperature detection element 16A connected to a first drive line 72A and a first signal line 71A is selected, the second temperature detection element 17B connected to the corresponding second drive line 72B and the corresponding second signal line 71B is selected. This period is set as $\Delta t_1$. Further, a signal obtained by the first temperature detection element 16A is represented by $Sg_{A1}$, and a signal obtained by the second temperature detection element 17B is represented by $Sg_{B1}$. On the other hand, when the first temperature detection element 16B connected to a first drive line 72B and a second signal line 71B is selected, the second temperature detection element 17A connected to the corresponding second drive line 72B and the corresponding first signal line 71A is selected. This period is set as $\Delta t_2$. Further, a signal obtained by the first temperature detection element 16B is represented by $Sg_{A2}$, and a signal obtained by the second temperature detection element 17A is represented by $Sg_{B2}$.

In the period $\Delta t_1$, the output $Sg_{A1}$ from the first temperature detection element 16A and the noise $Nz(AP)_{A1}$ from the first current source 82A are input to the first amplifier 104A, and to the subtraction circuit of the horizontal scanning circuit 85 via the first analog-digital conversion circuit 84A. Meanwhile, the output $Sg_{B1}$ from the second temperature detection element 17B and the noise $Nz(AP)_{B1}$ from the second current source 82B are input to the second amplifier 104B, and to the subtraction circuit of the horizontal scanning circuit 85 via the second analog-digital conversion circuit 84B. Here, the signal A to be input to the subtraction circuit is as follows:

$$\text{signal } A = Sg_{A1} - Sg_{B1} + Nz(AP)_{A1} - Nz(AP)_{B1}$$

Likewise, in the period $\Delta t_2$, the output $Sg_{B2}$ from the second temperature detection element 17A and the noise $Nz(AP)_{A2}$ from the first current source 82A are input to the first amplifier 104A, and to the subtraction circuit of the horizontal scanning circuit 85 via the first analog-digital conversion circuit 84A. Meanwhile, the output $Sg_{A2}$ from the first temperature detection element 16B and the noise $Nz(AP)_{B2}$ from the second current source 82B are input to the second amplifier 104B, and to the subtraction circuit of the horizontal scanning circuit 85 via the second analog-digital conversion circuit 84B. Here, the signal B to be input to the subtraction circuit is as follows:

$$\text{signal } B = Sg_{B2} - Sg_{A2} + Nz(AP)_{A2} - Nz(AP)B_2$$

Further, in the subtraction circuit of the horizontal scanning circuit 85, the signal B is subtracted from the signal A, and the resultant signal C is sent to the signal processing circuit.

$$\text{Signal } C = Sg_{A1} - Sg_{B1} + Nz(AP)_{A1} - Nz(AP)_{B1} - \{Sg_{B2} - Sg_{A2} + Nz(AP)_{A2} - Nz(AP)_{B2}\} = Sg_{A1} + Sg_{A2} - (Sg_{B1} + Sg_{B2}) + Nz(AP)_{A1} - Nz(AP)_{A2} - Nz(AP)_{B1} + Nz(AP)_{B2}$$

Here, each noise signal appearing in the second and third terms of the above equation is a noise signal having power dominant to components with lower time frequency. Accordingly, the second and third terms of the above equation are the differences obtained by successively collecting the noise in which components having lower time frequency are dominant twice from the same noise source, and may be regarded as almost zero. Therefore, the first term of the above equation is the target signal in which noise has been cancelled by subtracting the output of the second temperature detection element that detects temperature on the basis of infrared rays from the output of the first temperature detection element for temperature reference.

In a conventional correlated double sampling (CDS) process, one of the first temperature detection element and the second temperature detection element is activated during a P-phase process, and the other one of the first temperature detection element and the second temperature detection element is activated during a D-phase process. Therefore, the temperature detection time of the first temperature detection element is half the CDS processing time at a maximum. In the imaging device of Example 10, on the other hand, two column-parallel ADC structures are adopted for each column as described above, and accordingly, the operation time can be extended to a time similar to the time required for reading one row. Furthermore, noise from the first current source 82A and the second current source 82B can be canceled, and, although not shown in the above equation, noise from the first amplifier 104A and the second amplifier 104B can also be canceled.

Figure 21:
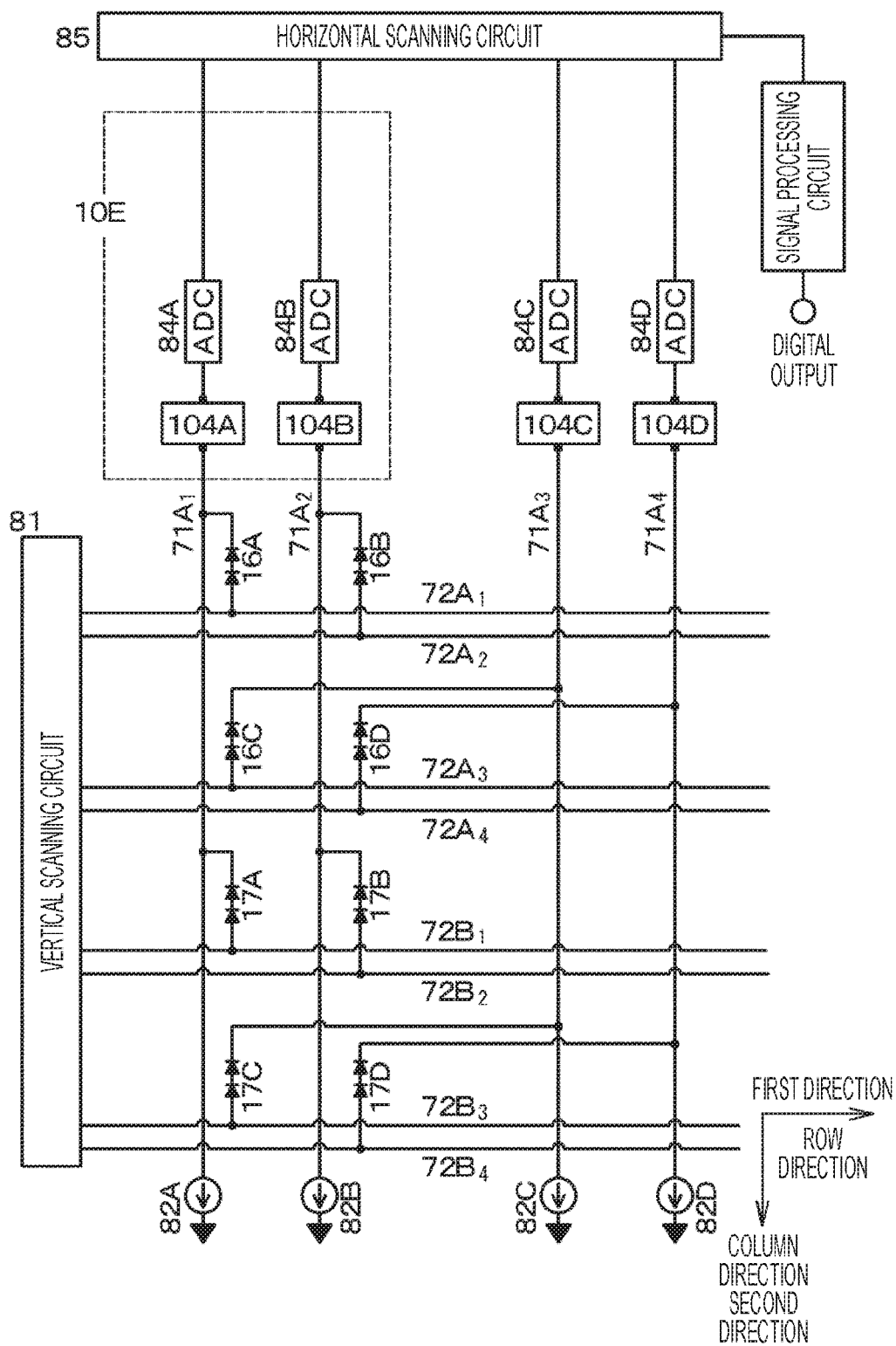
FIG. 21 is an equivalent circuit diagram of a modification of the imaging device of Example 10.

Note that, as shown in an equivalent circuit diagram in FIG. 21, the imaging device of Example 10 may have a configuration in which four signal lines are provided for each column, and four analog-digital conversion circuits (ADCs) operate concurrently to cancel noise. As four column-parallel ADC structures are adopted for each column as above, the time of integration of signals from the first temperature detection elements per frame can be made even longer, and noise can be further reduced.

As shown in the equivalent circuit diagram in FIG. 21, a modification of the imaging device of Example 10 includes a first structural body 20, and a second structural body 40 stacked on the first structural body 20, the second structural body 40 includes a second substrate 41, and a drive circuit 10E disposed on the second substrate 41, the drive circuit 10E includes four current sources 82A, 82B, 82C, and 82D, four amplifiers 104A, 104B, 104C, and 104D including single-end amplifiers, and four analog-digital conversion circuits 84A, 84B, 84C, and 84D, the first structural body 20 includes a first substrate 21, a first first temperature detection element 16A, a second first temperature detection element 16B, a third first temperature detection element 16C, and a fourth first temperature detection element 16D that are disposed on the first substrate 21 and detect temperature on the basis of infrared rays, the first first temperature detection element 16A being connected to a first first drive line $72A_1$ and the drive circuit 10E, the second first temperature detection element 16B being connected to a second first drive line $72A_2$ and the drive circuit 10E, the third first temperature detection element 16C being connected to a third first drive line $72A_3$ and the drive circuit 10E, the fourth first temperature detection elements 16D being connected to a fourth first drive line $72A_4$ and the drive circuit 10E, the first structural body 20 further includes a first second temperature detection element 17A for temperature reference, a second second temperature detection element 17B for temperature reference, a third second temperature detection element 17C for temperature reference, and a fourth second temperature detection element 17D for temperature reference, the first second temperature detection element 17A being connected to a first second drive line 72B131 and the drive circuit 10E, the second second temperature detection element 17B being connected to a second second drive line $72B_2$ and the drive circuit 10E, the third second temperature detection element 17C being connected to a third second drive line $72B_3$ and the drive circuit 10E, the fourth second temperature detection element 17D being connected to a fourth second drive line $72B_4$ and the drive circuit 10E, the first first signal line $71A_1$ to which the first first temperature detection element 16A and the first second temperature detection element 17A are connected is connected to the first current source 82A, the first amplifier 104A, and the first analog-digital conversion circuit 84A, the second first signal line $71A_2$ to which the second first temperature detection element 16B and the second second temperature detection element 17B are connected is connected to the second current source 82B, the second amplifier 104B, and the second analog-digital conversion circuit 84B, the third first signal line $71A_3$ to which the third first temperature detection element 16C and the third second temperature detection element 17C are connected is connected to the third current source 82C, the third amplifier 104C, and the third analog-digital conversion circuit 84C, and the fourth first signal line $71A_4$ to which the fourth first temperature detection element 16D and the fourth second temperature detection element 17D are connected is connected to the fourth current source 82D, the fourth amplifier 104D, and the fourth analog-digital conversion circuit 84D.

Specifically, one end of the first first signal line $71A_1$ to which the first first temperature detection element 16A and the first second temperature detection element 17A are connected is connected to the first current source 82A, and the other end of the first first signal line $71A_1$ is connected to the first amplifier 104A and the first analog-digital conversion circuit 84A. One end of the second first signal line $71A_2$ to which the second first temperature detection element 16B and the second second temperature detection element 17B are connected is connected to the second current source 82B, and the other end of the second first signal line $71A_2$ is connected to the second amplifier 104B and the second analog-digital conversion circuit 84B. One end of the third first signal line $71A_3$ to which the third first temperature detection element 16C and the third second temperature detection element 17C are connected is connected to the third current source 82C, and the other end of the third first signal line $71A_3$ is connected to the third amplifier 104C and the third analog-digital conversion circuit 84C. One end of the fourth first signal line $71A_4$ to which the fourth first temperature detection element 16D and the fourth second temperature detection element 17D are connected is connected to the fourth current source 82D, and the other end of the fourth first signal line $71A_4$ is connected to the fourth amplifier 104D and the fourth analog-digital conversion circuit 84D. Output units of the analog-digital conversion circuits 84A, 84B, 84C, and 84D are connected to a horizontal scanning circuit 85. The horizontal scanning circuit 85 includes a subtraction circuit (not shown). Various drive lines and signal lines may be formed across the first substrate and the second substrate, depending on the configuration and the structure of the imaging device.

Then, the period during which the first first temperature detection element 16A, the fourth first temperature detection element 16D, the second second temperature detection element 17B, and the third second temperature detection element 17C are selected is set as $\Delta t_1$. Likewise, the period during which the second first temperature detection element 16B, the third first temperature detection element 16C, the first second temperature detection element 17A, and the fourth second temperature detection element 17D are selected is set as $\Delta t_2$. Further, a signal obtained by the first first temperature detection element 16A is represented by $Sg_{A1\text{-}1}$, a signal obtained by the fourth first temperature detection element 16D is represented by $Sg_{A1\text{-}4}$, a signal obtained by the second first temperature detection element 17B is represented by $Sg_{B1\text{-}2}$, a signal obtained by the third first temperature detection element 17C is represented by $Sg_{B1\text{-}3}$, a signal obtained by the second first temperature detection element 16B is represented by $Sg_{A2\text{-}2}$, a signal obtained by the third first temperature detection element 16C is represented by $Sg_{A2\text{-}3}$, a signal obtained by the first first temperature detection element 17A is represented by $Sg_{B2\text{-}1}$, and a signal obtained by the fourth first temperature detection element 17D is represented by $Sg_{B2\text{-}4}$.

In the period $\Delta t_1$, the output $Sg_{A1\text{-}1}$ from the first first temperature detection element 16A and the noise $Nz(AP)_{A1\text{-}1}$ from the first current source 82A are input as a signal $A_{A1\text{-}1}$ to the first amplifier 104A, and to the subtraction circuit of the horizontal scanning circuit 85 via the first first analog-digital conversion circuit 84A.

Signal $A_{A1\text{-}1} = Sg_{A1\text{-}1} + Nz(AP)_{A1\text{-}1}$

Also, in the period $\Delta t_1$, the output $Sg_{A1\text{-}4}$ from the fourth first temperature detection element 16D and the noise $Nz(AP)_{A1\text{-}4}$ from the fourth current source 82D are input as a signal $A_{A1\text{-}4}$ to the fourth amplifier 104D, and to the subtraction circuit of the horizontal scanning circuit 85 via the fourth first analog-digital conversion circuit 84D.

Signal $A_{A1\text{-}4} = Sg_{A1\text{-}4} + Nz(AP)_{A1\text{-}4}$

Further, in the period $\Delta t_1$, the output $Sg_{B1\text{-}2}$ from the second first temperature detection element 17B and the noise $Nz(AP)_{A1\text{-}2}$ from the second current source 82B are input as a signal $B_{B1\text{-}2}$ to the second amplifier 104B, and to the subtraction circuit of the horizontal scanning circuit 85 via the second first analog-digital conversion circuit 84B.

Signal $B_{B1\text{-}2} = Sg_{B1\text{-}2} + Nz(AP)_{A1\text{-}2}$

Also, in the period $\Delta t_1$, the output $Sg_{B1\text{-}3}$ from the third first temperature detection element 17C and the noise $Nz(AP)_{A1\text{-}3}$ from the third current source 82C are input as a signal $B_{B1\text{-}3}$ to the third amplifier 104C, and to the subtraction circuit of the horizontal scanning circuit 85 via the third first analog-digital conversion circuit 84C.

Signal $B_{B1\text{-}3} = Sg_{B1\text{-}3} + Nz(AP)_{A1\text{-}3}$

Next, in the period $\Delta t_2$, the output $Sg_{A2\text{-}2}$ from the second first temperature detection element 16B and the noise $Nz(AP)_{A2\text{-}2}$ from the second current source 82B are input as a signal $A_{A2\text{-}2}$ to the second amplifier 104B, and to the subtraction circuit of the horizontal scanning circuit 85 via the second first analog-digital conversion circuit 84B.

Signal $A_{A2\text{-}2} = Sg_{A2\text{-}2} + Nz(AP)_{A2\text{-}2}$

Also, in the period $\Delta t_2$, the output $Sg_{A2\text{-}3}$ from the third first temperature detection element 16C and the noise $Nz(AP)_{A2\text{-}3}$ from the third current source 82C are input as a signal $A_{A2\text{-}3}$ to the third amplifier 104C, and to the subtraction circuit of the horizontal scanning circuit 85 via the third first analog-digital conversion circuit 84C.

Signal $A_{A2\text{-}3} = Sg_{A2\text{-}3} + Nz(AP)_{A2\text{-}3}$

Further, in the period $\Delta t_2$, the output $Sg_{B2\text{-}1}$ from the first second temperature detection element 17A and the noise $Nz(AP)_{B2\text{-}1}$ from the first current source 82A are input as a signal $B_{B2\text{-}1}$ to the first amplifier 104A, and to the subtraction circuit of the horizontal scanning circuit 85 via the first first analog-digital conversion circuit 84A.

Signal $B_{B2\text{-}1} = Sg_{B2\text{-}1} + Nz(AP)_{A2\text{-}1}$

Also, in the period $\Delta t_2$, the output $Sg_{B2\text{-}4}$ from the fourth second temperature detection element 17D and the noise $Nz(AP)_{B2\text{-}4}$ from the fourth current source 82D are input as a signal $B_{B2\text{-}4}$ to the fourth amplifier 104D, and to the subtraction circuit of the horizontal scanning circuit 85 via the fourth first analog-digital conversion circuit 84D.

Signal $B_{B2\text{-}4} = Sg_{B2\text{-}4} + Nz(AP)_{A2\text{-}4}$

Further, in the subtraction circuit of the horizontal scanning circuit 85, the signals B are subtracted from the signals A, and the resultant signal C is sent to the signal processing circuit.

Signal $C$ = signal $A_{A1\text{-}1}$ + signal $A_{A2\text{-}2}$ + signal $A_{A2\text{-}3}$ + signal $A_{A1\text{-}4}$ − (signal $B_{B2\text{-}1}$ + signal $B_{B1\text{-}2}$ + signal $B_{B1\text{-}3}$ + signal $B_{B2\text{-}4}$) = $Sg_{A1\text{-}1} - Sg_{B2\text{-}1} + Sg_{A2\text{-}2} - Sg_{B1\text{-}2} + Sg_{A2\text{-}3} - Sg_{B1\text{-}3} + Sg_{A1\text{-}4} - Sg_{B2\text{-}4} + Nz(AP)_{A1\text{-}1} - Nz(AP)_{A2\text{-}1} + Nz(AP)_{A2\text{-}2} - Nz(AP)_{A1\text{-}2} + Nz(AP)_{A2\text{-}3} - Nz(AP)_{A1\text{-}3} + Nz(AP)_{A1\text{-}4} - Nz(AP)_{A2\text{-}4}$ Here, each noise signal appearing in the fifth through eighth terms of the above equation is a noise signal having power dominant to components with lower time frequency. Accordingly, the fifth through eighth terms of the above equation are the differences obtained by successively collecting the noise in which components having lower time frequency are dominant twice from the same noise source, and may be regarded as almost zero. Therefore, the first through fourth terms of the above equation are the target signal in which noise has been cancelled by subtracting the output of the second temperature detection element that detects temperature on the basis of infrared rays from the output of the first temperature detection element for temperature reference.

As described above, in a conventional correlated double sampling (CDS) process, one of a first temperature detection element and a second temperature detection element is activated during a P-phase process, and the other one of the first temperature detection element and the second temperature detection element is activated during a D-phase process. Therefore, the temperature detection time of the first temperature detection element is half the CDS processing time at a maximum. In the modification of the imaging device of Example 10 shown in FIG. 21, however, four signal lines are activated concurrently for two columns of temperature detection elements as described above. Thus, the operation time can be extended to a time twice longer than the time required for reading one row. Furthermore, noise from the current sources 82A, 82B, 82C, and 82D, and the amplifiers 104A, 104B, 104C, and 104D can also be canceled.

Note that the reading sequences associated in the description with reference to FIGS. 20 and 21 are examples, and may be changed as appropriate while the noise reduction effect is maintained. Also, in Example 10, butterfly switches may be added to the connecting portions between the current sources and the signal lines, and/or the connecting portions between the signal lines and the amplifiers, and the switches may be turned on and off for a desired number of frames of one or more images. The amplifiers and the current sources are analog circuits that emit noise in which components having lower time frequency are dominant. The switches are turned on and off, so that noise emitted from the same amplifier or the same current source can be scattered in different coordinates for each frame. Then, unlike noise in a fixed pattern, noise scattered in different coordinates is not only visually inconspicuous, but also increases the noise reduction effect in a case where a noise reduction circuit involving digital signal processing is added to a later stage.

Example 11

In Example 11, a first temperature detection element 16 used in the imaging devices explained in Examples 1 through 10 is described. Note that an imaging device of Example 11 is an imaging device having a face-to-back structure as shown in FIG. 2. Note that, in the description below, the drive circuits 10A, 10B, 10C, 10D, and 10E are generically called "drive circuits 10". Further, a partial cross-sectional view of the imaging device described below is a schematic partial cross-sectional view taken along an arrow B-B shown in FIG. 3.

In the imaging devices explained in Examples 1 through 10, a partition wall 23 is formed in the portion of the first substrate 21 located between a first temperature detection element 16 and a first temperature detection element 16, and the bottom portion of the partition wall 23 is joined to a coating layer 43. Here, the bottom portion of the partition wall 23 and the coating layer 43 are joined by a method of forming a silicon-oxygen covalent bond through dehydration condensation. The sidewalls 24 of the partition wall 23 includes at least one material layer selected from the group including an insulating material layer, a metal material layer, an alloy material layer, and a carbon material layer. Specifically, in Example 11, the sidewalls 24 of the partition wall 23 include an insulating material layer such as a $SiO_2$ layer. Further, the inside of the partition wall 23 surrounded by the sidewalls 24 of the partition wall 23 includes part of the first substrate 21, or specifically, a silicon layer 22. The exposed surface of the coating layer 43 exposed to voids 50 includes at least one material layer selected from the group including an insulating material layer, a metal material layer, an alloy material layer, and a carbon material layer. Specifically, in Example 11, the exposed surface of the coating layer 43 exposed to the voids 50 includes an insulating material layer such as a $SiO_2$ layer, and an interlayer insulating layer (not specifically shown) that forms the coating layer 43 and includes SiN or the like is formed under the $SiO_2$ layer. Note that, if the sidewalls 24 of the partition wall 23 include a material that reflects infrared rays, incident infrared rays can be effectively reflected. Further, the voids 50 are formed between the first temperature detection elements 16 and the coating layer 43. As the first substrate 21 and the second substrate 41 are stacked, and the voids 50 are formed between the first temperature detection elements 16 and the coating layer 43 as described above, voids can include high precision in the first temperature detection element 16.

In Example 11, the first temperature detection element 16 includes a plurality (four in the example shown in the drawing) of pn junction diodes 30 connected in series via wiring lines 31, but does not necessarily have this configuration. The first temperature detection element 16 may include an element having a known structure and configuration, such as a resistance bolometer element, a thermoelectric conversion element, a thermopile element, a pyroelectric element, or a ferroelectric element. A pn junction diode has a known configuration and structure. The first temperature detection element 16 is formed by the so-called MEMS technology, as will be described later. The first temperature detection element 16 is disposed on the infrared incident side of the first substrate 21 (a second surface 21B of the first substrate 21).

The first temperature detection element 16 (specifically, the pn junction diodes 30) is formed on a diaphragm portion (an aerial portion, or an aerial thin layer portion) 25A including an insulating material layer including $SiO_2$. Further, an insulating material layer 25B including $SiO_2$ is formed on the top surface of the partition wall 23. The diaphragm portion 25A and the insulating material layer 25B are integrally formed via a first stud portion 25C (a support leg or an elongated beam, the similar applies to the description below) and a second stud portion 25D that correspond to extension portions of the diaphragm portion 25A and the insulating material layer 25B. The void 50 is located under the diaphragm portion 25A, the first stud portion 25C, and the second stud portion 25D.

One end (the pn junction diode 30 located at one end of the plurality of pn junction diodes 30) of the first temperature detection element 16 is connected to a first signal line 71A disposed on the insulating material layer 25B formed on the partition wall 23, via the wiring lines 31 formed on the diaphragm portion 25A and the second stud portion 25D. Meanwhile, the other end (the pn junction diode 30 located at the other end of the plurality of pn junction diodes 30) of the first temperature detection element 16 is connected to a first drive line 72A disposed above the partition wall 23, via the wiring lines 31 formed on the diaphragm portion 25A and the first stud portion 25C, and further, via the contact holes 75. The diaphragm portion 25A, the first stud portion 25C, the second stud portion 25D, the pn junction diodes 30, the wiring lines 31, the first signal line 71A, and the first drive line 72A are covered with an insulating film 26 including $SiO_2$.

The first temperature detection element 16 (specifically, the pn junction diodes 30) can be formed by ion implantation of n-type impurities and p-type impurities into a silicon layer, for example. The number of first temperature detection elements 16 is 640×480 (VGA), for example. The first direction and the second direction are orthogonal to each other. All or part of the first substrate 21 includes a SOI substrate, and the second structural body 40 includes the second substrate 41 including a silicon semiconductor substrate. The wiring lines 31, the first signal line 71A, the first drive line 72A, the connecting hole 74, and a contact hole 75 include an aluminum alloy, for example.

An infrared absorption layer 61 including an aluminum thin film is formed on the infrared incident side (the second surface 21B of the first substrate 21) of the first temperature detection element 16, and an infrared reflection layer 62 including a copper thin film is formed in the regions of the coating layer 43 located at the bottom portions of the voids 50. In the example shown in the drawings, the infrared reflection layer 62 is formed on part of the coating layer 43 located at the bottom portions of the voids 50. Meanwhile, the infrared absorption layer 61 is formed on the first temperature detection element 16. Specifically, on the insulating film 26, the infrared absorption layer 61 is formed so as to be partially in contact with the insulating film 26 and be partially at a distance from the insulating film 26 (a space being formed in between). The infrared reflection layer 62 is formed on the top surface of the coating layer 43. Further, where the wavelength of infrared rays to be absorbed by the infrared absorption layer 61 is represented by $\lambda_{IR}$, the optical distance $L_0$ between the infrared absorption layer 61 and the infrared reflection layer 62 satisfies the conditions below:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4$$

Specifically, in Example 11, the optical distance $L_0$ satisfies $L_0 = \lambda_{IR}/4$ The value of $\lambda_{IR}$ is 8 μm to 14 μm. Although the value is limited to any particular value, but $\lambda_{IR} = 10$ μm in Example 11. The wing-shaped infrared absorption layer 61 may be partially connected between adjacent first temperature detection elements 16.

Each first drive line 72A is connected to the vertical scanning circuit 81. Then, when the imaging device is in operation, one first drive line 72A is selected, under the control of the vertical scanning circuit 81. Meanwhile, a constant current is applied to all the first signal lines 71A from the first current source 82A. In the selected first temperature detection element 16, the temperature changes depending on incident infrared rays, and this temperature change causes a change in the electrical resistance value of the first temperature detection element 16 (specifically, the pn junction diodes 30). As a result, a change is caused in the voltage appearing on each first signal line 71A. Each first signal line 71A is connected to the horizontal scanning circuit 85 via an analog front end (AFE) and an analog-digital conversion circuit (ADC) 84, and the voltage at each first signal line 71A is input to one input portion of the differential amplifier 83 that forms the analog front end (AFE). Meanwhile, the voltage at each second signal line 71B is input to the other input portion of the differential amplifier 83. In the differential amplifier 83, the output of the first temperature detection element 16 is amplified. Further, after a predetermined time has elapsed, the value of integral of voltage differences is sent from the differential amplifier 83 to a sample hold circuit (not shown), for example, and the analog value held in the sample hold circuit is output to the analog-digital conversion circuit (ADC) 84. The value of integral of voltage differences is then converted into a digital value at the analog-digital conversion circuit 84, and is sent to the horizontal scanning circuit 85. The digital value is then sequentially output to the signal processing circuit for each first temperature detection element by operation of the horizontal scanning circuit 85, and is eventually output as a digital output.

In the description below, an outline of a method for manufacturing the imaging device of Example 11, or particularly, a method for manufacturing the first structural body 20, is described with reference to FIGS. 41A, 41B, 41C, 41D, 42A, 42B, 42C, 43A, 43B, 44A, and 44B, which are schematic partial end views of a SOI substrate and the like.

[Process 1100]

A SOI substrate 90 that has a first silicon layer 91 formed on a surface and a $SiO_2$ layer 92 formed under the first silicon layer 91 is prepared. The portion of the silicon semiconductor substrate that forms the SOI substrate 90 and is located under the $SiO_2$ layer 92 is referred to as the "second silicon layer 93" for convenience sake. First, etching is then performed on the portion of the second silicon layer 93 of the SOI substrate 90 in which the sidewalls 24 of the partition walls 23 are to be formed, to form groove portions, and the groove portions are filled with the material forming the sidewalls 24 (see FIG. 41A). After that, patterning is performed on the first silicon layer 91 on the surface of the SOI substrate 90, to leave the regions of the first silicon layer 91 in which the pn junction diodes 30 are to be formed. The pn junction diodes 30 are then formed on the first silicon layer 91, by a known technique (see FIG. 41B).

[Process 1110]

Figure 41A:
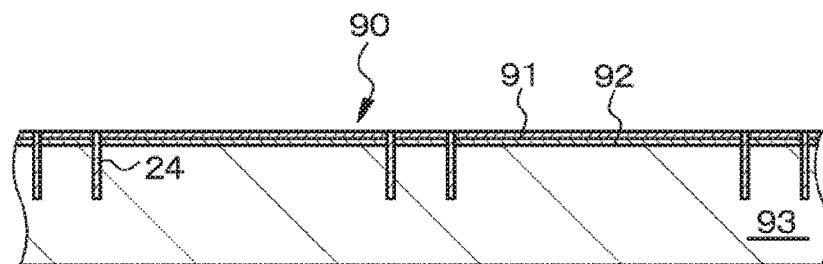
FIGS. 41A, 41B, 41C, and 41D are schematic partial end views of an SOI substrate and the like for explaining a method for manufacturing the imaging device of Example 11.
Figure 41B:
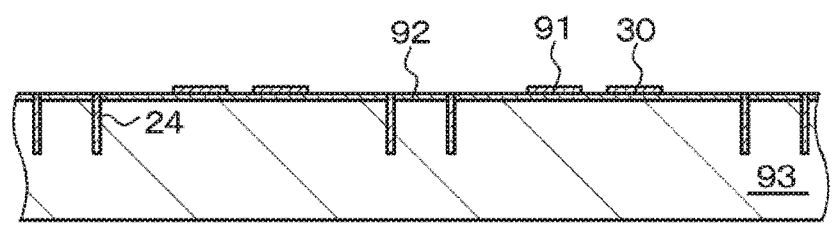
Figure 41C:
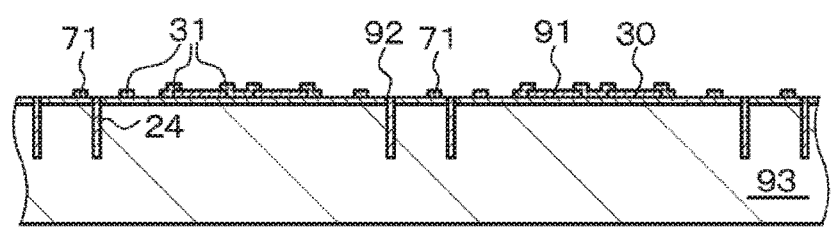
Figure 41D:
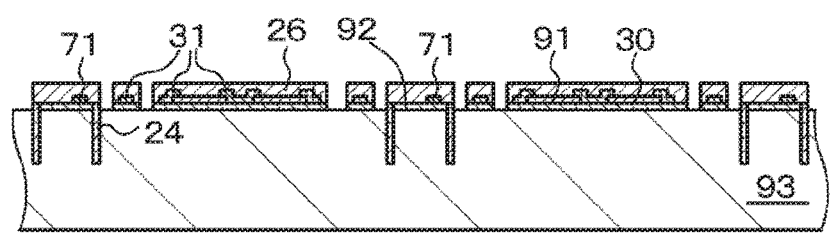

After that, by a known technique, the wiring lines 31 and the first signal lines 71A are formed on the $SiO_2$ layer 92 and part of the pn junction diodes 30 (see FIG. 41C). Next, the insulating film 26 including $SiO_2$, the connecting holes 74, the contact holes 75, and the first drive lines 72A are formed on the entire surface, and patterning is then performed on the insulating film 26 (see FIG. 41D). However, the connecting holes 74, the contact holes 75, and the first drive lines 72A are not shown in FIG. 41D and the drawings that follow.

[Process 1120]

Figure 42A:
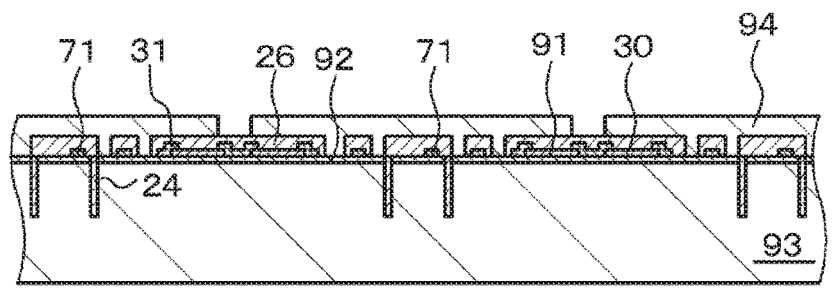
FIGS. 42A, 42B, and 42C are schematic partial end views of an SOI substrate and the like for explaining the method for manufacturing the imaging device of Example 11, continued from FIG. 41D.
Figure 42B:
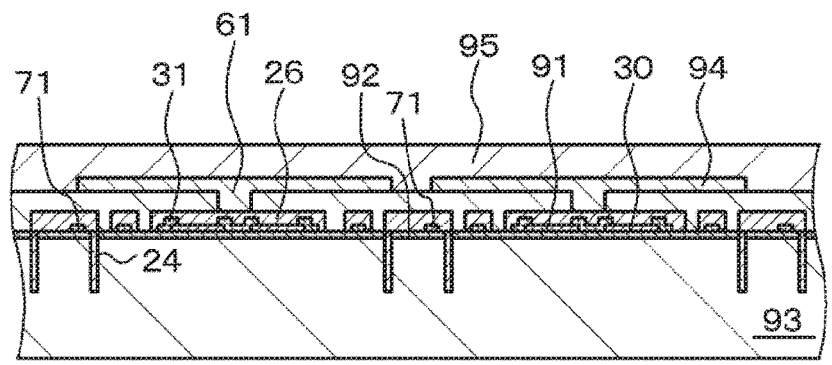
Figure 42C:
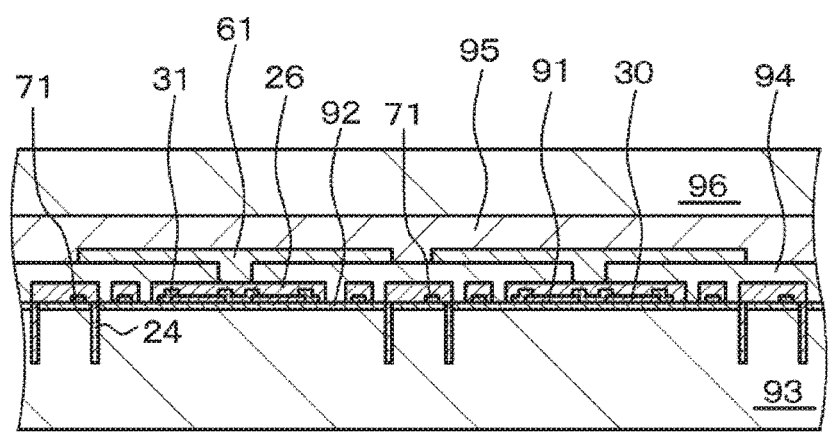

After that, a first sacrificial layer 94 is formed (see FIG. 42A), and the infrared absorption layer 61 and a second sacrificial layer 95 are formed (see FIG. 42B). A support substrate 96 is then bonded to the second sacrificial layer 95 (see FIG. 42C).

[Process 1130]

Figure 43A:
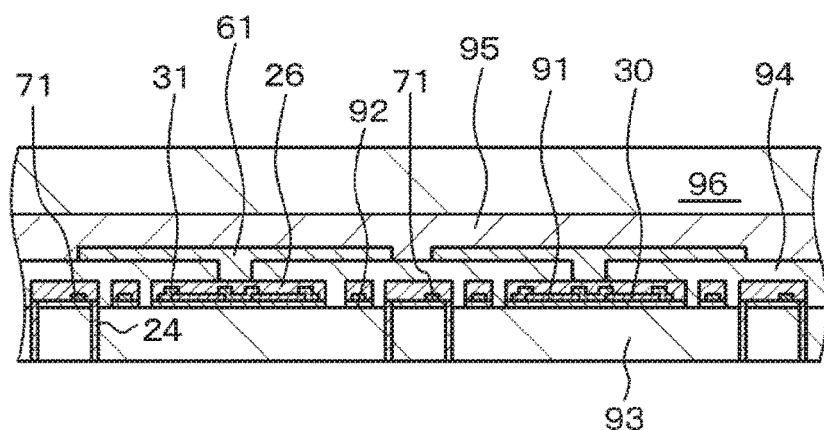
FIGS. 43A and 43B are schematic partial end views of an SOI substrate and the like for explaining the method for manufacturing the imaging device of Example 11, continued from FIG. 42C.
Figure 43B:
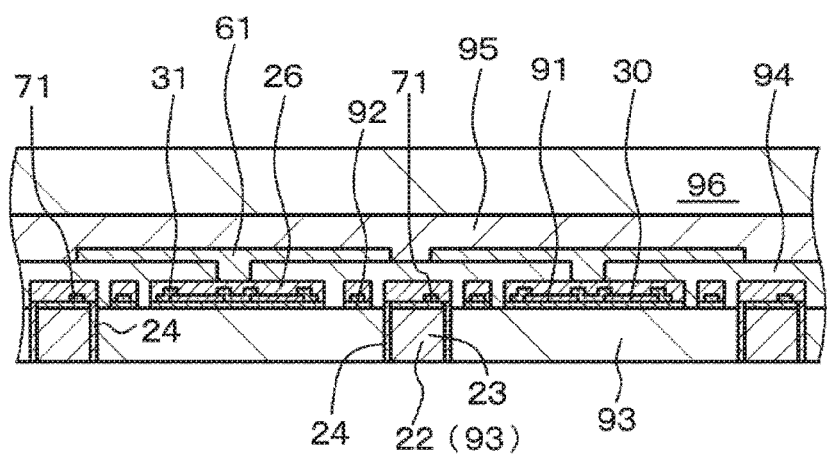

Next, the second silicon layer 93 of the SOI substrate 90 is thinned by CMP (see FIG. 43A). $L_0$ is defined by the thickness of the second silicon layer 93. Accordingly, it is possible to accurately define the value of $L_0$. The structure shown in FIG. 43B can be obtained in this manner. However, the portions of the second silicon layer 93 located inside the sidewalls 24 correspond to the partition walls 23, and the hatching of these portions is different from the hatching of the second silicon layer 93 for convenience sake.

[Process 1140]

The second structural body 40 including drive circuits 10 is prepared. Note that the infrared reflection layer 62 is formed on the coating layer 43. The second silicon layer 93 and the coating layer 43 are then joined by a known technique (see FIG. 44A). In the peripheral regions 12 and 14, the first drive lines 72A and the first signal lines 71A are then electrically connected to the drive circuits 10.

[Process 1150]

Figure 44A:
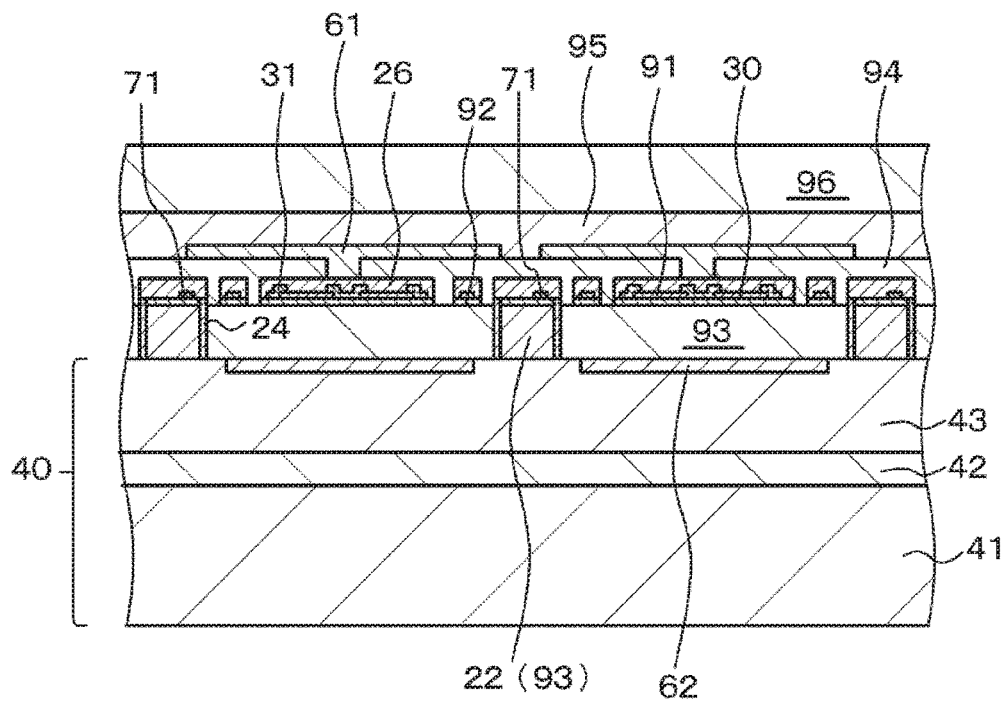
FIGS. 44A and 44B are schematic partial end views of an SOI substrate and the like for explaining the method for manufacturing the imaging device of Example 11, continued from FIG. 43B.
Figure 44B:
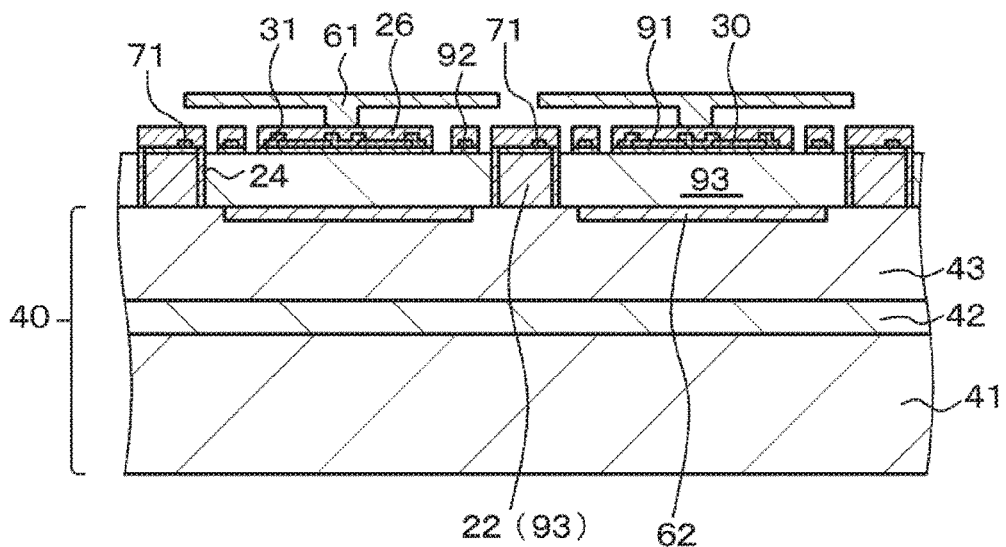
Figure 45A:
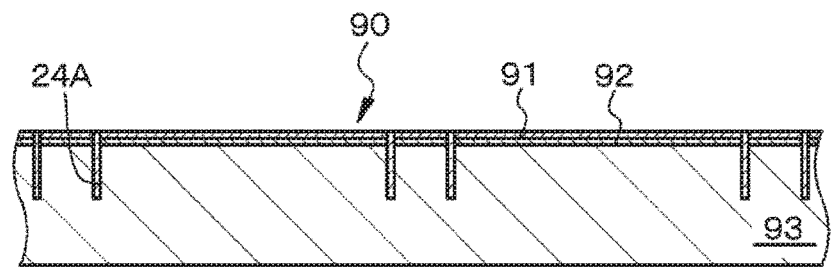
FIGS. 45A, 45B, and 45C are schematic partial end views of an SOI substrate and the like for explaining a method for manufacturing the imaging device of Example 12.
Figure 45B:
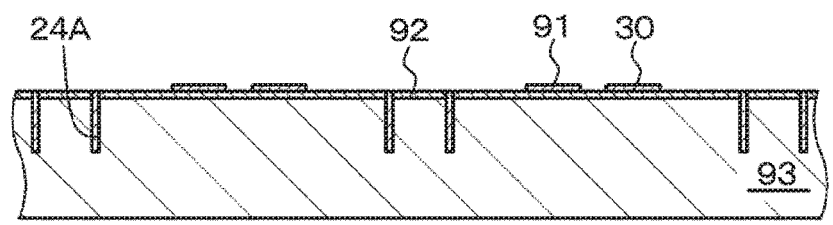
Figure 45C:
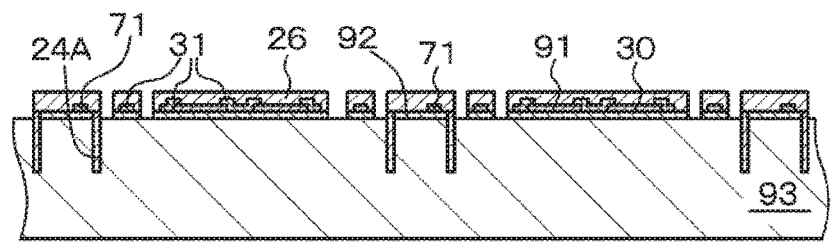

After that, the support substrate 96 is removed, and the second sacrificial layer 95 and the first sacrificial layer 94 are removed by an etching technique (see FIG. 44B). Further, the second silicon layer 93 located below the pn junction diodes 30 is removed by an etching technique. In this manner, the imaging device shown in FIG. 2 can be obtained. The $SiO_2$ layer 92 forms the diaphragm portions 25A, the insulating material layer 25B, the first stud portions 25C, and the second stud portions 25D. Note that the second silicon layer 93 located below the pn junction diodes 30 is not necessarily completely removed.

After that, the obtained imaging device is packaged in a vacuum atmosphere. As a result, the spaces in which the first temperature detection elements 16 are disposed are decompressed or evacuated. The voids 50 are also decompressed or evacuated.

In the imaging device of Example 11, the first substrate is bonded to the coating layer formed on the second substrate, and the portions of the silicon layer located below the first temperature detection elements are surrounded by the coating layer and the sidewalls of the partition walls, which are less likely to be subjected to etching than the silicon layer. Accordingly, it is possible to form voids between the first temperature detection elements and the coating layer with high reliability and precision. As a result, the infrared absorption layer can be made to absorb infrared rays having a desired wavelength with high reliability and efficiency, for example, and the detection sensitivity in the first temperature detection elements can be increased. Further, the second structural body including the drive circuits 10 and the signal processing circuit can be combined with the first structural body. Accordingly, the manufacturing costs of the imaging device can be lowered, the degree of freedom in design can be increased, and the design time can be shortened. Further, the number of input/output pins can be reduced, and the input/output signal band can be narrowed.

Figure 24A:
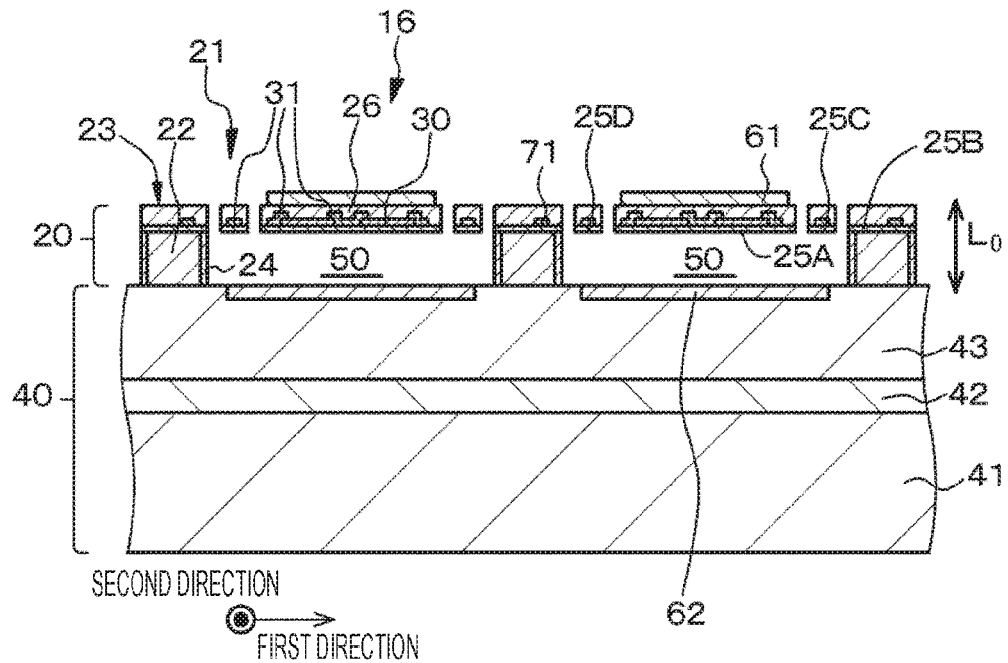
FIGS. 24A and 24B are schematic partial end views of modifications of the imaging device of Example 11.
Figure 24B:
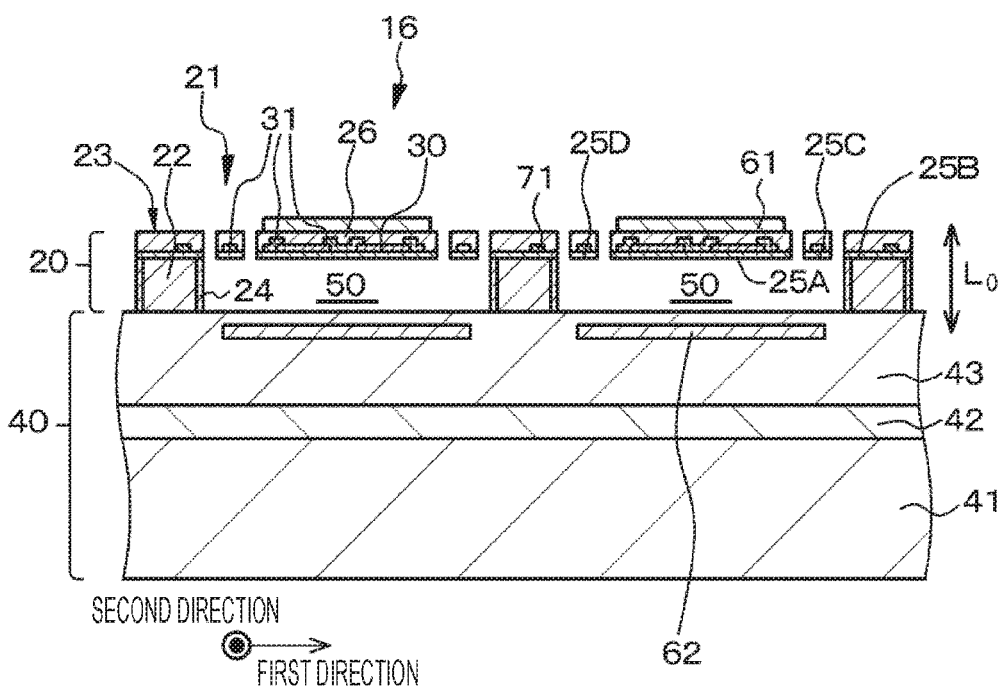

FIGS. 24A and 24B show modifications of the imaging device of Example 1 shown in FIG. 2. In a modification of the imaging device of Example 11 shown in FIG. 24A, the infrared absorption layer 61 is formed on the insulating film 26. In a modification of the imaging device of Example 11 shown in FIG. 24B, the infrared reflection layer 62 is formed inside the coating layer 43. In FIG. 24B, the infrared absorption layer 61 has the structure shown in FIG. 24A, but may have the structure shown in FIG. 2, instead. Further, the infrared absorption layer 61 may be formed inside the insulating film 26, and the infrared reflection layer 62 may be formed on the top surface of the coating layer 43.

Example 12

Figure 25A:
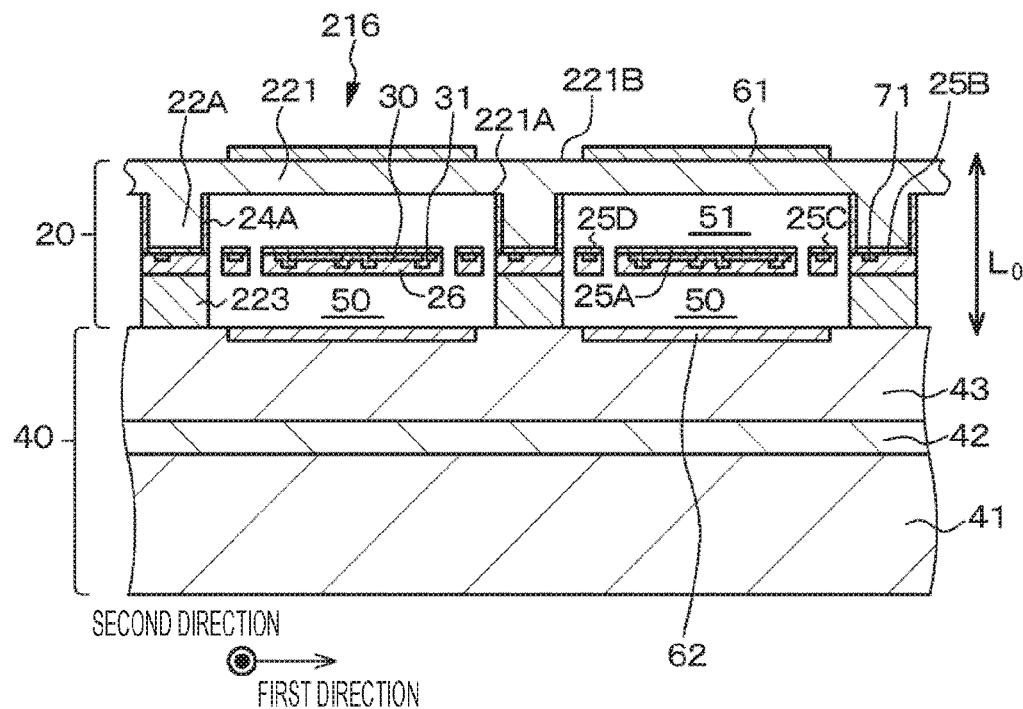
FIGS. 25A and 25B are schematic partial end views of an imaging device of Example 12 and a modification thereof.

Example 12 is modifications of Examples 1 through 10, and relates to an imaging device having a face-to-face structure. FIG. 25A shows a schematic partial end view of an imaging device of Example 12.

In the imaging device of Example 12, a partition wall 223 that is independent of a first substrate 221 is formed between the portion of the first substrate 221 located between a first temperature detection element 216 and a first temperature detection element 216 and a coating layer 43, and the bottom portion of the partition wall 223 is joined to the coating layer 43. The exposed surface of the coating layer 43 exposed to voids 50 includes at least one material layer selected from the group including an insulating material layer, a metal material layer, an alloy material layer, and a carbon material layer.

Specifically, in the imaging device of Example 12, the exposed surface of the coating layer 43 exposed to the voids 50 includes $SiO_2$. Each partition wall 223 also includes at least one material layer selected from the group including an insulating material layer, a metal material layer, an alloy material layer, and a carbon material layer. Specifically, the partition walls 223 include $SiO_2$. Reference number 22A indicates protruding portions extending from the silicon layer described later, and reference number 24A indicates the sidewalls of the protruding portions 22A.

An infrared absorption layer 61 is formed on the infrared incident side of each first temperature detection element 216, and an infrared reflection layer 62 is formed in the region of the coating layer 43 located at the bottom portion of each void 50. The infrared reflection layer 62 is formed on the top surface of the coating layer 43 or inside the coating layer 43. Alternatively, the infrared reflection layer 62 may be formed at the portion of the coating layer 43 located at the bottom portion of each void 50, may be formed at part of the portion of the coating layer 43 located at the bottom portion of each void 50, or may be formed so as to protrude from the portion of the coating layer 43 located at the bottom portion of each void 50. Specifically, the infrared reflection layer 62 has the similar configuration and structure as in Example 11. The infrared absorption layer 61 may be disposed on the first surface side of the first substrate 221, or may be provided on the second surface side of the first substrate 221. Specifically, in Example 12 shown in FIG. 25A, the infrared absorption layer 61 is disposed on the second surface side of the first substrate 221 (or on a second surface 221B of the first substrate 221). In Example 12, where the wavelength of infrared rays to be absorbed by the infrared absorption layer 61 is represented by $\lambda_{IR}$, the optical distance $L_0$ between the infrared absorption layer 61 and the infrared reflection layer 62 also satisfies the conditions below:

$$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4$$

In some cases, the infrared absorption layer 61 may be formed on the side of each first temperature detection element 216 facing the void 50.

In the description below, an outline of a method for manufacturing the imaging device of Example 12, or particularly, a method for manufacturing the first structural body 20, is described with reference to FIGS. 45A, 45B, 45C, 46A, 46B, 46C, and 46D, which are schematic partial end views of a SOI substrate and the like.

[Process 1200]

First, an SOI substrate 90 is prepared, as in Example 11. Recesses are then formed in the SOI substrate 90 from the first silicon layer side. After that, the recesses are filled with an insulating material, for example, to form the sidewalls 24A of the protruding portions 22A (see FIG. 45A). Patterning is then performed on the first silicon layer 91 on the surface of the SOI substrate 90, to leave the regions of the first silicon layer 91 in which the pn junction diodes 30 are to be formed. Next, the pn junction diodes 30 are formed on the first silicon layer 91, by a known technique (see FIG. 45B).

[Process 1210]

After that, by a known technique, the wiring lines 31 and the first signal lines 71A are formed on the $SiO_2$ layer 92 and part of the pn junction diodes 30, as in [Process 1110] in Example 11. Next, the insulating film 26 including $SiO_2$, the connecting holes 74, the contact holes 75, and the first drive lines 72A are formed on the entire surface, and patterning is then performed on the insulating film 26 (see FIG. 45C). However, the connecting holes 74, the contact holes 75, and the first drive lines 72A are not shown in FIG. 45C and the drawings that follow.

[Process 1220]

After that, a sacrificial layer 97 including an insulating material is formed on the entire surface (see FIG. 46A), and etching is performed on the portions of the sacrificial layer 97 in which the partition walls 223 are to be formed. As a result, groove portions are formed, and the groove portions are filled with the material forming the partition walls 223. Thus, the partition walls 223 are obtained (see FIG. 46B). $L_0$ is defined by the thickness of the sacrificial layer 97. Accordingly, it is possible to accurately define the value of $L_0$. Further, an etching mask layer (not shown) is formed on the sacrificial layer 97 at the portions in which the partition walls 223 are to be formed.

[Process 1230]

Figure 46A:
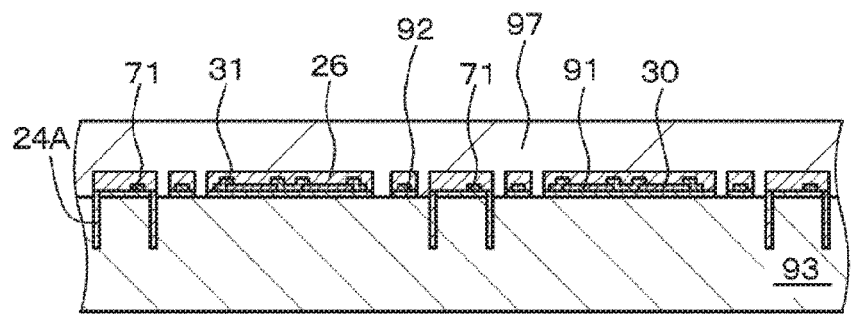
FIGS. 46A, 46B, 46C, and 46D are schematic partial end views of an SOI substrate and the like for explaining the method for manufacturing the imaging device of Example 12, continued from FIG. 45C.
Figure 46B:
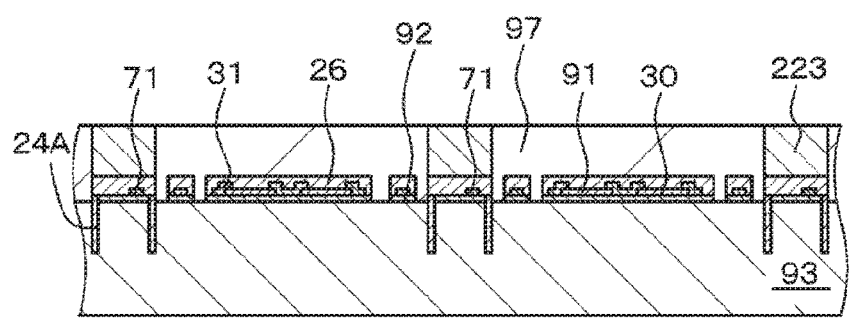
Figure 46C:
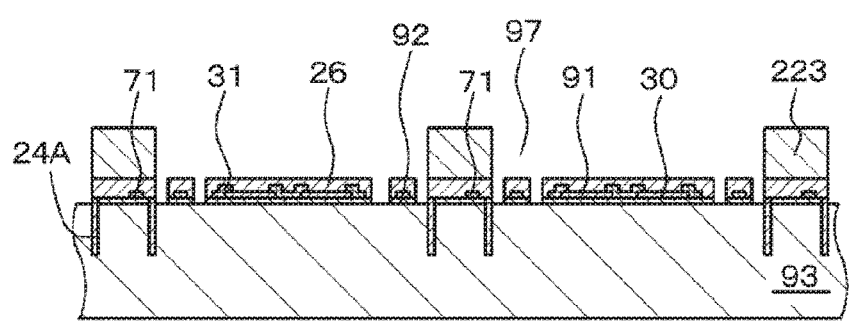
Figure 46D:
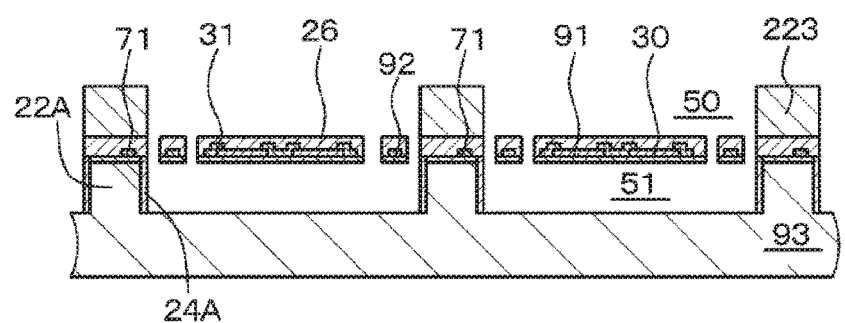

Next, the sacrificial layer 97 is removed by an etching technique (see FIG. 46C). Further, the etchant is changed, and part of the second silicon layer 93 is removed by an etching technique (see FIG. 46D), so that a hollow space 51 is formed between each diaphragm portion 25A and the second silicon layer. After that, the etching mask layer formed on the partition walls 223 is removed. Note that the cross-sectional shape of each hollow space 51 is not limited to the shape shown in the drawing.

[Process 1240]

The second structural body 40 including drive circuits 10 is prepared. Note that the infrared reflection layer 62 is formed on the coating layer 43. The partition walls 223 and the coating layer 43 are then joined together in a vacuum atmosphere by a known technique. In the peripheral regions 12 and 14, the first drive lines 72A and the first signal lines 71A are then electrically connected to the drive circuits 10. In this manner, the imaging device shown in FIG. 25A can be obtained. After that, the obtained imaging device is packaged.

Figure 25B:
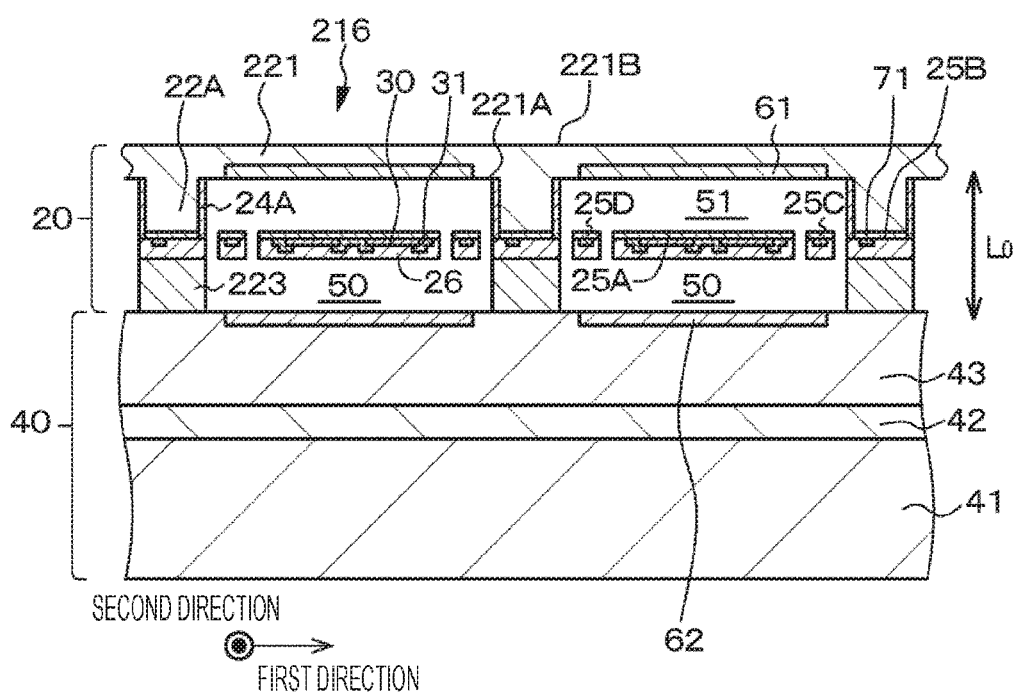
Figure 26A:
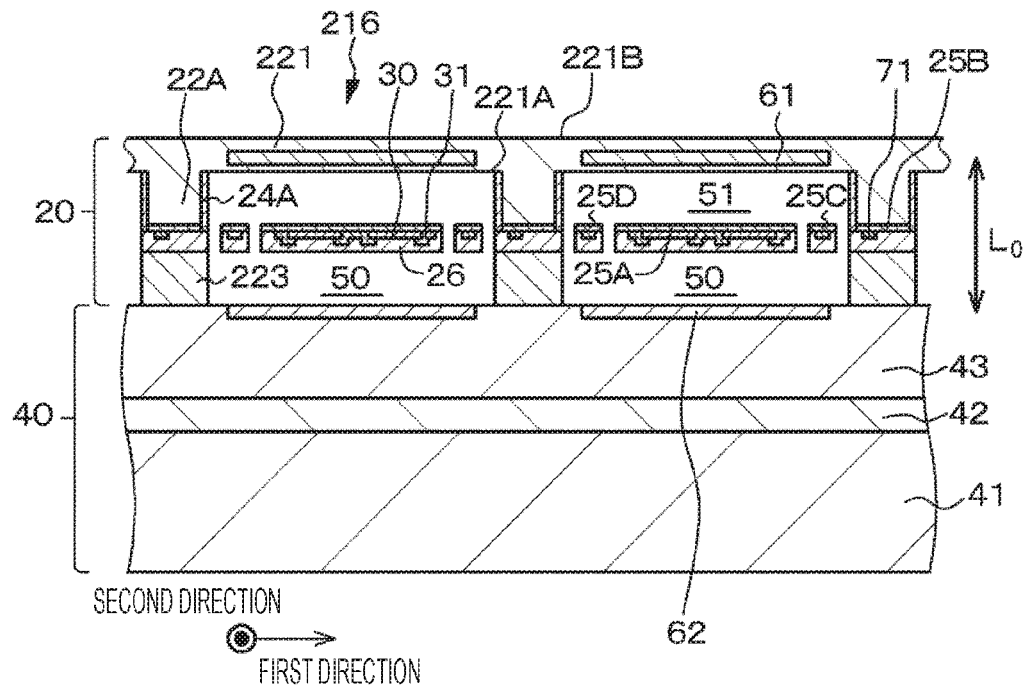
FIGS. 26A and 26B are schematic partial end views of other modifications of the imaging device of Example 12.

As shown in a schematic partial end view in FIG. 25B, the infrared absorption layer 61 may be disposed on a first surface 221A of the first substrate 221. Alternatively, as shown in a schematic partial end view in FIG. 26A, the infrared absorption layer 61 may be disposed inside the first substrate 221. Alternatively, as shown in a schematic partial end view in FIG. 26B, the infrared absorption layer 61 may be disposed on the infrared incident side of each diaphragm portion 25A.

Figure 27:
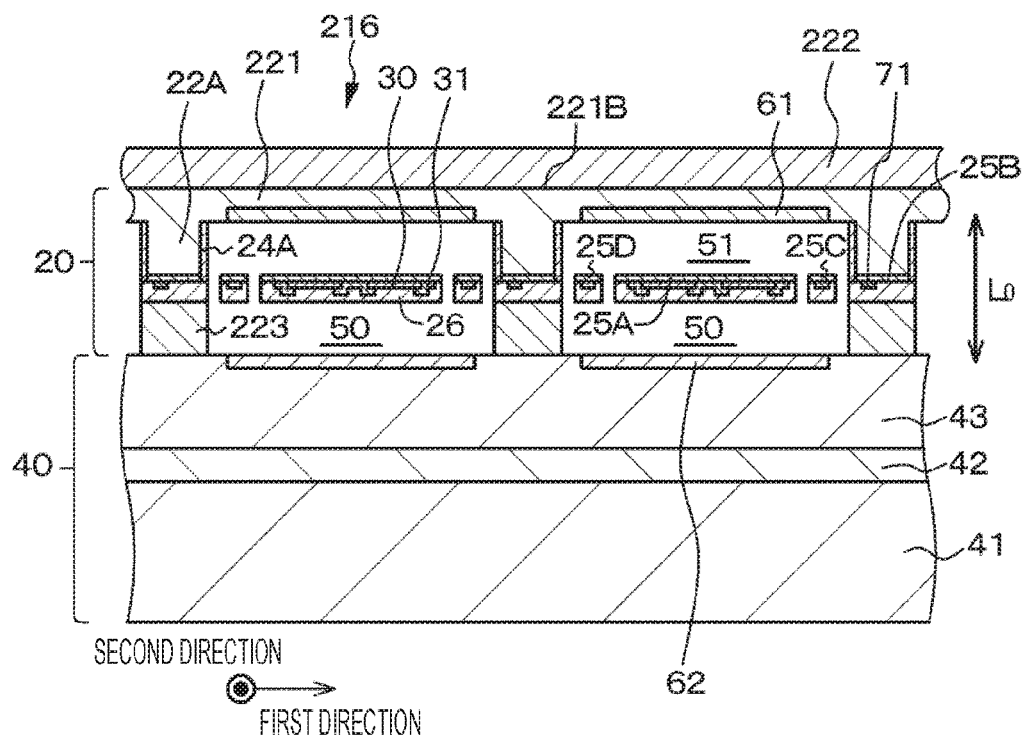
FIG. 27 is a schematic partial end view of yet another modification of the imaging device of Example 12.

Further, in the imaging device of Example 12, a protection board 222 including a silicon semiconductor substrate may be attached (bonded) to the infrared incident surface of the first substrate 221 (the second surface 221B of the first substrate 221), as shown in a schematic partial end view in FIG. 27.

Example 13

Figure 28A:
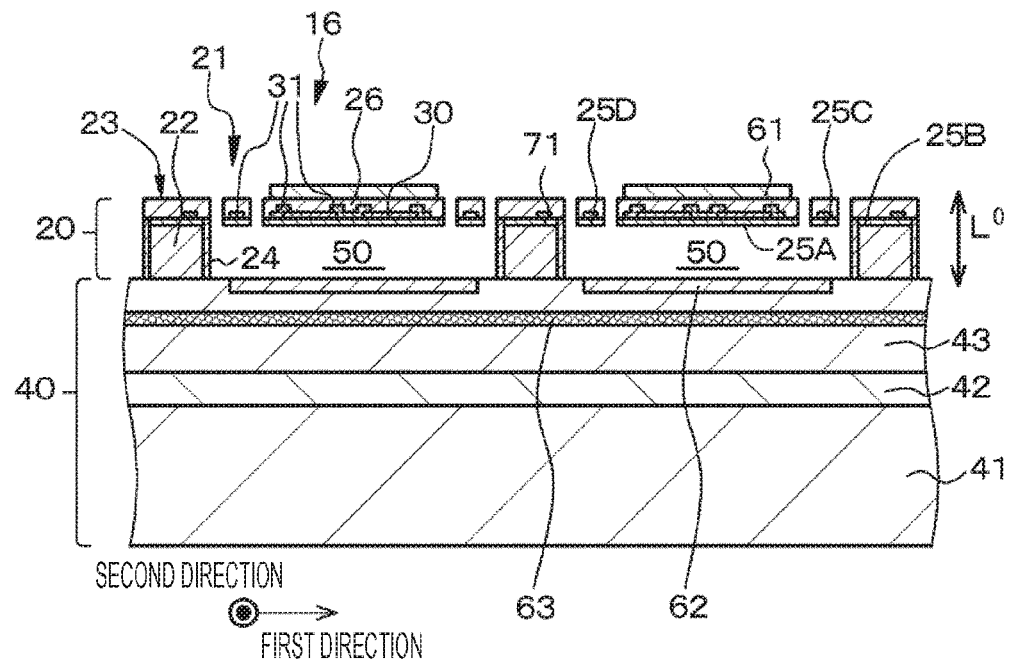
FIGS. 28A and 28B are schematic partial end views of an imaging device of Example 13 and a modification thereof.
Figure 28B:
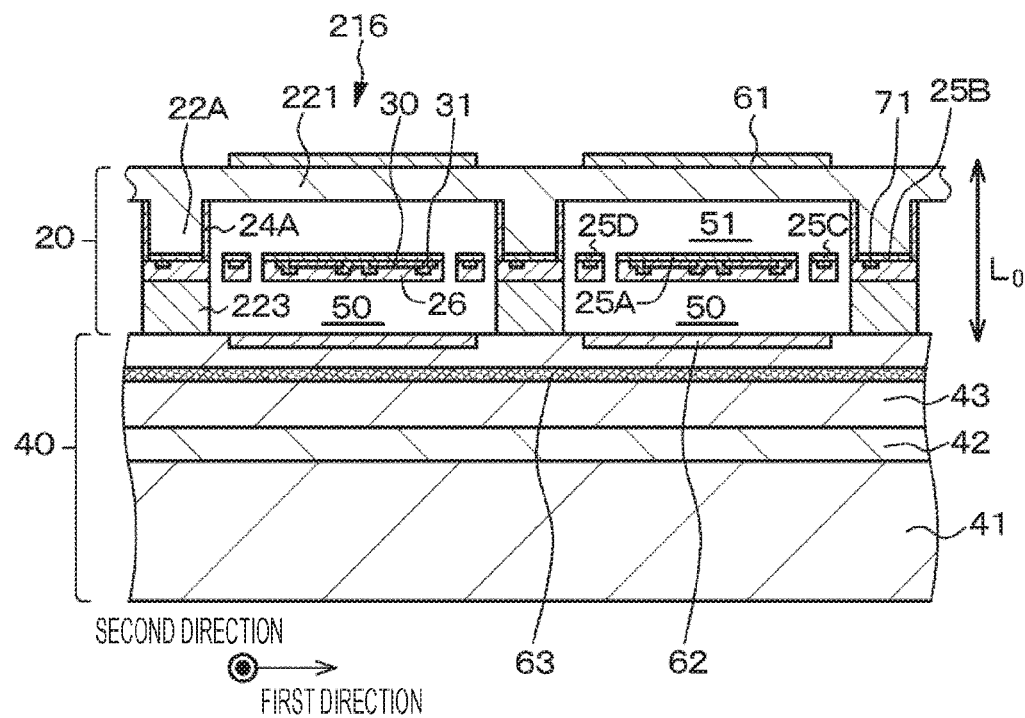

Example 13 is modifications of Examples 1 through 12. In Example 13, as shown schematic partial end views in FIG. 28A (a modification of Example 11) and FIG. 28B (a modification of Example 12), the coating layer 43 includes a heat conduction layer (a heat uniformizing layer) 63 including a metallic material, a carbon-based material such as carbon film or carbon nanotube, or an organic material. Specifically, the heat conduction layer 63 is disposed inside the coating layer 43 and below the infrared reflection layer 62. As the heat conduction layer 63 is formed, temperature can be made more uniform, and the temperature distribution can be made more uniform. In some cases, the heat conduction layer (heat uniformizing layer) 63 may include a vacuum layer. Further, depending on the region of the first temperature detection element array region 11, the configuration of the heat conduction layer (heat uniformizing layer) 63 may be changed.

Except for the above aspects, the configuration and the structure of the imaging device of Example 13 can be similar to the configuration and the structure of the imaging devices of Examples 1 through 12, and therefore, detailed explanation thereof is not made herein. Note that the heat conduction layer (heat uniformizing layer) can also be used in an imaging device (for example, an imaging device that performs imaging on the basis of visible light) that differs from the imaging devices of Examples 1 through 12.

Example 14

Figure 29A:
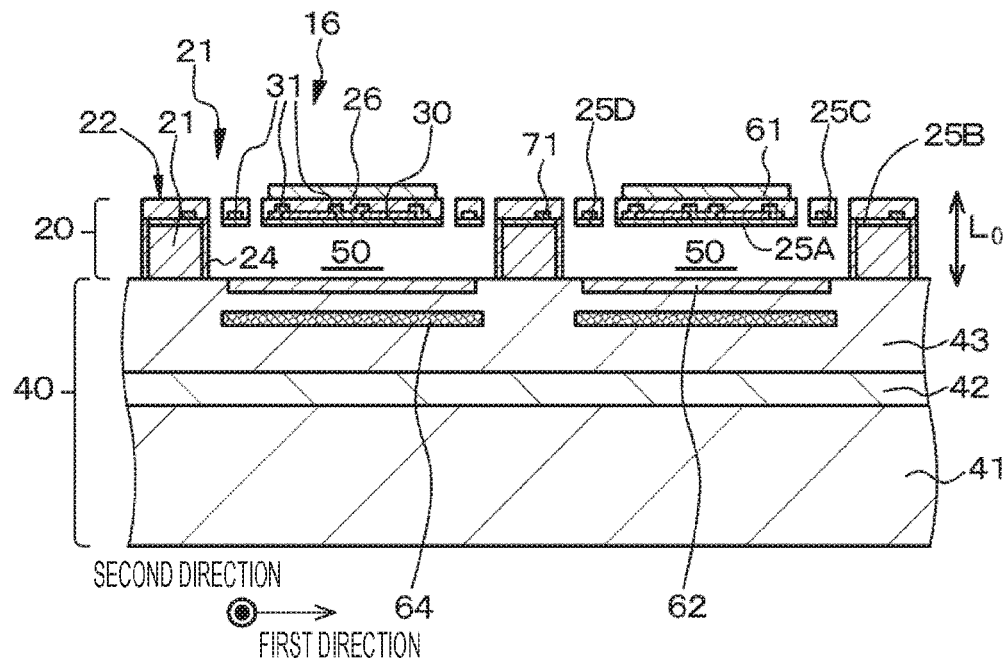
FIGS. 29A and 29B are schematic partial end views of an imaging device of Example 14 and a modification thereof.
Figure 29B:
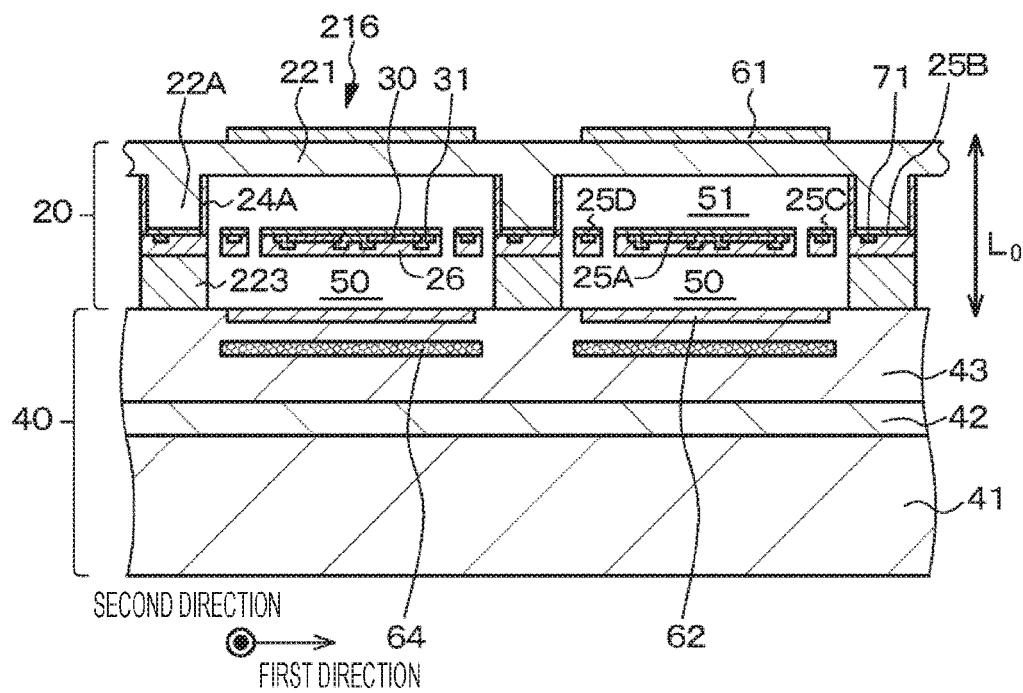

Example 14 is modifications of Examples 1 through 13. In Example 14, as shown in schematic partial end views in FIG. 29A (a modification of Example 11) and FIG. 29B (a modification of Example 12), the coating layer 43 includes a temperature control layer 64 (specifically, formed inside the coating layer 43) including tungsten (W), and a temperature detection means (not shown) including silicon diodes is provided in the coating layer 43. The temperature control layer 64 functions as a heater (a resistor, or a resistance member). Note that the temperature control layer may be designed to also serve as wiring lines. Meanwhile, the drive circuits 10 control the temperature control layer 64, on the basis of the results of temperature detection performed by the temperature detection means. Specifically, the current to be applied to the temperature control layer 64 is controlled, for example, so that the amount of heat to be generated by the temperature control layer 64 is controlled. Note that the wiring lines that connect the temperature control layer 64 and the drive circuits 10 to control the temperature control layer 64 are not shown in the drawing.

Specifically, a drive circuit 10 (particularly, a CPU or a DSP) that has received a result of temperature detection performed by the temperature detection means determines the temperature distribution of the coating layer 43, on the basis of the received temperature detection result. The drive circuit 10 then calculates the required amount of heat, and individually controls the value of the current to be applied to the temperature control layer 64, so that the temperature of the coating layer 43 is made uniform, and the temperature distribution in the coating layer 43 is made uniform (in-plane temperature variation is reduced). Further, the temperature of the first substrate 21 or 221 is made uniform, the temperature distribution in the first substrate 21 or 221 is made uniform, the temperature of the first temperature detection elements 16 is made uniform, and the temperature distribution in the first temperature detection elements 16 is made uniform. Accordingly, even in a case where the amount of current in the analog logic block changes, and the amount of heat generated in the analog logic block changes, for example, temperature control can be easily performed. In a case where temperature moves out of the temperature control range of the temperature control layer 64, the drive circuit 10 controls the amount of current in the analog logic block, and controls the operation clock in the analog logic block, so that temperature can be made uniform, and the temperature distribution can be made uniform. Note that, even if the temperature control layer 64 is not adopted, the drive circuit 10 controls the amount of current in the analog logic block, and controls the operation clock in the analog logic block, so that temperature can be made uniform, and the temperature distribution can be made uniform. As the temperature to be controlled by the temperature control layer 64 is set at a higher temperature than room temperature, for example, the temperature control layer 64 performs a kind of on/off operation, and becomes capable of reducing the power to be consumed by the temperature control layer 64. Further, the temperature control layer 64 may be used in combination with the heat conduction layer 63 described in Example 13, so that temperature can be made even more uniform, and the temperature distribution can be made even more uniform. In this case, the heat conduction layer 63 is preferably disposed above the temperature control layer 64. In some cases, the temperature control layer 64 may also serve as the infrared reflection layer 62.

Figure 30:
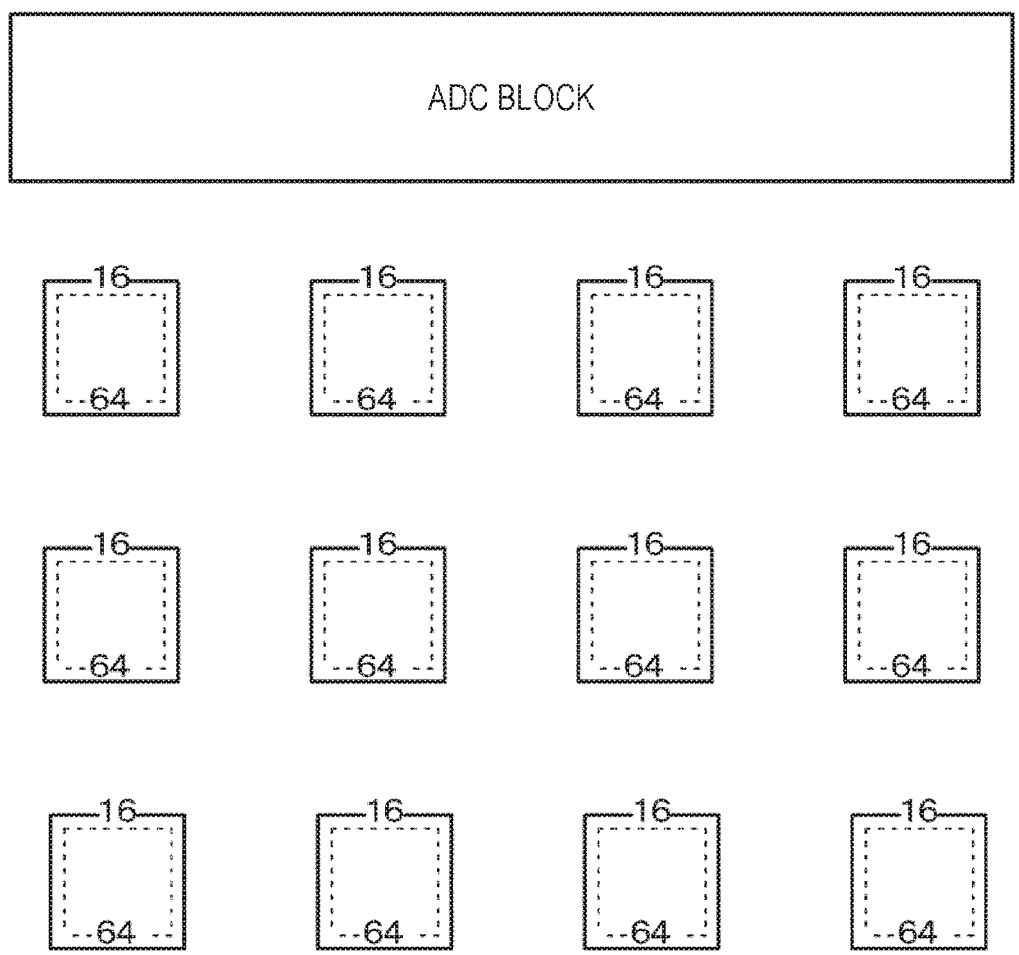
FIG. 30 is a diagram schematically showing the layout of first temperature detection elements and a temperature control layer in the imaging device of Example 14.
Figure 31:
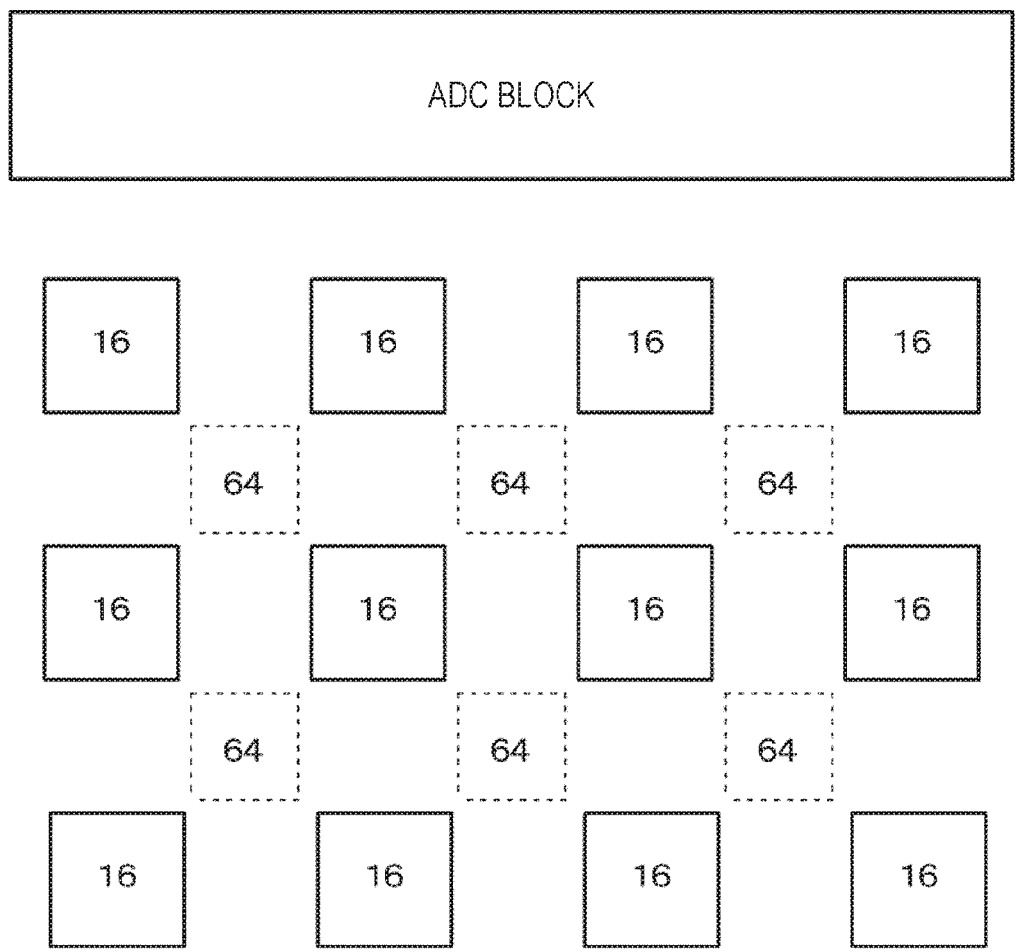
FIG. 31 is a diagram schematically showing the layout of first temperature detection elements and a temperature control layer in another modification of the imaging device of Example 14.

FIGS. 30 and 31 schematically show examples of layouts of the first temperature detection elements 16 and the temperature control layer 64. Orthogonal projection images of the first temperature detection elements 16 may overlap with orthogonal projection images of the temperature control layer 64 (see FIG. 30), or each orthogonal projection image of the temperature control layer 64 may be located between an orthogonal projection image of a first temperature detection element 16 and an orthogonal projection image of a first temperature detection element 16 (see FIG. 31). The area, the layout positions, and the arrangement density of the temperature control layer 64 are only required to be set so that uniform temperature and a uniform temperature distribution can be obtained. Note that the temperature control layer 64 is located below the first temperature detection elements 16, and therefore, the temperature control layer 64 is indicated by dotted lines in FIGS. 30 and 31.

Here, the first structural body 20 includes the first temperature detection element array region 11 including a plurality of first temperature detection elements 16, and the peripheral region 12 surrounding the first temperature detection element array region 11. The temperature control layer 64 is preferably formed in the first temperature detection element array region 11. Alternatively, the temperature control layer 64 is preferably formed in the region of the coating layer 43 in which the orthogonal projection image of the first temperature detection element array region exists. Alternatively, each drive circuit 10 may include an analog-digital conversion circuit (ADC), and any analog-digital conversion circuit may not be disposed in the region of the second substrate in which the orthogonal projection image of the first temperature detection element array region exists.

Except for the above aspects, the configuration and the structure of the imaging device of Example 14 can be similar to the configuration and the structure of the imaging devices of Examples 1 through 13, and therefore, detailed explanation thereof is not made herein. Note that the temperature control layer can also be used in an imaging device (for example, an imaging device that performs imaging on the basis of visible light) that differs from the imaging devices of Examples 1 through 13.

Example 15

Example 15 relates to an imaging device having the second configuration and an imaging device having the third configuration of the present disclosure.

Figure 34:
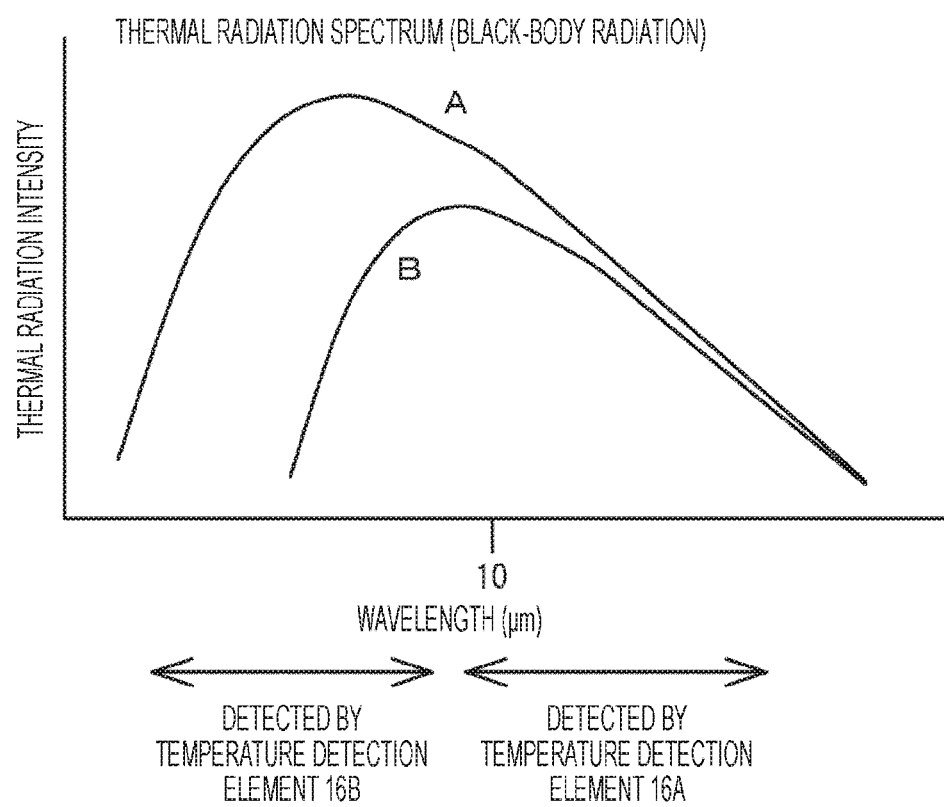
FIG. 34 is a graph schematically showing the relationship between a radiation spectrum from an object and infrared wavelength.

A radiation spectrum from an object at a temperature around room temperature has a peak in the neighborhood of a wavelength of 10 μm (see a radiation spectrum "B" in FIG. 34). Note that a radiation spectrum "A" in FIG. 34 indicates a radiation spectrum from an object at a higher temperature than room temperature. For example, a first temperature detection element having a shorter sensitivity wavelength than this peak wavelength, and a first temperature detection element having a longer sensitivity wavelength than this peak wavelength are then combined in the same pixel, so that the temperature of an object can be measured with high precision from the intensity ratio between signals from the two first temperature detection elements.

An imaging device of Example 15 includes a first temperature detection element assembly that detects temperature on the basis of infrared rays, the first temperature detection element assembly including a plurality of first temperature detection elements 16A and 16B that are arranged in parallel.

In the first temperature detection element assembly, the wavelengths of infrared rays to be detected by the respective first temperature detection elements 16A and 16B are different. Note that, in Example 15, a plurality of first temperature detection element assemblies is arranged in a first direction and a second direction different from the first direction (or specifically, in a two-dimensional matrix).

Further, in the imaging device of Example 15, each first temperature detection element 16A or 16B has an infrared absorption layer 61, 61A, or 61B on the infrared incident side, and an infrared reflection layer 62, 62A, or 62B on the opposite side from the infrared incident side.

In each first temperature detection element assembly, the optical distances $L_0$ and $L_0'$ between the infrared absorption layers 61, 61A, and 61B and the infrared reflection layers 62, 62A, and 62B in the respective first temperature detection elements 16A and 16B are different.

Where the wavelengths of the infrared rays to be absorbed by the infrared reflection layers 61, 61A, and 61B forming the first temperature detection elements 16A and 16B are represented by $\lambda_{IR-A}$ and $\lambda_{IR-B}$, the optical distances $L_0$ and $L_0'$ in the respective first temperature detection elements 16A and 16B satisfy $0.75 \times \lambda_{IR-A}/2 \le L_0 \le 1.25 \times \lambda_{IR-A}/2$ or $0.75 \times \lambda_{IR-A}/4 \le L_0 \le 1.25 \times \lambda_{IR-A}/4$, and $0.75 \times \lambda_{IR-B}/2 \le L_0' \le 1.25 \times \lambda_{IR-B}/2$ or $0.75 \times \lambda_{IR-B}/4 \le L_0' \le 1.25 \times \lambda_{IR-B}/4$ Furthermore, each first temperature detection element 16A or 16B has an infrared absorption layer 61, 61A, or 61B on the infrared incident side, and an infrared reflection layer 62, 62A, or 62B on the opposite side from the infrared incident side.

In each first temperature detection element assembly, the materials, the configurations, and the structures of the infrared absorption layers 61, 61A, and 61B, or the materials, the configurations, and the structures of the infrared reflection layers 62, 62A, and 62B, or the materials, the configurations, and the structures of the infrared absorption layers 61, 61A, and 61B and the materials, the configurations, and the structures of the infrared reflection layers 62, 62A, and 62B are different in the respective first temperature detection elements 16A and 16B. Specifically, this is as described in (Case A), (Case B), and (Case C).

Alternatively, an imaging device of Example 15 includes a first temperature detection element assembly that detects temperature on the basis of infrared rays, the first temperature detection element assembly including a plurality of first temperature detection elements 16A and 16B that are arranged in parallel.

In the first temperature detection element assembly, the amount of infrared absorption by the respective first temperature detection elements 16A and 16B are different. Note that, in this Example 15, a plurality of first temperature detection element assemblies is also arranged in a first direction and a second direction different from the first direction (or specifically, in a two-dimensional matrix).

Further, in the imaging device of Example 15, each first temperature detection element 16A or 16B has an infrared absorption layer 61, 61A, or 61B on the infrared incident side, and an infrared reflection layer 62, 62A, or 62B on the opposite side from the infrared incident side.

In each first temperature detection element assembly, the materials of the infrared absorption layers 61, 61A, and 61B, or the materials of the infrared reflection layers 62, 62A, and 62B, or the materials of the infrared absorption layers 61, 61A, and 61B and the materials of the infrared reflection layers 62, 62A, and 62B are different in the respective first temperature detection elements 16. Also, in the imaging device of Example 15, each first temperature detection element 16A or 16B has an infrared absorption layer 61, 61A, or 61B on the infrared incident side, and an infrared reflection layer 62, 62A, or 62B on the opposite side from the infrared incident side.

In each first temperature detection element assembly, the areas or the thicknesses, or the areas and the thicknesses of the infrared absorption layers 61, 61A, and 61B, or the infrared reflection layers 62, 62A, and 62B, or the infrared absorption layers 61, 61A, and 61B and the infrared reflection layers 62, 62A, and 62B are different in the respective first temperature detection elements 16. Specifically, this is as described in (Case a), (Case b), (Case c), (Case d), (Case e), (Case f), (Case g), (Case h), and (Case i).

Figure 32A:
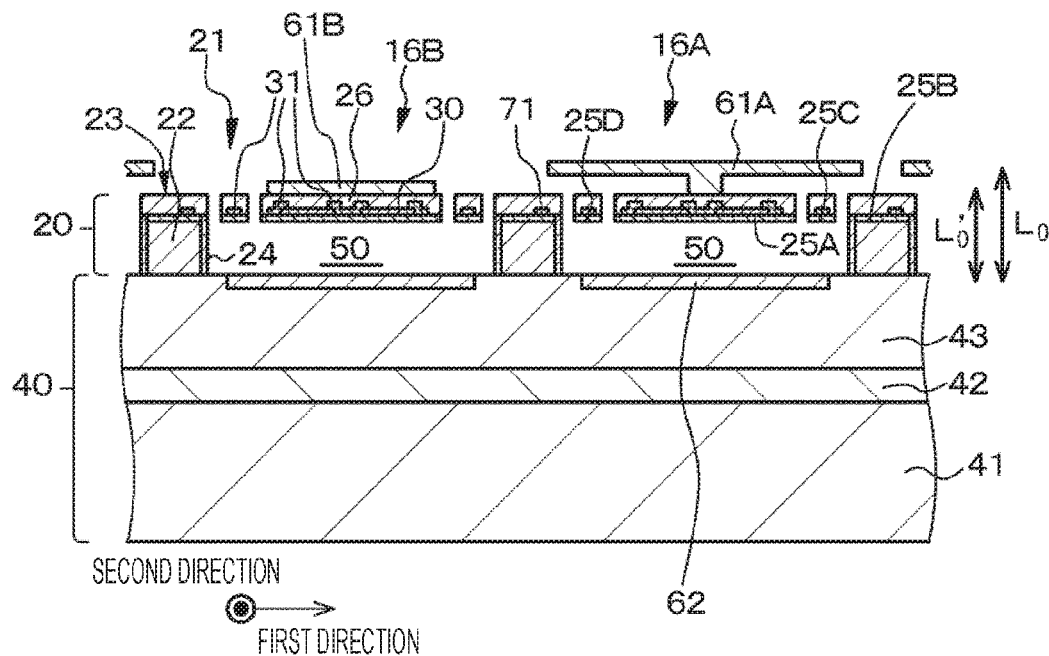
FIGS. 32A and 32B are schematic partial end views of an imaging device of Example 15 and a modification thereof.

More specifically, as shown in a schematic partial end view in FIG. 32A, the structures of the infrared absorption layers 61A and 61B in a first temperature detection element 16A and a first temperature detection element 16B are different. With this arrangement, the values of $L_0$ and $L_0'$ in the first temperature detection elements 16A and 16B can be made different from each other, the wavelengths of infrared rays to be detected by the respective first temperature detection elements 16A and 16B can be made different from each other, and the amount of infrared rays to be absorbed by the respective first temperature detection elements 16A and 16B can be made different from each other.

Figure 32B:
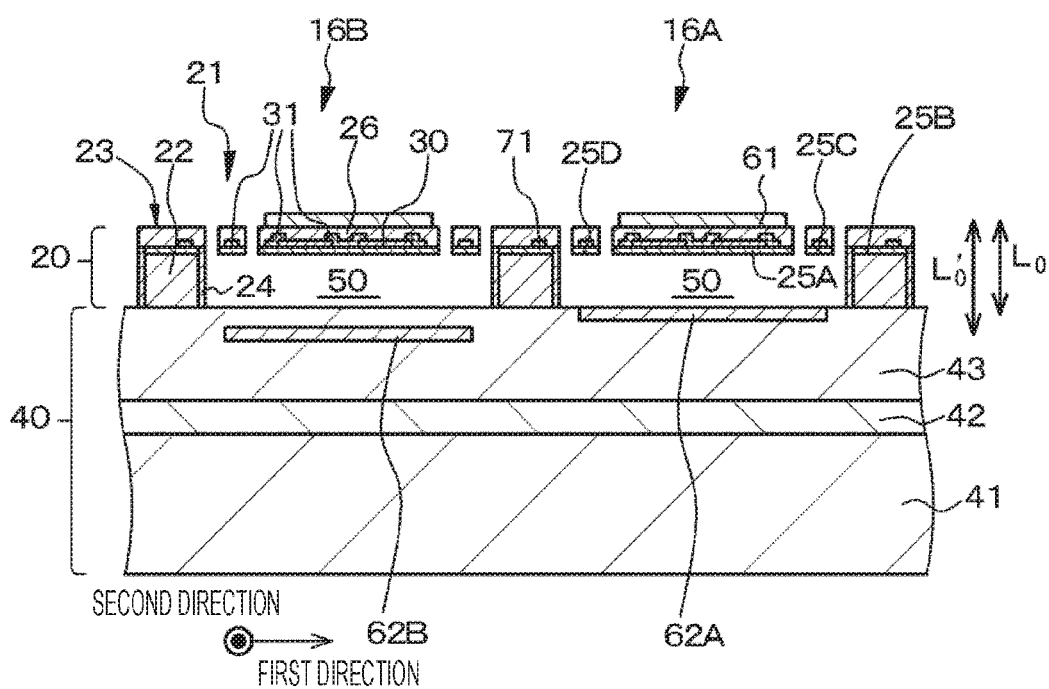

Alternatively, as shown in a schematic partial end view in FIG. 32B, the structures of the infrared absorption layers 61A and 61B in a first temperature detection element 16A and a first temperature detection element 16B are the same, but are formed at different positions. With this arrangement, the values of $L_0$ and $L_0'$ in the first temperature detection elements 16A and 16B can also be made different from each other, and the wavelengths of infrared rays to be detected by the respective first temperature detection elements 16A and 16B can be made different from each other.

Figure 33A:
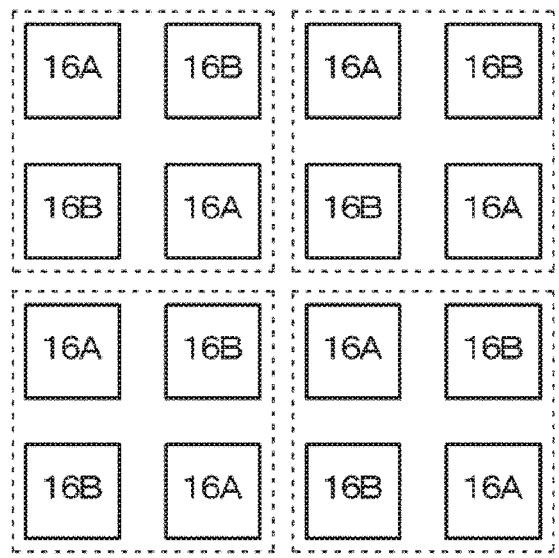
FIGS. 33A and 33B are diagrams each schematically showing the layout of first temperature detection elements and a temperature control layer in an imaging device of Example 15.
Figure 33B:
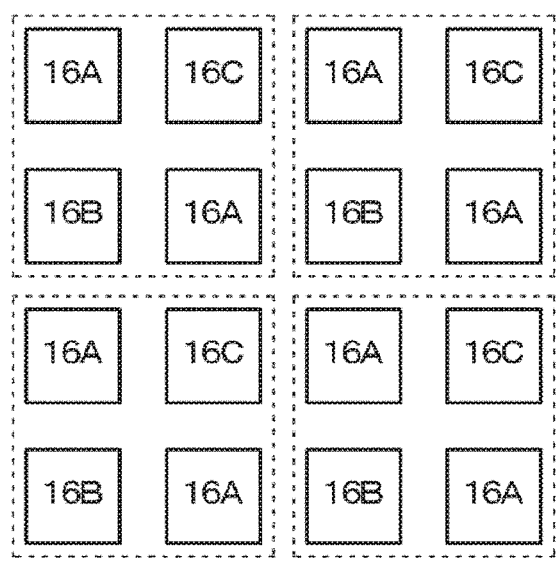

FIG. 33A shows an example layout of first temperature detection elements 16A and first temperature detection elements 16B in a case where a first temperature detection element assembly includes the two types of first temperature detection elements 16A and 16B. Each first temperature detection element assembly including four first temperature detection elements 16A and 16B that constitute one pixel is surrounded by a dotted line. Note that each first temperature detection element assembly may include two first temperature detection elements 16A and 16B. Further, FIG. 33B shows an example layout of first temperature detection elements 16A, first temperature detection elements 16B, and first temperature detection elements 16C in a case where a first temperature detection element assembly includes the three types of first temperature detection elements 16A, 16B, and 16C. The first temperature detection elements that cope with infrared wavelength requiring high spatial resolution are only required to be the first temperature detection elements 16A.

In an imaging device of Example 15, a first temperature detection element assembly includes a plurality of first temperature detection elements that are arranged in parallel, and the wavelengths of infrared rays to be detected by the respective first temperature detection elements in the first temperature detection element assembly differ from each other. Alternatively, the amounts of infrared rays to be absorbed by the respective first temperature detection elements in the first temperature detection element assembly differ from each other. Thus, it is possible to change the wavelength spectral characteristics and the infrared sensitivity for each first temperature detection element. Further, as first temperature detection elements having different sensitivity wavelengths are combined in the same pixel, it becomes possible to measure the temperature of an object with high accuracy, from the intensity ratio between signals from first temperature detection elements. Alternatively, each first temperature detection element assembly includes high-sensitivity first temperature detection elements and low-sensitivity first temperature detection elements, so that the dynamic range of the first temperature detection element assemblies can be varied. That is, the low-sensitivity first temperature detection elements are activated in a case where the infrared intensity is high, and the high-sensitivity first temperature detection elements are activated in a case where the infrared intensity is low. Alternatively, in a case where the object (or the environment) changes from a low infrared intensity state to a high infrared intensity state, switching from the high-sensitivity first temperature detection elements to the low-sensitivity first temperature detection elements is performed. In a case where the object (or the environment) changes from a high infrared intensity state to a low infrared intensity state, switching from the low-sensitivity first temperature detection elements to the high-sensitivity first temperature detection elements is performed.

The configuration and the structure of the first temperature detection elements described in Example 11 are adopted as the configuration and the structure of the first temperature detection elements 16A and 16B shown in FIGS. 32A and 32B, but configurations and structures are not limited to this. For example, the configuration and the structure of an imaging device of Example 15 may be similar to the configuration and the structure of any of the imaging devices described in Examples 1 through 14. Alternatively, as long as each first temperature detection element assembly includes a plurality of first temperature detection elements that are arranged in parallel, and the wavelengths of infrared rays to be detected by the respective first temperature detection elements differ from each other in the first temperature detection element assembly, or the amounts of infrared rays to be absorbed by the respective first temperature detection elements differ from each other in the first temperature detection element assembly, the configuration and the structure of one of the imaging devices described in Examples 1 through 14 are not necessarily adopted, but an imaging device having some other configuration and structure may be adopted.

Example 16

Figure 35:
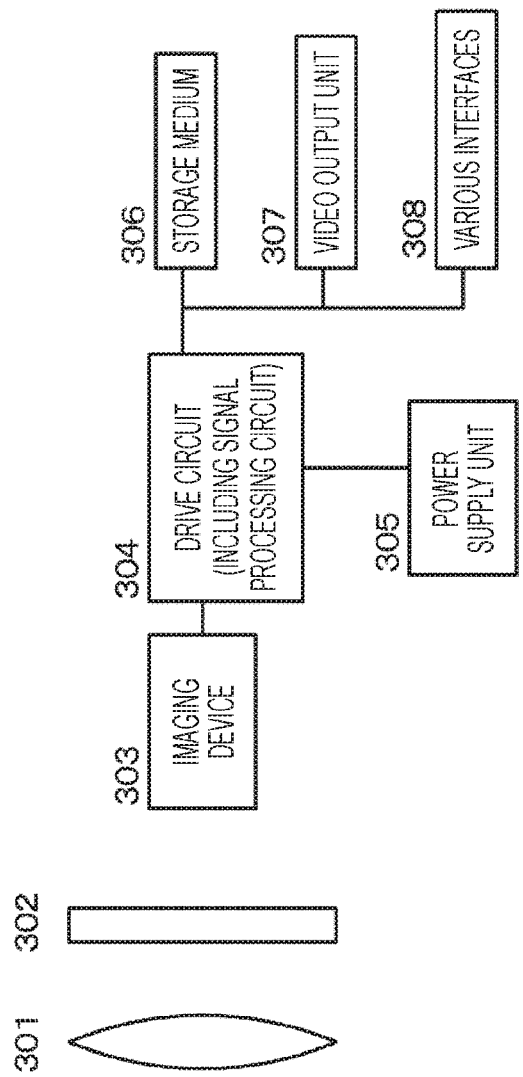
FIG. 35 is a conceptual diagram of an infrared camera including an imaging device of the present disclosure in Example 16.

In Example 16, an example in which one of the imaging devices described in Examples 1 through 15 is applied to an infrared camera is described. As shown in a conceptual diagram in FIG. 35, the infrared camera includes a lens 301, a shutter 302, an imaging device 303 described in Examples 1 through 15, a drive circuit 304, a power supply unit 305, a storage medium 306, a video output unit 307, and various interfaces 308. In addition to the various circuits described above, the drive circuit 304 includes a signal processing circuit that corrects variation among pixels, corrects defective pixels, and performs various kinds of noise removal, for example. Except for the imaging device 303, the components of the infrared camera having such a configuration can be well-known components, and therefore, detailed explanation of them is not made herein.

Although imaging devices of the present disclosure have been described so far on the basis of preferred examples, imaging devices of the present disclosure are not limited to those examples. The configurations and the structures of the imaging devices, the first temperature detection elements, the second temperature detection elements, and the third elements described in Examples are merely examples, and therefore, may be modified as appropriate. The materials forming the imaging devices, the first temperature detection elements, the second temperature detection elements, and the third elements, and the methods for manufacturing the imaging devices and the first temperature detection elements are also merely examples, and may be modified as appropriate. In some cases, forming the infrared reflection layer may be skipped, and the top surface of the coating layer may be made to function as the infrared reflection layer.

Figure 36:
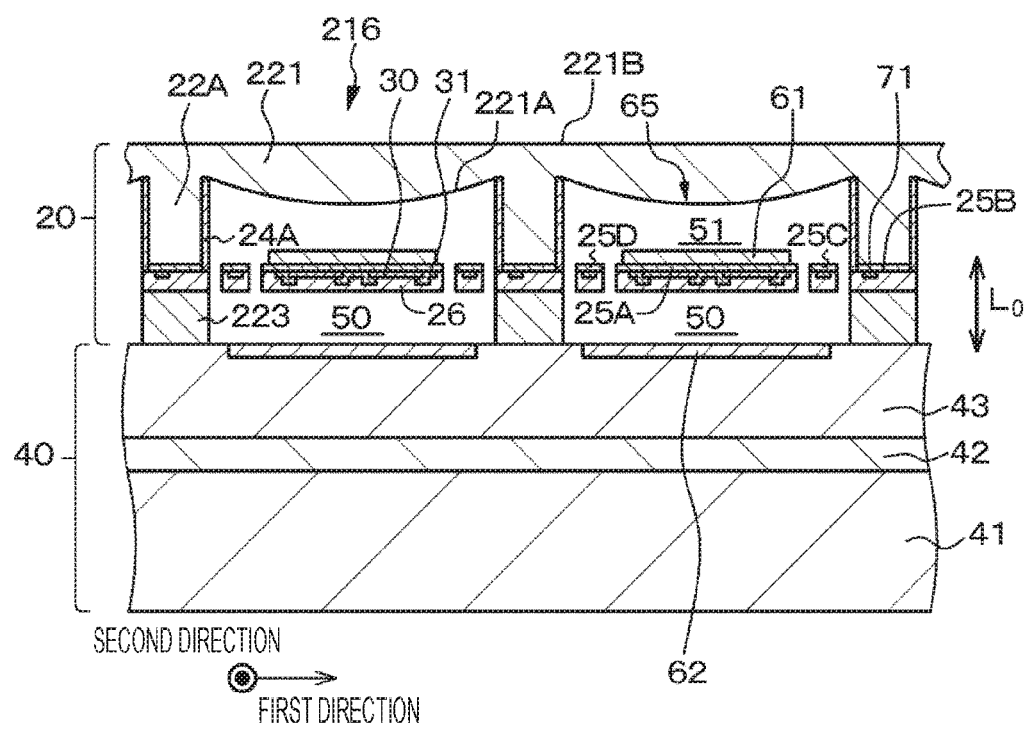
FIG. 36 is a schematic partial end view of yet another modification of the imaging device of Example 12.

Condensing elements such as lenses, for example, may be disposed on the infrared incident side of an imaging device. FIG. 36 shows an example in which condensing elements (lenses) 65 are disposed on the side of the first surface 221A of the first substrate 221 in the modification of Example 12 shown in FIG. 26B, for example. Such condensing elements 65 can be formed at the same time as the removal of the sacrificial layer 97 by an etching technique (see FIG. 46C), the change of the etchant and the partial removal of the second silicon layer 93 by an etching technique (see FIG. 46D), and further, the formation of the hollow spaces 51 between each diaphragm portion 25A and the second silicon layer in [Process 1230] in Example 12, for example. That is, when part of the second silicon layer 93 is removed by an etching technique, the etchant enters the second silicon layer 93 from the vicinities of the partition walls 223. However, the etching conditions are appropriately set, so that more etching can be performed on the portions of the second silicon layer 93 in the vicinities of the partition walls 223 than on the portions of the second silicon layer 93 farther from the partition walls 223. As a result, the condensing elements (lenses) 65 can be formed on the side of the first surface 221A of the first substrate 221 (the second silicon layer 93).

Figure 37A:
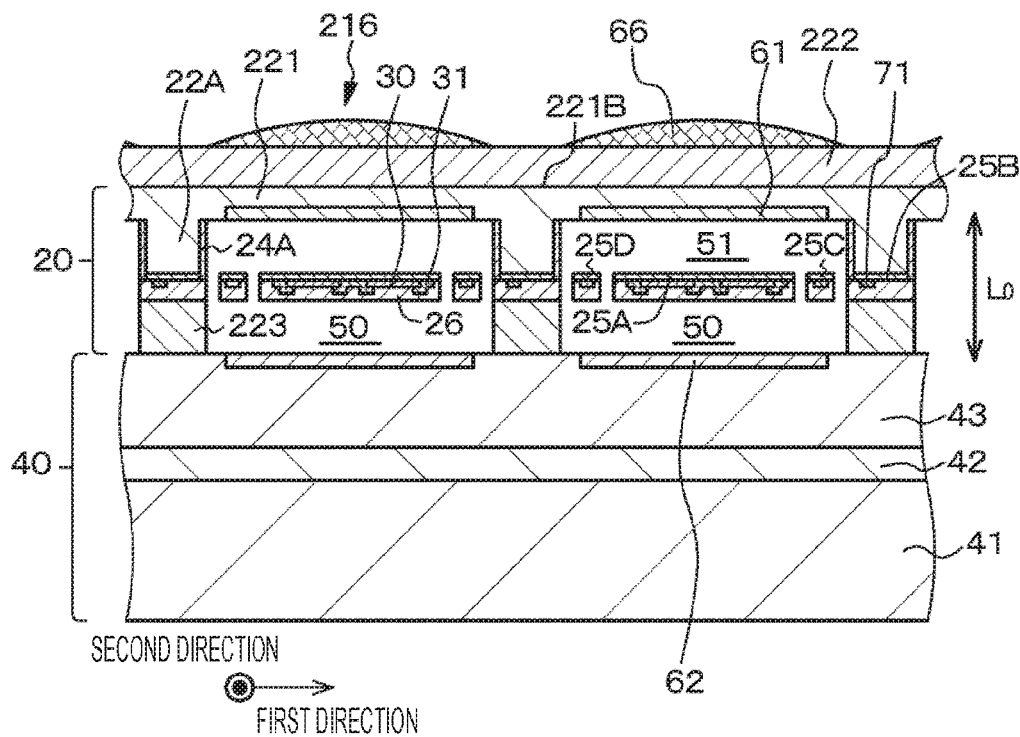
FIGS. 37A and 37B are schematic partial end views of further modifications of the imaging device of Example 12.
Figure 37B:
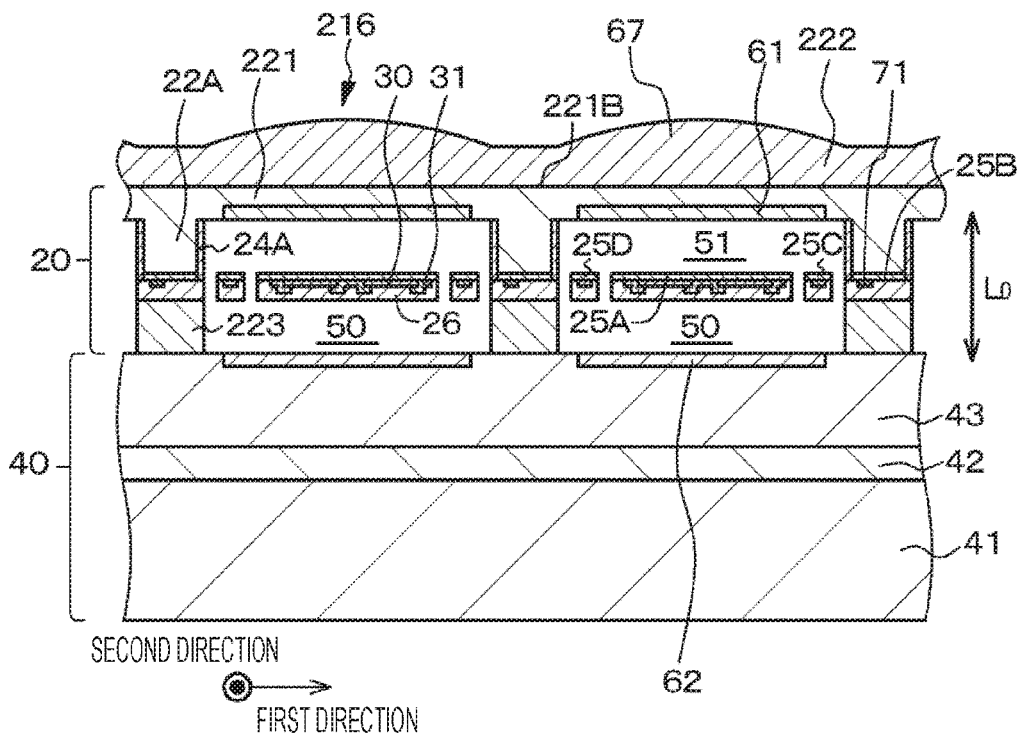
Figure 38A:
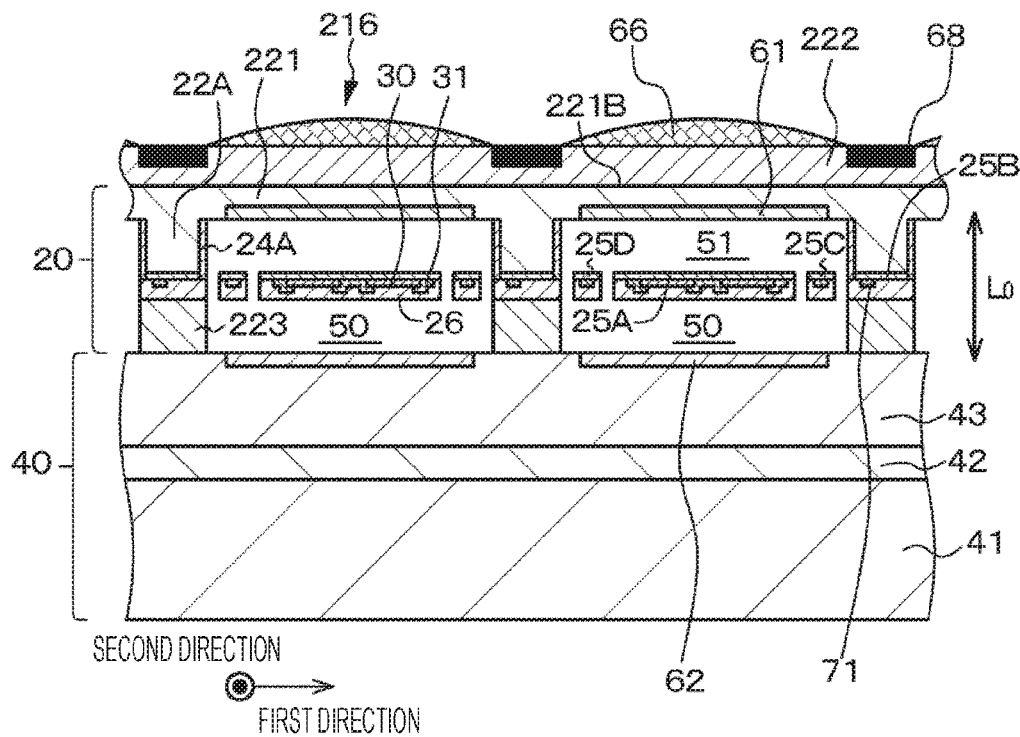
FIGS. 38A and 38B are schematic partial end views of yet other modifications of the imaging device of Example 12.
Figure 38B:
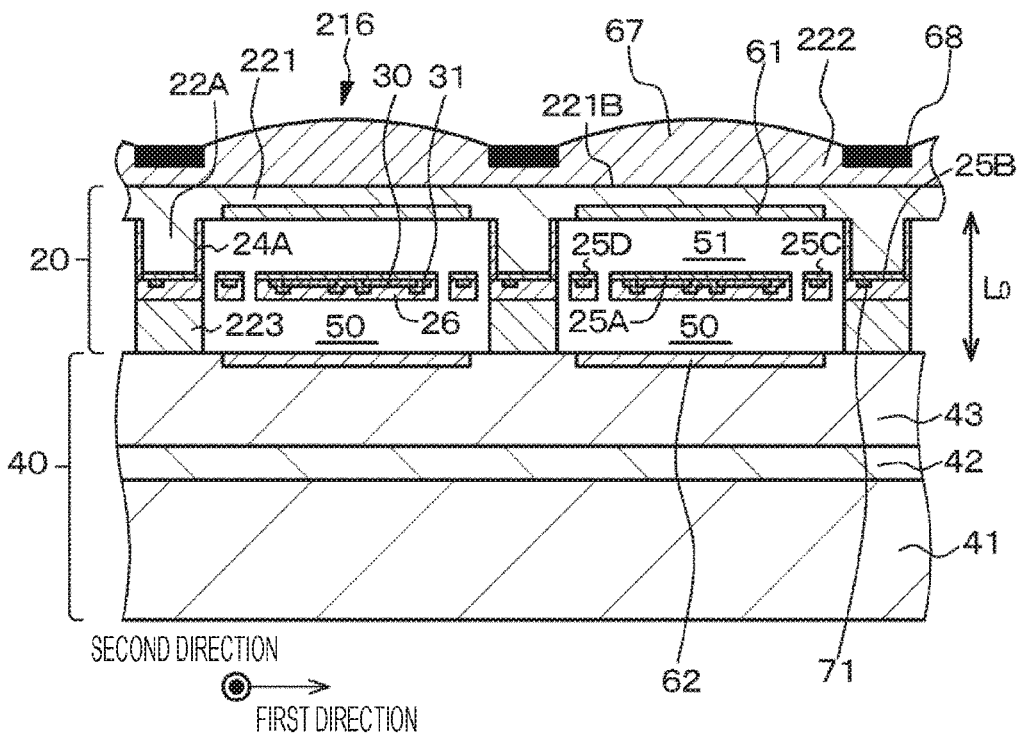

Alternatively, in the modification of Example 12 shown in FIG. 27, for example, condensing elements (lenses) 66 or 67 may be provided on the infrared incident side of the protection board 222 including a silicon semiconductor substrate attached to a surface of the first substrate 221 (the second surface 221B of the first substrate 221) (see FIGS. 37A and 37B). The example shown in FIG. 37A is an example in which the condensing elements 66 are formed with a different material (a resist material, for example) from the protection board 222, and the example shown in FIG. 37B is an example in which etching is performed on the protection board 222, to form the condensing elements 67. These condensing elements can be formed by a method similar to a well-known on-chip microlens forming method, for example. Instead of the protection board 222 including a silicon semiconductor substrate, a protection board including a material that transmits infrared rays, such as $CaF_2$, $BaF_2$, $Al_2O_3$, ZnSe, or the like, may be used. Further, as shown in FIGS. 38A and 38B, light blocking portions 68 may be provided on the infrared incident side of an imaging device, to reduce infrared rays entering adjacent first temperature detection elements. To form the light blocking portions 68, groove portions are formed in the protection board 222, and the groove portions are filled with a metallic material or an alloy material, for example. It is of course possible to use the condensing elements 66 or 67 and the light blocking portions 68 in the other Examples, as appropriate.

Figure 39:
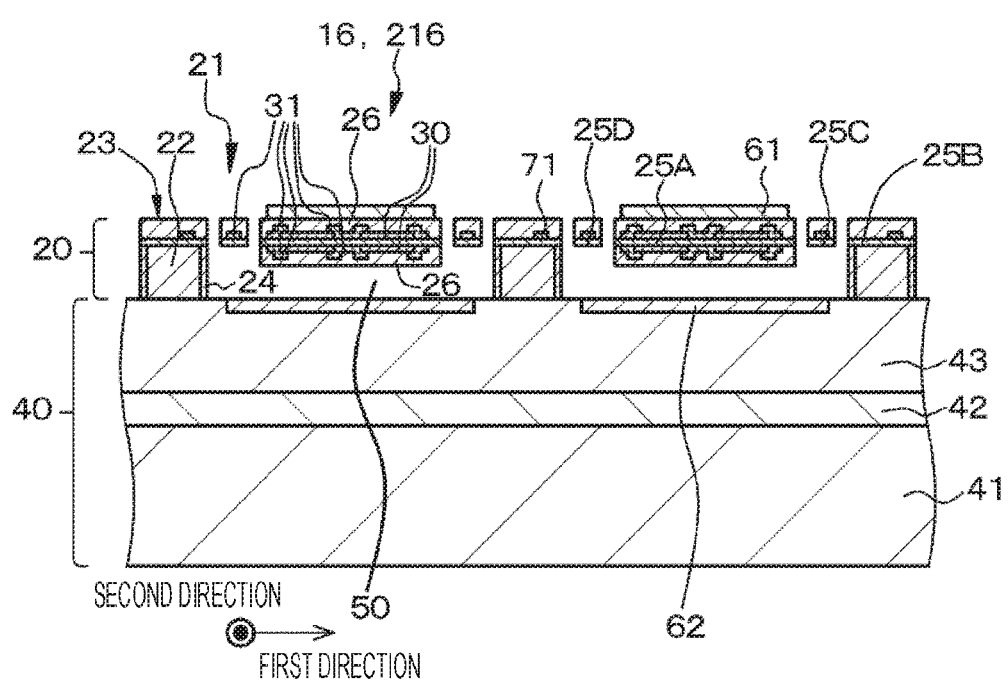
FIG. 39 is a schematic partial end view of an imaging device (an imaging device having a fourth configuration) in which first temperature detection elements forming imaging devices of Examples 11 and 12 are vertically combined.

Further, in an imaging device having the fourth configuration, a first temperature detection element assembly may include two first temperature detection elements (first temperature detection elements described in each Example) arranged vertically along incident infrared rays. FIG. 39 shows an example in which the modification of Example 11 shown in FIG. 24A and Example 12 shown in FIG. 25A are combined. However, it is of course possible to combine other Examples in this manner. Specifically, such an imaging device includes a first temperature detection element assembly that detects temperature on the basis of infrared rays, the first temperature detection element assembly includes two first temperature detection elements arranged vertically along incident infrared rays, and, in the first temperature detection element assembly, the wavelengths of infrared rays to be detected by the respective first temperature detection elements are the same or different, or the amounts of infrared rays to be absorbed by the respective first temperature detection elements are different. Note that the two first temperature detection elements may be connected to the same drive line and the same signal line, or may be connected to different drive lines and different signal lines.

Further, a first temperature detection element may include one of the first temperature detection elements forming an imaging device of the present disclosure, and first temperature detection elements forming an imaging device of the present disclosure may be one-dimensionally arranged, to form an imaging device. That is, in a broad sense, J (J≥1) first temperature detection elements forming an imaging device of the present disclosure may be one-dimensionally arranged to form an imaging device. In other words, an imaging device of the present disclosure may include J (J≥1) first temperature detection elements that are one-dimensionally arranged. Specifically, an imaging device includes:

J (J≥1) first temperature detection elements 16 or 216 arranged in the first direction, and J first drive lines 72A and J first signal lines 71A that are arranged in the first direction, the respective first temperature detection elements 16 or 216 being connected to the respective first drive lines 72A and the first signal lines 71A, the first structural body 20 including the first temperature detection element array region 11 including the first temperature detection elements 16 or 216, and the peripheral region 12 surrounding the first temperature detection element array region 11, the first signal lines 71A being electrically connected to the drive circuits 10 in the peripheral region 12, the first drive lines 72A being electrically connected to the drive circuits 10 in the peripheral region 12.

Figure 40A:
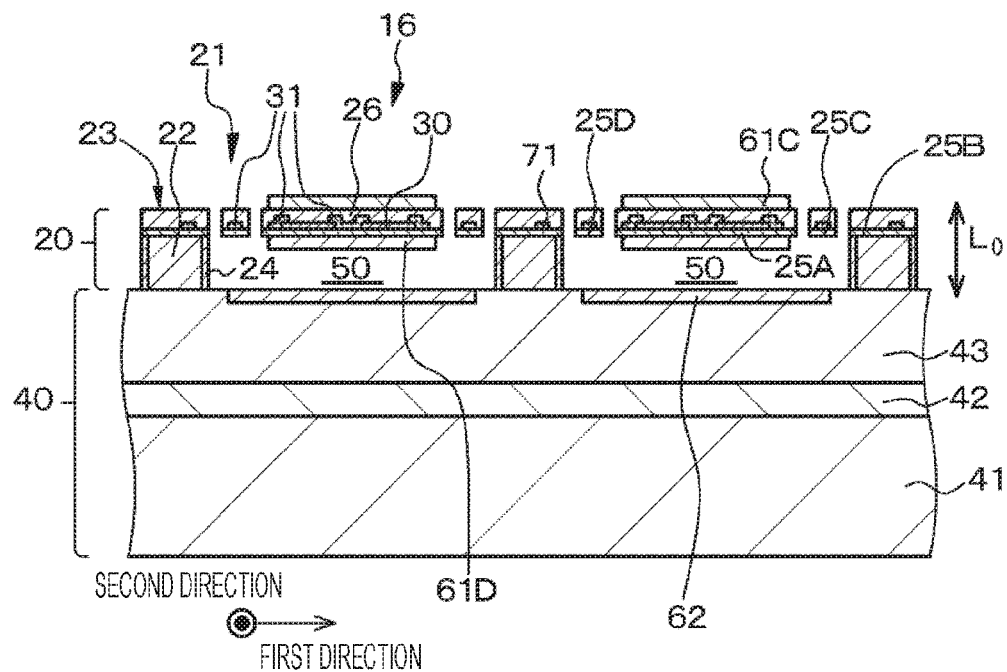
FIGS. 40A and 40B are schematic partial end views of an imaging device of a modification of Example 11 and an imaging device of yet another modification of Example 12, respectively.

As shown in a schematic partial end view in FIG. 40A illustrating an imaging device of a modification of Example 11 shown in FIG. 24A, a first infrared absorption layer 61C may be formed on the infrared incident side of the first temperature detection elements 16, an infrared reflection layer 62 may be formed in the regions of the coating layer 43 located at bottom portions of the voids 50, and a second infrared absorption layer 61D may be formed on the side of the first temperature detection elements 16 facing the voids 50. In the example shown in the drawing, the first infrared absorption layer 61C is formed on the insulating film 26 formed on the first temperature detection elements 16, and the second infrared absorption layer 61D is formed on the surfaces of the first temperature detection elements 16 facing the voids 50 (or more specifically, on the surfaces of the diaphragm portions 25A facing the voids 50). The infrared absorption layers 61C and 61D not only absorb infrared rays, but also partially transmit and partially reflect infrared rays, to reduce transmission and reflection. Thus, the sensitivity of the structure can be further increased. That is, with such a configuration, part of infrared rays that have passed through the first infrared absorption layer 61C is further absorbed by the second infrared absorption layer 61D, so that transmission can be reduced. Also, infrared rays reflected by the first infrared absorption layer 61C and infrared rays reflected by the second infrared absorption layer 61D are of opposite phases and cancel each other, and thus, reflection can be reduced. Further, infrared rays reflected by the second infrared absorption layer 61D and infrared rays reflected by the infrared reflection layer 62 are of opposite phases and cancel each other, and thus, reflection can be reduced. Note that, where the wavelength of infrared rays to be absorbed by the first infrared absorption layer 61C and the second infrared absorption layer 61D is represented by $\lambda_{IR}$, the optical distance between the first infrared absorption layer 61C and the second infrared absorption layer 61D is represented by $L_1$, and the optical distance between the second infrared absorption layer 61D and the infrared reflection layer 62 is represented by $L_2$, the following conditions are preferably satisfied:

$$0.75 \times \lambda_{IR}/4 \leq L_1 \leq 1.25 \times \lambda_{IR}/4$$

$$0.75 \times \lambda_{IR}/4 \leq L_2 \leq 1.25 \times \lambda_{IR}/4$$

The configuration including the first infrared absorption layer 61C and the second infrared absorption layer 61D may of course be applied to other imaging devices of Example 1 and imaging devices of other Examples, as appropriate.

Figure 26B:
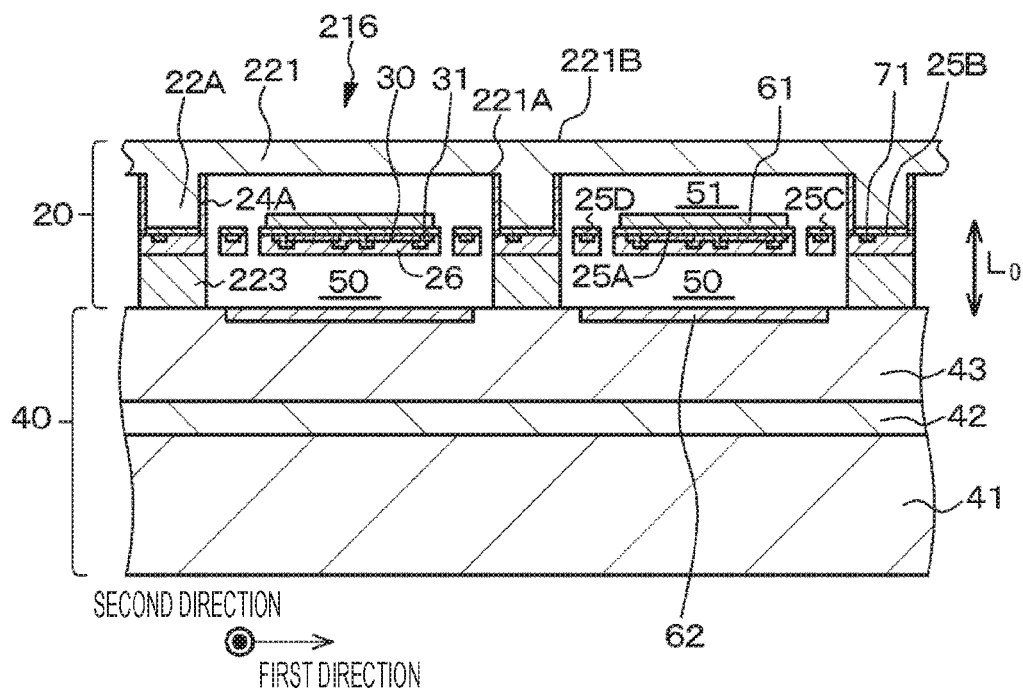
Figure 40B:
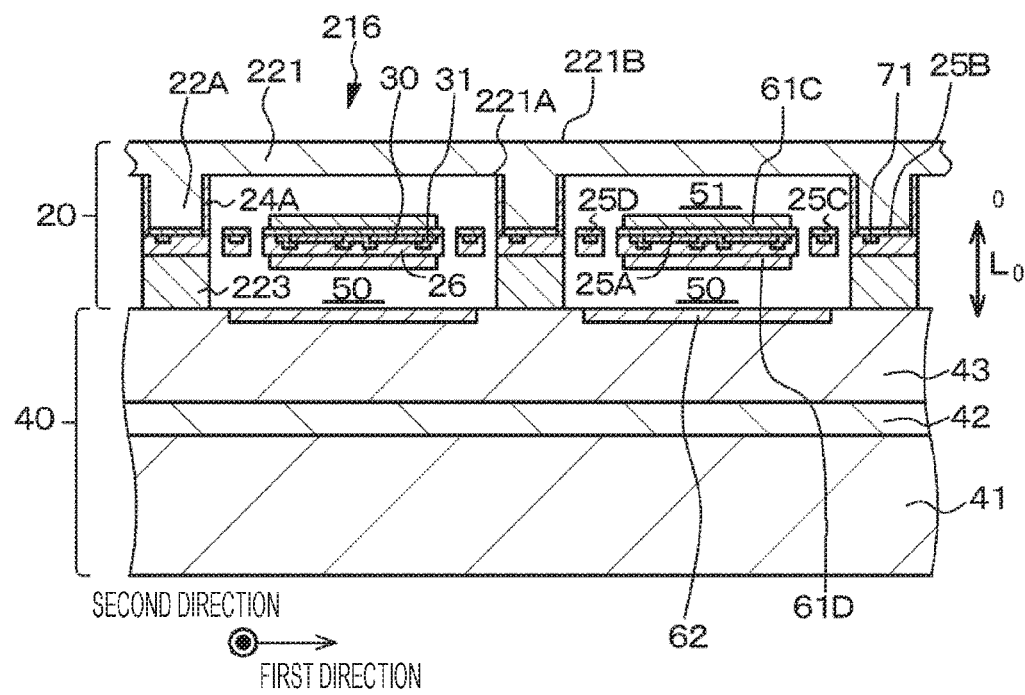

Alternatively, as shown in a schematic partial end view in FIG. 40B illustrating an imaging device of a modification of Example 12 shown in FIG. 26B, a first infrared absorption layer 61C may be formed on the infrared incident side of the first temperature detection elements 216, an infrared reflection layer 62 may be formed in the regions of the coating layer 43 located at bottom portions of the voids 50, and a second infrared absorption layer 61D may be formed on the side of the first temperature detection elements 216 facing the voids 50. The infrared reflection layer 62 is formed on part of the coating layer 43 located at the bottom portions of the voids 50. The first infrared absorption layer 61C is disposed on the first surface side of the first substrate 221. Specifically, the first infrared absorption layer 61 is provided on the infrared incident side of the diaphragm portions 25A. The second infrared absorption layer 61D is formed on the insulating film 26 formed on the first temperature detection elements 216 so as to face the voids 50. The respective infrared absorption layers 61C and 61D not only absorb infrared rays, but also partially transmit and partially reflect infrared rays, to reduce transmission and reflection. Thus, the sensitivity of the structure can be further increased. That is, with such a configuration, part of infrared rays that have passed through the first infrared absorption layer 61C is further absorbed by the second infrared absorption layer 61D, so that transmission can be reduced. Also, infrared rays reflected by the first infrared absorption layer 61C and infrared rays reflected by the second infrared absorption layer 61D are of opposite phases and cancel each other, and thus, reflection can be reduced. Further, infrared rays reflected by the second infrared absorption layer 61D and infrared rays reflected by the infrared reflection layer 62 are of opposite phases and cancel each other, and thus, reflection can be reduced. Furthermore, where the wavelength of infrared rays to be absorbed by the first infrared absorption layer 61C and the second infrared absorption layer 61D is represented by $\lambda_{IR}$, the optical distance between the first infrared absorption layer 61C and the second infrared absorption layer 61D is represented by $L_1$, and the optical distance between the second infrared absorption layer 61D and the infrared reflection layer 62 is represented by $L_2$ in these cases, the following conditions are preferably satisfied:

$$0.75 \times \lambda_{IR}/4 \leq L_1 \leq 1.25 \times \lambda_{IR}/4$$

$$0.75 \times \lambda_{IR}/4 \leq L_2 \leq 1.25 \times \lambda_{IR}/4$$

The configuration including the first infrared absorption layer 61C and the second infrared absorption layer 61D may of course be applied to other imaging devices of Example 12 and imaging devices of other Examples, as appropriate.

The signal processing circuit can perform a fixed pattern noise correction process by measuring noise in advance, a noise reduction process based on a noise model, and a resolution correction process based on a lens imaging model. The signal processing circuit is also capable of combining an image obtained from an infrared camera and an image captured on the basis of normal visible light. The outlines of the respective kinds of signal processing will be described below, but the signal processing is not limited to these kinds.

The fixed pattern noise correction process may be a process in which difference data corresponding to the difference between the fixed pattern noise data obtained in the previous imaging frame and the fixed pattern noise data obtained in the current imaging frame is generated, and the difference data and the fixed pattern noise data obtained in the previous imaging frame are added, to generate new fixed pattern noise data, for example.

Meanwhile, the noise reduction process using an infinite impulse response (IIR) filter may be a noise reduction process that includes:

a first step of calculating the average value of the signal values of reference pixels in the vicinity of the correction target pixel by IIR filtering;

a second step of calculating the variance value of the signal values of the reference pixels in the vicinity of the correction target pixel by IIR filtering;

a third step of inputting the average value and the variance value of the reference pixels, and performing an edge-preserving smoothing process using the average value and the variance value; and a fourth step of updating the IIR filter coefficient to be used in the first step and the second step, in accordance with the signal values of the pixels constituting the image, for example.

Further, the resolution correction process may be a method for obtaining a blur correction filter that is set for each of the image heights, and correcting the pixel value of a pixel at the correction target image height. Here, the correction may be a process in which the filter that is set to an image height adjacent to the correction target image height is applied to the pixel value of the correction target pixel, a coefficient is calculated from the positional relationship between the correction target image height and the adjacent image height, and the pixel value after correction is calculated with the filter-applied pixel value and the coefficient. Alternatively, the correction may be a process in which a coefficient is calculated from the positional relationship between the correction target image height and an adjacent image height, the filter to be applied to the pixel value of the correction target pixel is generated with the filter that is set to the image height adjacent to the correction target image height and the coefficient, and the pixel value after correction is calculated with the generated filter and the pixel value of the correction target pixel. Further, the filter coefficient may be a coefficient obtained by calculating point spread function (PSF) data from a plurality of image points at a first image height, averaging the PSF data, approximating the averaged PSF data with a predetermined function, and calculating the coefficient from the approximated PSF data. A Wiener filter may be used in calculating the filter coefficient.

Note that the present disclosure may also be embodied in the configurations described below.

[A01] (an imaging device; the first embodiment)

An imaging device including:

a first structural body; and a second structural body stacked on the first structural body, in which the first structural body includes a first substrate, and a first temperature detection element that is disposed on the first substrate and detects temperature on the basis of infrared rays, the second structural body includes a second substrate, and a drive circuit disposed on the second substrate, the first temperature detection element being connected to the drive circuit via a first drive line and a first signal line, the second structural body further includes a second temperature detection element for temperature reference, the second temperature detection element being connected to the drive circuit via a second drive line and a second signal line, the drive circuit includes a switch circuit, a first current source, a second current source, a differential amplifier, and an analog-digital conversion circuit, the first signal line to which the first temperature detection element is connected is connected to a first input end of the switch circuit, the second signal line to which the second temperature detection element is connected is connected to a second input end of the switch circuit, a first output end of the switch circuit is connected to a first input end of the differential amplifier, a second output end of the switch circuit is connected to a second input end of the differential amplifier, the first current source is connected to the first input end of the differential amplifier, the second current source is connected to the second input end of the differential amplifier, an output end of the differential amplifier is connected to an input portion of the analog-digital conversion circuit, and, in the switch circuit, the second input end and the second output end of the switch circuit are connected in a case where the first input end and the first output end of the switch circuit are connected, and the second input end and the first output end of the switch circuit are connected in a case where the first input end and the second output end of the switch circuit are connected.

[A02] The imaging device according to [A01], in which first temperature detection elements and second temperature detection elements are arranged in a first direction and a second direction different from the first direction in a two-dimensional matrix, and one drive circuit is provided for one temperature detection element block including one first temperature detection element and one second temperature detection element.

[A03] The imaging device according to [A01], in which first temperature detection elements and second temperature detection elements are arranged in a first direction and a second direction different from the first direction in a two-dimensional matrix, one drive circuit is provided for one temperature detection element block including a plurality of first temperature detection elements and one second temperature detection element, and, in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

[A04] The imaging device according to [A01], in which first temperature detection elements and second temperature detection elements are arranged in a first direction and a second direction different from the first direction in a two-dimensional matrix, and one drive circuit is provided for N (N≥2) first temperature detection elements and N second temperature detection elements occupying one column in the second direction.

[A05] The imaging device according to [A01], in which first temperature detection elements and second temperature detection elements are arranged in a first direction and a second direction different from the first direction in a two-dimensional matrix, the first temperature detection elements and the second temperature detection elements occupying one column in the second direction belong to one temperature detection element block of a plurality of temperature detection element blocks, one drive circuit is provided for the first temperature detection elements and the second temperature detection elements occupying one column in the second direction, each temperature detection element block includes a plurality of first temperature detection elements and one second temperature detection element, and, in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

[A06] The imaging device according to [A01], in which first temperature detection elements and second temperature detection elements are arranged in a first direction and a second direction different from the first direction in a two-dimensional matrix, the first temperature detection elements and the second temperature detection elements occupying one column in the second direction belong to one temperature detection element unit of a plurality of temperature detection element units arranged in the second direction, each temperature detection element unit of the plurality of temperature detection element units is connected to one drive circuit, the first temperature detection elements and the second temperature detection elements occupying each temperature detection element unit belong to one temperature detection element block of a plurality of temperature detection element blocks, each temperature detection element block includes one or a plurality of first temperature detection elements and one second temperature detection element, and, in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where the number of the first temperature detection elements is one, and is connected to the first input end of the switch circuit via a multiplexer circuit provided for the drive circuit in a case where the number of the first temperature detection elements is at least two.

[A07] The imaging device according to [A01], in which
the drive circuit further includes a second switch circuit,
the first current source is connected to a first input end of the second switch circuit, instead of the first input end of the differential amplifier,
the second current source is connected to a second input end of the second switch circuit, instead of the second input end of the differential amplifier,
a first output end of the second switch circuit is connected to the first input end of the differential amplifier,
a second output end of the second switch circuit is connected to the second input end of the differential amplifier, and
the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected.

[A08] The imaging device according to [A07], in which
first temperature detection elements and second temperature detection elements are arranged in a first direction and a second direction different from the first direction in a two-dimensional matrix, and
one drive circuit is provided for N (N≥2) first temperature detection elements and N second temperature detection elements occupying one column in the second direction.

[A09] The imaging device according to [A07], in which
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element block of a plurality of temperature detection element blocks,
one drive circuit is provided for the first temperature detection elements and the second temperature detection elements occupying one column in the second direction,
each temperature detection element block includes a plurality of first temperature detection elements and one second temperature detection element, and,
in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

[A10] The imaging device according to [A07], in which
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element unit of a plurality of temperature detection element units arranged in the second direction,
each temperature detection element unit of the plurality of temperature detection element units is connected to one drive circuit,
the first temperature detection elements and the second temperature detection elements occupying each temperature detection element unit belong to one temperature detection element block of a plurality of temperature detection element blocks,
each temperature detection element block includes one or a plurality of first temperature detection elements and one second temperature detection element, and,
in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where the number of the first temperature detection elements is one, and is connected to the first input end of the switch circuit via a multiplexer circuit provided for the drive circuit in a case where the number of the first temperature detection elements is at least two.

[A11] The imaging device according to [A01], in which
the drive circuit further includes a second switch circuit,
the first current source is connected to a first input end of the second switch circuit, instead of the first input end of the differential amplifier,
the second current source is connected to a second input end of the second switch circuit, instead of the second input end of the differential amplifier,
a first output end of the second switch circuit is connected to the first input end of the first switch circuit,
a second output end of the second switch circuit is connected to the second input end of the first switch circuit, and
the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected.

[A12] The imaging device according to [A11], in which
first temperature detection elements and second temperature detection elements are arranged in a first direction and a second direction different from the first direction in a two-dimensional matrix, and
one drive circuit is provided for N (N≥2) first temperature detection elements and N second temperature detection elements occupying one column in the second direction.

[A13] The imaging device according to [A11], in which
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element block of a plurality of temperature detection element blocks,
one drive circuit is provided for the first temperature detection elements and the second temperature detection elements occupying one column in the second direction, each temperature detection element block includes a plurality of first temperature detection elements and one second temperature detection element, and, in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

[A14] The imaging device according to [A11], in which first temperature detection elements and second temperature detection elements are arranged in a first direction and a second direction different from the first direction in a two-dimensional matrix, the first temperature detection elements and the second temperature detection elements occupying one column in the second direction belong to one temperature detection element unit of a plurality of temperature detection element units arranged in the second direction, each temperature detection element unit of the plurality of temperature detection element units is connected to one drive circuit, the first temperature detection elements and the second temperature detection elements occupying each temperature detection element unit belong to one temperature detection element block of a plurality of temperature detection element blocks, each temperature detection element block includes one or a plurality of first temperature detection elements and one second temperature detection element, and, in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where the number of the first temperature detection elements is one, and is connected to the first input end of the switch circuit via a multiplexer circuit provided for the drive circuit in a case where the number of the first temperature detection elements is at least two.

[A15] The imaging device according to any one of [A01] to [A14], further including a third element for gain measurement, the third element being connected to a third drive line and the drive circuit via the first signal line, in which an output voltage of the third element differs from an output voltage of the second temperature detection element.

[A16] (an imaging device; the second embodiment)

An imaging device including:

a first structural body; and a second structural body stacked on the first structural body, in which the second structural body includes a second substrate, and a drive circuit disposed on the second substrate, the drive circuit includes two current sources, two amplifiers including single-end amplifiers, and two analog-digital conversion circuits, the first structural body includes a first substrate, and a first temperature detection element that is disposed on the first substrate, detects temperature on the basis of infrared rays, and is connected to a first drive line and the drive circuit, the first structural body further includes a second temperature detection element for temperature reference, the second temperature detection element being connected to a second drive line and the drive circuit, a first signal line to which the first temperature detection element and the second temperature detection element are connected is connected to a first current source, a first amplifier, and a first analog-digital conversion circuit, and a second signal line to which the first temperature detection element and the second temperature detection element are connected is connected to a second current source, a second amplifier, and a second analog-digital conversion circuit.

[A17] The imaging device according to any one of [A01] to [A16], further including a nonvolatile memory element, in which, for each first temperature detection element, a correction coefficient for correction during operation is stored in the nonvolatile memory element.

[A18] The imaging device according to any one of [A01] to [A17], in which a void is formed between the first temperature detection element and a coating layer.

[A19] The imaging device according to [A18], in which an infrared absorption layer is formed on an infrared incident side, and an infrared reflection layer is formed in a region of the coating layer, the region being located at a bottom portion of the void.

[A20] The imaging device according to any one of [A01] to [A19], in which the first temperature detection element includes a pn junction diode, a bolometer element, a thermopile element, a metal-film resistance element, a metal-oxide resistance element, a ceramic resistance element, or a thermistor element.

[B01] An imaging device including:

a first structural body; and a second structural body, in which the first structural body includes:

a first substrate;

a first temperature detection element that is disposed on the first substrate, and detects temperature on the basis of infrared rays; and a drive line and a signal line that are connected to the first temperature detection element, the second structural body includes:

a second substrate; and a drive circuit that is disposed on the second substrate, and is covered with a coating layer, the first substrate is joined to the coating layer, a void is formed between the first temperature detection element and the coating layer, and the drive line and the signal line are electrically connected to the drive circuit.

[B02] (an imaging device having the first configuration)

The imaging device according to any one of [A01] to [A20], in which a void is formed between the first temperature detection element and a coating layer.

[B03] The imaging device according to any one of [A01] to [B02], in which a partition wall is formed in a portion of the first substrate, the portion being located between a first temperature detection element and a first temperature detection element, and a bottom portion of the partition wall is joined to a coating layer.

[B04] The imaging device according to [B03], in which an exposed surface of the coating layer exposed to a void includes at least one material layer selected from the group including an insulating material layer, a metal material layer, an alloy material layer, and a carbon material layer, and sidewalls of the partition wall include at least one material layer selected from the group including an insulating material layer, a metal material layer, an alloy material layer, and a carbon material layer.

[B05] The imaging device according to [B03], in which an exposed surface of the coating layer exposed to a void includes at least one material layer selected from the group including an insulating material layer, a metal material layer, an alloy material layer, and a carbon material layer.

[B06] The imaging device according to [B03] or [B05], in which sidewalls of the partition wall include at least one material layer selected from the group including an insulating material layer, a metal material layer, an alloy material layer, and a carbon material layer.

[B07] The imaging device according to any one of [B03] to [B06], in which
an infrared absorption layer is formed on an infrared incident side of the first temperature detection element, and
an infrared reflection layer is formed in a region of the coating layer, the region being located at a bottom portion of the void.

[B08] The imaging device according to [B07], in which the infrared absorption layer is formed above the first temperature detection element.

[B09] The imaging device according to [B07] or [B08], in which the infrared reflection layer is formed on a top surface of the coating layer or inside the coating layer.

[B10] The imaging device according to any one of [B07] to [B09], in which, when a wavelength of infrared rays to be absorbed by the infrared absorption layer is represented by $\lambda_{IR}$, an optical distance $L_0$ between the infrared absorption layer and the infrared reflection layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[B11] The imaging device according to any one of [B03] to [B06], in which
a first infrared absorption layer is formed on an infrared incident side of the first temperature detection element,
an infrared reflection layer is formed in a region of the coating layer, the region being located at a bottom portion of the void, and
a second infrared absorption layer is formed on a side of the first temperature detection element, the side facing the void.

[B12] The imaging device according to [B11], which satisfies $$0.75 \times \lambda_{IR}/4 \leq L_1 \leq 1.25 \times \lambda_{IR}/4, \text{ and}$$

$$0.75 \times \lambda_{IR}/4 \leq L_2 \leq 1.25 \times \lambda_{IR}/4,$$

where $\lambda_{IR}$ represents a wavelength of infrared rays to be absorbed by the first infrared absorption layer and the second infrared absorption layer, $L_1$ represents an optical distance between the first infrared absorption layer and the second infrared absorption layer, and $L_2$ represents an optical distance between the second infrared absorption layer and the infrared reflection layer.

[B13] The imaging device according to any one of [B01] to [B04], in which
a partition wall independent of the first substrate is formed between a portion of the first substrate and the coating layer, the portion being located between a first temperature detection element and a first temperature detection element, and a bottom portion of the partition wall is joined to a coating layer.

[B14] The imaging device according to [B13], in which
an exposed surface of the coating layer exposed to a void includes at least one material layer selected from the group including an insulating material layer, a metal material layer, an alloy material layer, and a carbon material layer, and
the partition wall includes at least one material layer selected from the group including an insulating material layer, a metal material layer, an alloy material layer, and a carbon material layer.

[B15] The imaging device according to [B13], in which an exposed surface of the coating layer exposed to a void includes at least one material layer selected from the group including an insulating material layer, a metal material layer, an alloy material layer, and a carbon material layer.

[B16] The imaging device according to [B13] or [B15], in which the partition wall includes at least one material layer selected from the group including an insulating material layer, a metal material layer, an alloy material layer, and a carbon material layer.

[B17] The imaging device according to any one of [B13] to [B16], in which
an infrared absorption layer is formed on an infrared incident side of the first temperature detection element, and
an infrared reflection layer is formed in a region of the coating layer, the region being located at a bottom portion of the void.

[B18] The imaging device according to [B17], in which the infrared reflection layer is formed on a top surface of the coating layer or inside the coating layer.

[B19] The imaging device according to [B17] or [B18], in which, when a wavelength of infrared rays to be absorbed by the infrared absorption layer is represented by $\lambda_{IR}$, an optical distance $L_0$ between the infrared absorption layer and the infrared reflection layer satisfies $$0.75 \times \lambda_{IR}/2 \leq L_0 \leq 1.25 \times \lambda_{IR}/2$$

or $$0.75 \times \lambda_{IR}/4 \leq L_0 \leq 1.25 \times \lambda_{IR}/4.$$

[B20] The imaging device according to any one of [B13] to [B16], in which
a first infrared absorption layer is formed on an infrared incident side of the first temperature detection element,
an infrared reflection layer is formed in a region of the coating layer, the region being located at a bottom portion of the void, and
a second infrared absorption layer is formed on a side of the first temperature detection element, the side facing the void.

[B21] The imaging device according to [B20], the imaging device satisfying $$0.75 \times \lambda_{IR}/4 \leq L_1 \leq 1.25 \times \lambda_{IR}/4, \text{ and}$$

$$0.75 \times \lambda_{IR}/4 \leq L_2 \leq 1.25 \times \lambda_{IR}/4,$$

where $\lambda_{IR}$ represents a wavelength of infrared rays to be absorbed by the first infrared absorption layer and the second infrared absorption layer, $L_1$ represents an optical distance between the first infrared absorption layer and the second infrared absorption layer, and $L_2$ represents an optical distance between the second infrared absorption layer and the infrared reflection layer.

[B22] The imaging device according to any one of [B13] to [B19], in which a protection board is disposed on an infrared incident surface side of the first substrate.

[B23] The imaging device according to any one of [B01] to [B04], the imaging device including
a first temperature detection element assembly that detects temperature on the basis of infrared rays,
the first temperature detection element assembly includes two first temperature detection elements arranged vertically along incident infrared rays, and,
in the first temperature detection element assembly, wavelengths of infrared rays to be detected by the respective first temperature detection elements are the same or different, or amounts of infrared rays to be absorbed by the respective first temperature detection elements are different.
[B24] The imaging device according to any one of [B01] to [B22], in which the coating layer includes a heat conduction layer.
[B25] The imaging device according to any one of [B01] to [B24], in which
the coating layer includes a temperature control layer, and
the imaging device further includes a temperature detection unit.
[B26] The imaging device according to [B25], in which the temperature control layer functions as a heater.
[B27] The imaging device according to [B26], in which the temperature control layer further serves as a wiring line.
[B28] The imaging device according to any one of [B25] to [B27], in which the drive circuit controls the temperature control layer, on the basis of a result of temperature detection performed by the temperature detection unit.
[B29] The imaging device according to any one of [B25] to [B28], in which
the first structural body includes a first temperature detection element array region including the first temperature detection element, and a peripheral region surrounding the first temperature detection element array region, and
the temperature control layer is formed in the first temperature detection element array region.
[B30] The imaging device according to any one of [B25] to [B28], in which the temperature control layer is formed in a region of the coating layer, an orthogonal projection image of the first temperature detection element array region existing in the region.
[B31] The imaging device according to any one of [B01] to [B28], in which
the drive circuit includes an analog-digital conversion circuit, and
the analog-digital conversion circuit is not disposed in a region of the second substrate, an orthogonal projection image of the first temperature detection element array region existing in the region.
[B32] The imaging device according to any one of [B01] to [B31], including a plurality of the first temperature detection elements, in which a void is shared by 2×k (k being an integer not smaller than 1) first temperature detection elements.
[B33] (an imaging device having the second configuration)
An imaging device including
a first temperature detection element assembly that detects temperature on the basis of infrared rays, in which
the first temperature detection element assembly includes a plurality of first temperature detection elements arranged in parallel, and,
in the first temperature detection element assembly, wavelengths of infrared rays to be detected by the respective first temperature detection elements are different.

[B34] The imaging device according to [B33], in which
each first temperature detection element has an infrared absorption layer on an infrared incident side, and has an infrared reflection layer on the opposite side from the infrared incident side,
in the first temperature detection element assembly, an optical distance $L_0$ between the infrared absorption layer and the infrared reflection layer varies among the respective first temperature detection elements, and
the optical distance $L_0$ in each first temperature detection element satisfies $0.75 \times \lambda_{IR}/2 \leq L_0 \leq 1.25 \times \lambda_{IR}/2$ or $0.75 \times \lambda_{IR}/4 \leq L_0 \leq 1.25 \times \lambda_{IR}/4$, where $\lambda_{IR}$ represents a wavelength of infrared rays to be absorbed by the infrared absorption layer of the first temperature detection element.
[B35] The imaging device according to [B33] or [B34], in which
each first temperature detection element has an infrared absorption layer on an infrared incident side, and an infrared reflection layer on the opposite side from the infrared incident side, and,
in the first temperature detection element assembly, a material forming the infrared absorption layer, or a material, a configuration, and a structure of the infrared reflection layer, or a material, a configuration, and a structure of the infrared absorption layer and a material, a configuration, and a structure of the infrared reflection layer vary among the respective first temperature detection elements.
[B36] (an imaging device having the third configuration)
An imaging device including
a first temperature detection element assembly that detects temperature on the basis of infrared rays, in which
the first temperature detection element assembly includes a plurality of first temperature detection elements arranged in parallel, and,
in the first temperature detection element assembly, amounts of infrared rays to be absorbed by the respective first temperature detection elements are different.
[B37] The imaging device according to [B36], in which
each first temperature detection element has an infrared absorption layer on an infrared incident side, and an infrared reflection layer on the opposite side from the infrared incident side, and,
in the first temperature detection element assembly, a material forming the infrared absorption layer, or a material forming the infrared reflection layer, or a material forming the infrared absorption layer and a material forming the infrared reflection layer vary among the respective first temperature detection elements.
[B38] The imaging device according to [B36] or [B37], in which
each first temperature detection element has an infrared absorption layer on an infrared incident side, and has an infrared reflection layer on the opposite side from the infrared incident side, and,
in the first temperature detection element assembly, the infrared absorption layer, the infrared reflection layer, or the infrared absorption layer and the infrared reflection layer vary in area, thickness, or area and thickness among the respective first temperature detection elements.
[B39] The imaging device according to any one of [B01] to [B38], in which, in the drive circuit, each signal line is connected to an analog front end and an analog-digital conversion circuit.

[B40] The imaging device according to [B39], in which
the analog front end includes a differential integration circuit, and
a switch unit that controls a conductive state between the differential integration circuit and a signal line is provided between the differential integration circuit and the signal line.
[B41] The imaging device according to [B40], in which, to form a non-conductive state between the differential integration circuit and the signal line, the switch unit sets the signal line at a fixed potential.
[B42] (an imaging device having the fourth configuration)
An imaging device including
a first temperature detection element assembly that detects temperature on the basis of infrared rays, in which
the first temperature detection element assembly includes two first temperature detection elements arranged vertically along incident infrared rays, and,
in the first temperature detection element assembly, wavelengths of infrared rays to be detected by the respective first temperature detection elements are the same or different, or amounts of infrared rays to be absorbed by the respective first temperature detection elements are different.
[B43] The imaging device according to any one of [B01] to [B42], in which the first temperature detection element includes a pn junction diode, a bolometer element, a thermopile element, a metal-film resistance element, a metal-oxide resistance element, a ceramic resistance element, or a thermistor element.
[B44] The imaging device according to any one of [B01] to [B43], further including a condensing element.
[B45] The imaging device according to any one of [B01] to [B44], further including a light blocking portion.
[B46] The imaging device according to any one of [B01] to [B45], in which a second temperature detection element including a semiconductor temperature sensor element is disposed on the first substrate, or on the second substrate, or on the first substrate and the second substrate.
[B47] The imaging device according to any one of [B01] to [B46], in which a second temperature detection element for temperature reference is disposed adjacent to the first temperature detection element.
[B48] The imaging device according to [B47], in which the second temperature detection element for temperature reference does not have an infrared absorption layer, or has neither an infrared absorption layer nor an infrared reflection layer.
[C01] (a noise reduction method in an imaging device)
A noise reduction method in an imaging device that includes:
a first temperature detection element that detects temperature on the basis of infrared rays,
a drive line to which the first temperature detection element is connected; and
a signal line to which the first temperature detection element is connected,
the imaging device further including a first drive circuit to which the drive line is connected, a second drive circuit to which the signal line is connected, and a storage device,
the signal line being connected to a differential integration circuit and an analog-digital conversion circuit in the second drive circuit,
the noise reduction method including the steps of:
putting the first temperature detection element into a non-operating state, and resetting the differential integration circuit;
putting the first temperature detection element into a non-operating state, applying constant current to the signal line for the same time $TM_0$ as a time $TM_0$ during which the first temperature detection element is in an operating state, integrating voltage of the signal line at the differential integration circuit, converting the resultant value of integral into a digital value at the analog-digital conversion circuit, and storing the resultant digital value as an offset value into the storage device; and
putting the first temperature detection element into an operating state for the time $TM_0$, integrating voltage of the signal line at the differential integration circuit, converting the resultant value of integral into a digital value at the analog-digital conversion circuit to obtain a digital signal value, and subtracting the offset value from the digital signal value.

REFERENCE SIGNS LIST 10A, 10B, 10C, 10D, 10E Drive circuit
11 First temperature detection element array region
13 Central region
12, 14 Peripheral region
15 Temperature detection element block
15A, 15B Temperature detection element unit
16, 16A, 16B, 16C, 16D First temperature detection element
17, 17A, 17B, 17C, 17D Second temperature detection element
18 Multiplexer circuit
19 Third element
20 First structural body
21, 221 First substrate (first temperature detection element substrate)
221A Second surface of the first substrate
222 Protection board
21B, 221B Second surface of the first substrate
22 Silicon layer
22A Protruding portion extending from the silicon layer
23, 223 Partition wall
24 Sidewalls of the partition wall
24A Sidewalls of the protruding portion
25A Diaphragm portion (aerial portion, aerial thin layer portion)
25B Insulating material layer
25C First stud portion
25D Second stud portion
26 Insulating film
30 pn junction diode
31 Wiring line
40 Second structural body
41 Second substrate
42 Layer on which drive circuits are formed
43 Coating layer (interlayer insulating layer)
50 Void
51 Hollow space
61, 61A, 61B, 61C, 61D Infrared absorption layer
62, 62A, 62B Infrared reflection layer
63 Heat conduction layer
64 Temperature control layer (heater)
65, 66, 67 Condensing element (lens)
68 Light blocking portion
71A, 71B Signal line
72A, 72B, 72C Drive line
73 Output line
74 Connecting hole
75 Contact hole
81 Vertical scanning circuit 82A, 82B, 82C, 82D Current source
83 Differential amplifier
83A, 83B Input end of the differential amplifier
83C Output end of the differential amplifier
84, 84A, 84B, 84C, 84D Analog-digital conversion circuit (ADC)
85 Horizontal scanning circuit
90 SOI substrate
91 First silicon layer
92 $SiO_2$ layer
93 Second silicon layer
94 First sacrificial layer
95 Second sacrificial layer
96 Support substrate
97 Sacrificial layer
101 Switch circuit (first switch circuit)
103 Second switch circuit
101A, 101B, 102A, 102B Input end
101C, 101D, 102C, 102D Output end
104A, 104B, 104C, 104D Amplifier
302 Shutter
303 Imaging device
304 Drive circuit
305 Power supply unit
306 Storage medium
307 Video output unit
308 Various interfaces
400 Single-slope analog-to-digital conversion circuit
401 Ramp voltage generator (reference voltage generation unit)
402 Comparator
401 Counter unit
410, 410A ΔΣ AD conversion circuit
411, $411_1$, $411_2$ Integrator
412 Quantizer (comparator)
413, $413_1$, $413_2$ Delay circuit
414, $414_1$, $414_2$ Digital-analog conversion circuit (DA conversion circuit)
415, $414_1$, $414_2$ Adder
421 Decimation circuit (decimation filter circuit)

The invention claimed is:

1. An imaging device, comprising:
a first structural body; and a second structural body stacked on the first structural body, wherein
the first structural body includes a first substrate, and a first temperature detection element that is disposed on the first substrate and detects temperature on a basis of infrared rays,
the second structural body includes a second substrate, and a drive circuit disposed on the second substrate, the first temperature detection element being connected to the drive circuit via a first drive line and a first signal line,
the second structural body further includes a second temperature detection element for temperature reference, the second temperature detection element being connected to the drive circuit via a second drive line and a second signal line,
the drive circuit includes a switch circuit, a first current source, a second current source, a differential amplifier, and an analog-digital conversion circuit,
the first signal line to which the first temperature detection element is connected is connected to a first input end of the switch circuit,
the second signal line to which the second temperature detection element is connected is connected to a second input end of the switch circuit,
a first output end of the switch circuit is connected to a first input end of the differential amplifier,
a second output end of the switch circuit is connected to a second input end of the differential amplifier,
the first current source is connected to the first input end of the differential amplifier,
the second current source is connected to the second input end of the differential amplifier,
an output end of the differential amplifier is connected to an input portion of the analog-digital conversion circuit,
in the switch circuit, the second input end and the second output end of the switch circuit are connected in a case where the first input end and the first output end of the switch circuit are connected, and the second input end and the first output end of the switch circuit are connected in a case where the first input end and the second output end of the switch circuit are connected.

2. The imaging device according to claim 1, wherein
first temperature detection elements and second temperature detection elements are arranged in a first direction and a second direction different from the first direction in a two-dimensional matrix, and
one drive circuit is provided for one temperature detection element block including one first temperature detection element and one second temperature detection element.

3. The imaging device according to claim 1, wherein
first temperature detection elements and second temperature detection elements are arranged in a first direction and a second direction different from the first direction in a two-dimensional matrix,
one drive circuit is provided for one temperature detection element block including a plurality of first temperature detection elements and one second temperature detection element, and
in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

4. The imaging device according to claim 1, wherein
first temperature detection elements and second temperature detection elements are arranged in a first direction and a second direction different from the first direction in a two-dimensional matrix, and
one drive circuit is provided for N (N≥2) first temperature detection elements and N second temperature detection elements occupying one column in the second direction.

5. The imaging device according to claim 1, wherein
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element block of a plurality of temperature detection element blocks,
one drive circuit is provided for the first temperature detection elements and the second temperature detection elements occupying one column in the second direction, each temperature detection element block includes a plurality of first temperature detection elements and one second temperature detection element, and in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

6. The imaging device according to claim 1, wherein first temperature detection elements and second temperature detection elements are arranged in a first direction and a second direction different from the first direction in a two-dimensional matrix, the first temperature detection elements and the second temperature detection elements occupying one column in the second direction belong to one temperature detection element unit of a plurality of temperature detection element units arranged in the second direction, each temperature detection element unit of the plurality of temperature detection element units is connected to one drive circuit, the first temperature detection elements and the second temperature detection elements occupying each temperature detection element unit belong to one temperature detection element block of a plurality of temperature detection element blocks, each temperature detection element block includes one or a plurality of first temperature detection elements and one second temperature detection element, and in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where a number of the first temperature detection elements is one, and is connected to the first input end of the switch circuit via a multiplexer circuit provided for the drive circuit in a case where the number of the first temperature detection elements is at least two.

7. The imaging device according to claim 1, wherein the drive circuit further includes a second switch circuit, the first current source is connected to a first input end of the second switch circuit, instead of the first input end of the differential amplifier, the second current source is connected to a second input end of the second switch circuit, instead of the second input end of the differential amplifier, a first output end of the second switch circuit is connected to the first input end of the differential amplifier, a second output end of the second switch circuit is connected to the second input end of the differential amplifier, the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected.

8. The imaging device according to claim 7, wherein first temperature detection elements and second temperature detection elements are arranged in a first direction and a second direction different from the first direction in a two-dimensional matrix, and one drive circuit is provided for N (N≥2) first temperature detection elements and N second temperature detection elements occupying one column in the second direction.

9. The imaging device according to claim 7, wherein first temperature detection elements and second temperature detection elements are arranged in a first direction and a second direction different from the first direction in a two-dimensional matrix, the first temperature detection elements and the second temperature detection elements occupying one column in the second direction belong to one temperature detection element block of a plurality of temperature detection element blocks, one drive circuit is provided for the first temperature detection elements and the second temperature detection elements occupying one column in the second direction, each temperature detection element block includes a plurality of first temperature detection elements and one second temperature detection element, and in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

10. The imaging device according to claim 7, wherein first temperature detection elements and second temperature detection elements are arranged in a first direction and a second direction different from the first direction in a two-dimensional matrix, the first temperature detection elements and the second temperature detection elements occupying one column in the second direction belong to one temperature detection element unit of a plurality of temperature detection element units arranged in the second direction, each temperature detection element unit of the plurality of temperature detection element units is connected to one drive circuit, the first temperature detection elements and the second temperature detection elements occupying each temperature detection element unit belong to one temperature detection element block of a plurality of temperature detection element blocks, each temperature detection element block includes one or a plurality of first temperature detection elements and one second temperature detection element, and in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where a number of the first temperature detection elements is one, and is connected to the first input end of the switch circuit via a multiplexer circuit provided for the drive circuit in a case where the number of the first temperature detection elements is at least two.

11. The imaging device according to claim 1, wherein
the drive circuit further includes a second switch circuit,
the first current source is connected to a first input end of the second switch circuit, instead of the first input end of the differential amplifier,
the second current source is connected to a second input end of the second switch circuit, instead of the second input end of the differential amplifier,
a first output end of the second switch circuit is connected to the first input end of the first switch circuit,
a second output end of the second switch circuit is connected to the second input end of the first switch circuit,
the second input end and the second output end of the second switch circuit are connected in a case where the first input end and the first output end of the second switch circuit are connected, and the second input end and the first output end of the second switch circuit are connected in a case where the first input end and the second output end of the second switch circuit are connected.

12. The imaging device according to claim 11, wherein
first temperature detection elements and second temperature detection elements are arranged in a first direction and a second direction different from the first direction in a two-dimensional matrix, and
one drive circuit is provided for N (N≥2) first temperature detection elements and N second temperature detection elements occupying one column in the second direction.

13. The imaging device according to claim 11, wherein
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element block of a plurality of temperature detection element blocks,
one drive circuit is provided for the first temperature detection elements and the second temperature detection elements occupying one column in the second direction,
each temperature detection element block includes a plurality of first temperature detection elements and one second temperature detection element, and
in each temperature detection element block, the plurality of first temperature detection elements is connected to the same first drive line, and the first signal line connected to each first temperature detection element of the plurality of first temperature detection elements is connected to the first input end of the switch circuit via a multiplexer circuit provided for the drive circuit.

14. The imaging device according to claim 11, wherein
first temperature detection elements and second temperature detection elements are arranged in a first direction and a second direction different from the first direction in a two-dimensional matrix,
the first temperature detection elements and the second temperature detection elements occupying one column in the second direction belong to one temperature detection element unit of a plurality of temperature detection element units arranged in the second direction,
each temperature detection element unit of the plurality of temperature detection element units is connected to one drive circuit,
the first temperature detection elements and the second temperature detection elements occupying each temperature detection element unit belong to one temperature detection element block of a plurality of temperature detection element blocks,
each temperature detection element block includes one or a plurality of first temperature detection elements and one second temperature detection element, and
in each temperature detection element block, the one or the plurality of first temperature detection elements is connected to the same first drive line, and the first signal line connected to the one or each first temperature detection element of the plurality of first temperature detection elements is connected to the first input end of the switch circuit in a case where a number of the first temperature detection elements is one, and is connected to the first input end of the switch circuit via a multiplexer circuit provided for the drive circuit in a case where the number of the first temperature detection elements is at least two.

15. The imaging device according to claim 1, further comprising
a third element for gain measurement, the third element being connected to a third drive line and the drive circuit via the first signal line,
wherein an output voltage of the third element differs from an output voltage of the second temperature detection element.

16. An imaging device, comprising:
a first structural body; and a second structural body stacked on the first structural body, wherein
the second structural body includes a second substrate, and a drive circuit disposed on the second substrate,
the drive circuit includes two current sources, two amplifiers including single-end amplifiers, and two analog-digital conversion circuits,
the first structural body includes a first substrate, and a first temperature detection element that is disposed on the first substrate, detects temperature on a basis of infrared rays, and is connected to a first drive line and the drive circuit,
the first structural body further includes a second temperature detection element for temperature reference, the second temperature detection element being connected to a second drive line and the drive circuit,
a first signal line to which the first temperature detection element and the second temperature detection element are connected is connected to a first current source, a first amplifier, and a first analog-digital conversion circuit, and
a second signal line to which the first temperature detection element and the second temperature detection element are connected is connected to a second current source, a second amplifier, and a second analog-digital conversion circuit.

17. The imaging device according to claim 1, further comprising
a nonvolatile memory element, wherein,
for each first temperature detection element, a correction coefficient for correction during operation is stored in the nonvolatile memory element.

* * * * *